(12) United States Patent
Lee et al.

(10) Patent No.: US 11,043,397 B2
(45) Date of Patent: Jun. 22, 2021

(54) METHOD OF FORMING A PATTERN AND METHOD OF MANUFACTURING A SEMICONDUCTOR DEVICE USING THE SAME

(71) Applicant: Samsung Electronics Co., Ltd., Suwon-si (KR)

(72) Inventors: Myeong-Dong Lee, Seoul (KR); Min-Su Choi, Incheon (KR); Jun-Hyeok Ahn, Hwaseong-si (KR); Sung-Hee Han, Hwaseong-si (KR); Ce-Ra Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/509,792

(22) Filed: Jul. 12, 2019

(65) Prior Publication Data
US 2020/0219732 A1 Jul. 9, 2020

(30) Foreign Application Priority Data

Jan. 7, 2019 (KR) .......................... 10-2019-0001697

(51) Int. Cl.
*H01L 21/3213* (2006.01)
*H01L 27/108* (2006.01)
*H01L 21/033* (2006.01)

(52) U.S. Cl.
CPC .... *H01L 21/32139* (2013.01); *H01L 21/0332* (2013.01); *H01L 21/0334* (2013.01);
(Continued)

(58) Field of Classification Search
CPC ......... H01L 21/32139; H01L 27/10855; H01L 21/0274; H01L 21/76816; H01L 21/76877;
(Continued)

(56) References Cited

U.S. PATENT DOCUMENTS 7,470,586 B2 12/2008 Bae
8,637,363 B1 * 1/2014 Jung ................... H01L 27/0207
438/238

(Continued)

FOREIGN PATENT DOCUMENTS

KR 10-2004-0036857 A 5/2004
KR 10-2012-0004605 A 1/2012
KR 10-20120-0004605 A 1/2012

*Primary Examiner* — Ahmed N Sefer
(74) *Attorney, Agent, or Firm* — Muir Patent Law, PLLC

(57) ABSTRACT

First and second mask layers are formed on a target layer. The second mask layer is patterned to form second mask patterns each of which having a rhomboid shape with a first diagonal length and a second diagonal length. A trimming process is performed on the second mask patterns to form second masks by etch. First portions of first opposite vertices of each second mask pattern are etched more than second portions of second opposite vertices of each second mask pattern. A first diagonal length between the first opposite vertices is greater than a second diagonal length between the second opposite vertices. The first mask layer is patterned to form first masks by etching the first mask layer using the second masks as an etching mask. The target layer is patterned to form target patterns by etching the target layer using the first masks as an etching mask.

20 Claims, 49 Drawing Sheets

(52) U.S. Cl.
CPC .... *H01L 21/0337* (2013.01); *H01L 27/10855* (2013.01); *H01L 27/10885* (2013.01)

(58) Field of Classification Search
CPC .............. H01L 23/5226; H01L 23/528; H01L 21/0337
See application file for complete search history.

(56) References Cited

U.S. PATENT DOCUMENTS

| | | | |
|---|---|---|---|
| 8,835,252 B2 | 9/2014 | Moon et al. | |
| 9,230,853 B2 | 1/2016 | Yu et al. | |
| 9,276,074 B2 | 3/2016 | Choi et al. | |
| 9,589,964 B1 * | 3/2017 | Lim | H01L 27/10852 |
| 9,852,870 B2 | 12/2017 | Ozgur et al. | |
| 9,916,979 B2 | 3/2018 | Yoon et al. | |
| 2008/0153299 A1 * | 6/2008 | Kim | H01L 21/0338 |
| | | | 438/703 |
| 2016/0027787 A1 * | 1/2016 | Park | H01L 21/0337 |
| | | | 438/381 |
| 2017/0186613 A1 * | 6/2017 | Kim | H01L 21/0338 |
| 2018/0040560 A1 | 2/2018 | Kim et al. | |
| 2018/0175040 A1 | 6/2018 | Kim et al. | |
| 2019/0355727 A1 * | 11/2019 | Lee | H01L 21/28026 |

* cited by examiner

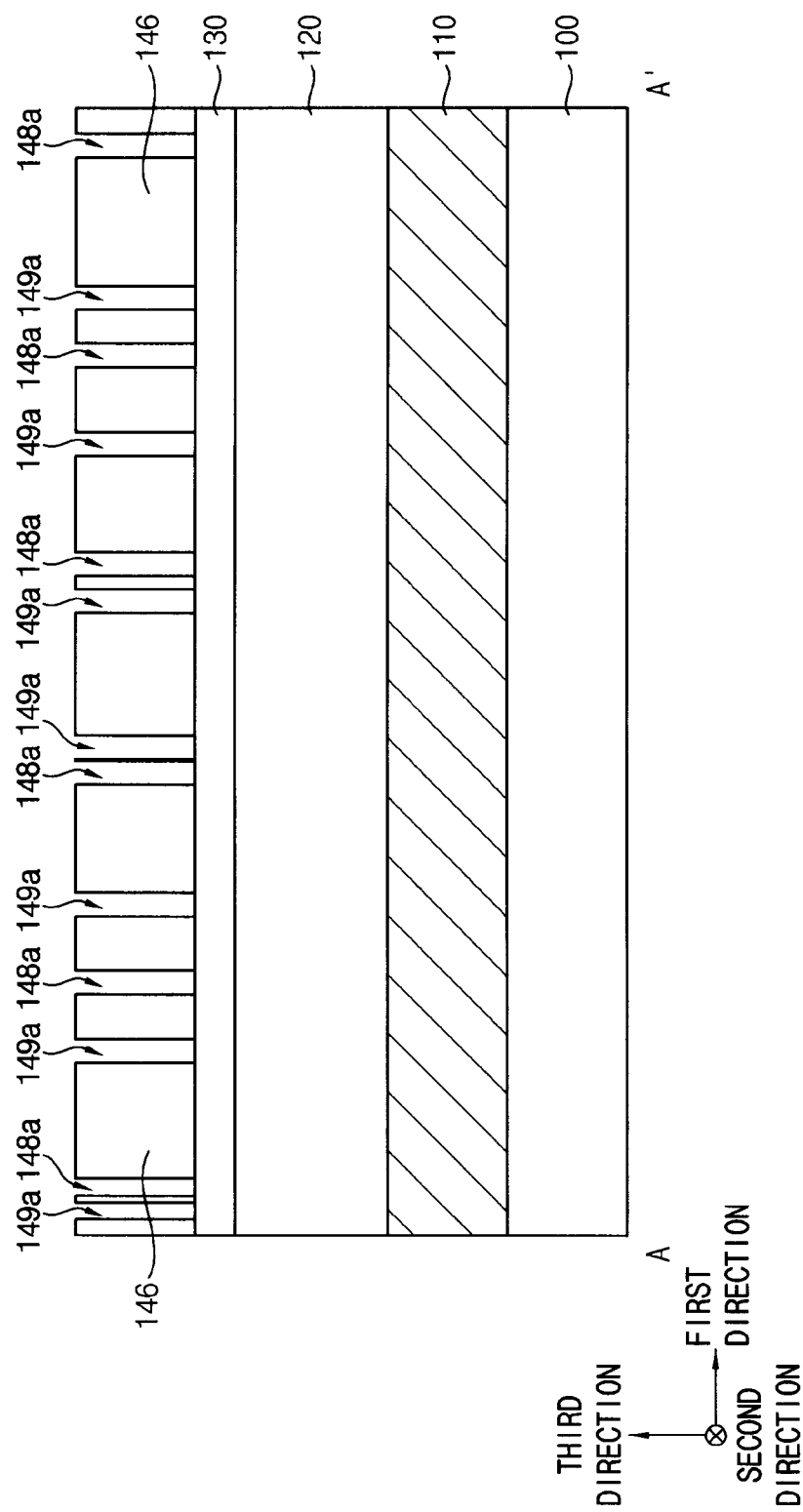

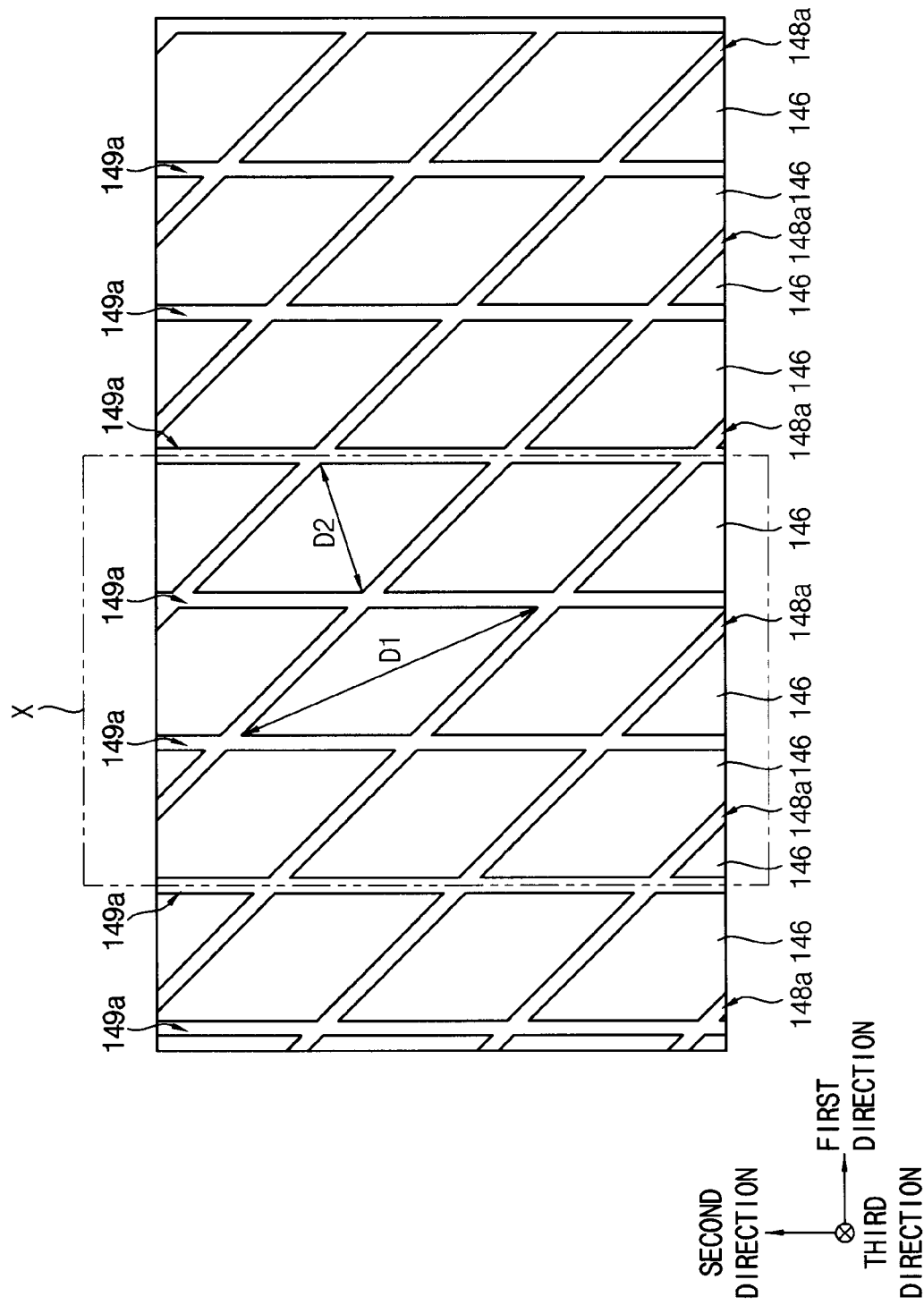

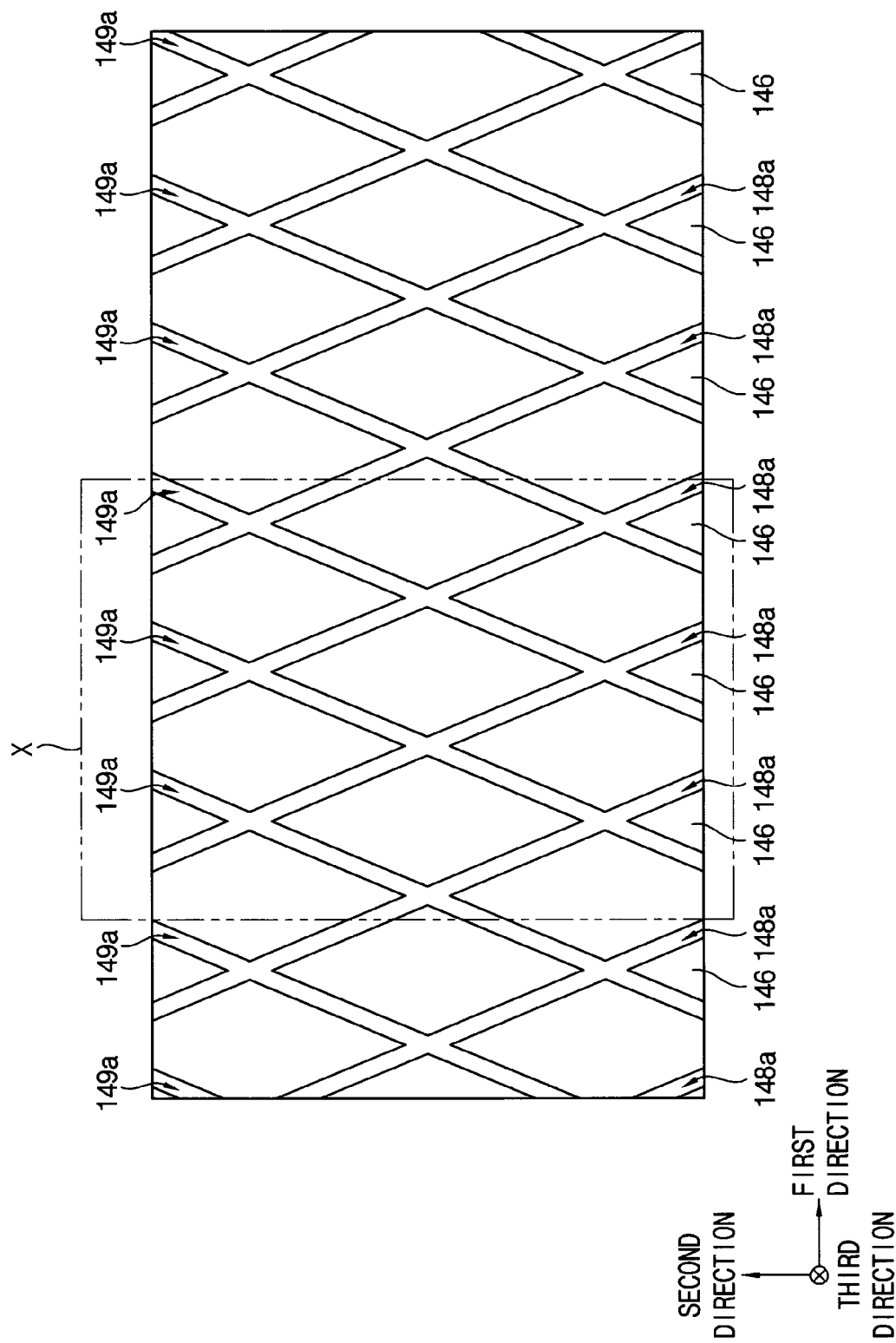

FIG. 32
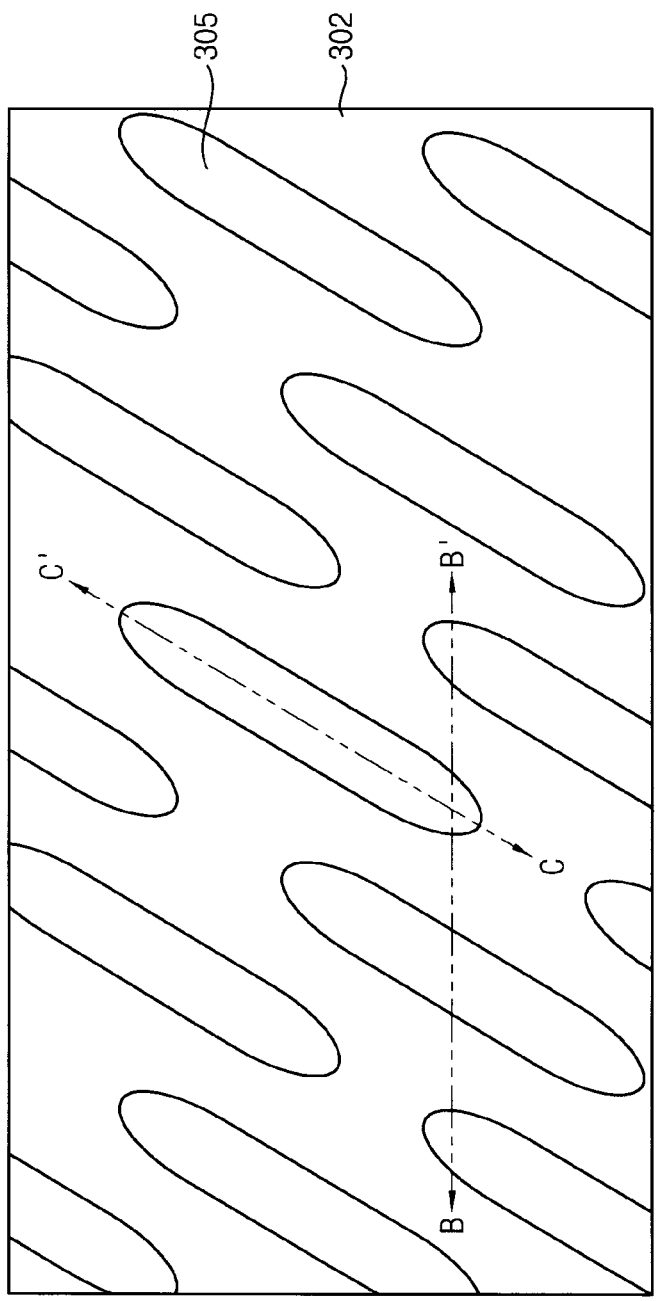
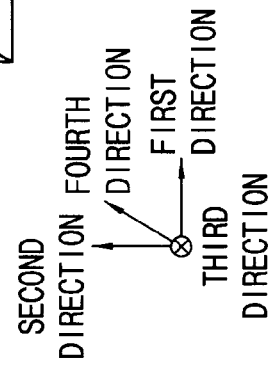

METHOD OF FORMING A PATTERN AND METHOD OF MANUFACTURING A SEMICONDUCTOR DEVICE USING THE SAME

CROSS-REFERENCE TO RELATED APPLICATION

This application claims priority under 35 USC § 119 to Korean Patent Application No. 10-2019-0001697 filed on Jan. 7, 2019 in the Korean Intellectual Property Office (KIPO), the contents of which are herein incorporated by reference in their entirety.

BACKGROUND

1. Field

Example embodiments relate to a method of forming a pattern and a method of manufacturing a semiconductor device using the same.

2. Description of the Related Art

In manufacturing semiconductor devices, bit lines and conductive layers with landing pads between the bit lines may be formed on a substrate. However, as the degree of integration of the semiconductor device increases, the landing pads are formed with less of a process margin, and the reliability of the semiconductor device may be reduced.

SUMMARY

According to an exemplary embodiment of the present inventive concept, a method of forming a pattern is provided. A first mask layer is formed on a target layer. A second mask layer is formed on the first mask layer. The second mask layer is patterned to form second mask patterns each of which having a rhomboid shape with a first diagonal length and a second diagonal length smaller than the first diagonal length. A trimming process is performed on the second mask patterns to form second masks. First portions corresponding to first opposite vertices of each of the second mask patterns are etched more than second portions corresponding to second opposite vertices of each of the second mask patterns. A first diagonal length between the first opposite vertices is greater than a second diagonal length between the second opposite vertices. The first mask layer is patterned to form first masks by performing an etching process on the first mask layer using the second masks as an etching mask. The target layer is patterned to form target patterns by performing an etching process on the target layer using the first masks as an etching mask.

According to an exemplary embodiment of the present inventive concept, a method of forming a pattern is provided. A second mask layer is patterned on a first mask layer to form second mask patterns each of which having a rhomboid shape in a plan view. A trimming process is performed on the second mask patterns to form second masks. First portions corresponding to first opposite vertices of each of the second mask patterns are etched more than second portions corresponding to second opposite vertices of each of the second mask patterns. A first diagonal length between the first opposite vertices is greater than a second diagonal length between the second opposite vertices. An etching process is performed on the first mask layer using the second masks as an etching mask to form first masks.

According to an exemplary embodiment of the present inventive concept, a method of manufacturing a semiconductor device is provided. An active region is formed on a substrate. A gate structure is formed to extend through the active region. A conductive layer is formed on the active region. First masks are formed on the conductive layer. Landing pads are formed by etching an upper portion of the conductive layer using the first masks as an etching mask. Capacitors are formed on the landing pads respectively. The forming of the first masks includes forming a first mask layer on the conductive layer, forming a second mask layer on the first mask layer, patterning the second mask layer to form second mask patterns each of which having a rhomboid shape in a plan view, performing a trimming process on the second mask patterns to form second masks, and performing an etching process using the second masks as an etching mask on the first mask layer to form the first masks. In the trimming process, first portions corresponding to first opposite vertices of each second mask pattern are etched more than second portions corresponding to second opposite vertices of each second mask pattern. A first diagonal length between the first opposite vertices is greater than a second diagonal length between the second opposite vertices.

In a method of manufacturing a semiconductor device, by performing a trimming process on a mask for forming landing pads, a major axis and a minor axis of the mask is adjusted. Accordingly, the deterioration of the reliability of the semiconductor device due to the electrical short between the landing pads may be prevented.

BRIEF DESCRIPTION OF THE DRAWINGS

FIGS. 1 to 23, 24A, 24B, and 25 to 31 are plan views, cross-sectional views and perspective views illustrating a method of forming a pattern in accordance with example embodiments.

FIGS. 32 to 48 are plan views and cross-sectional views illustrating a method of manufacturing a semiconductor device in accordance with example embodiments.

DESCRIPTION OF EMBODIMENTS

A method of forming a pattern and a method of manufacturing a semiconductor device using the same in accordance with example embodiments will be described more fully hereinafter with reference to the accompanying drawings.

Hereinafter, two directions intersecting with each other among horizontal directions substantially parallel to an upper surface of a substrate are defined as first and second directions, respectively, and a vertical direction substantially perpendicular to the upper surface of the substrate is defined as a third direction. In example embodiments, the first and second directions may be orthogonal to each other.

FIGS. 1 to 31 are plan views, cross-sectional views and perspective views illustrating a method of forming a pattern in accordance with example embodiments. Specifically, FIGS. 1, 3, 7, 13, 15, 17, 19, 24A, 24B, 26, 28 and 30 are the plan views, FIGS. 2, 4-6, 8-12, 16, 18 and 20-23 are the cross-sectional views, and FIGS. 14, 25, 27, 29 and 31 are the perspective views. Each of the cross-sectional views is taken along lines A-A' of corresponding plan views, respectively.

Figure 1:
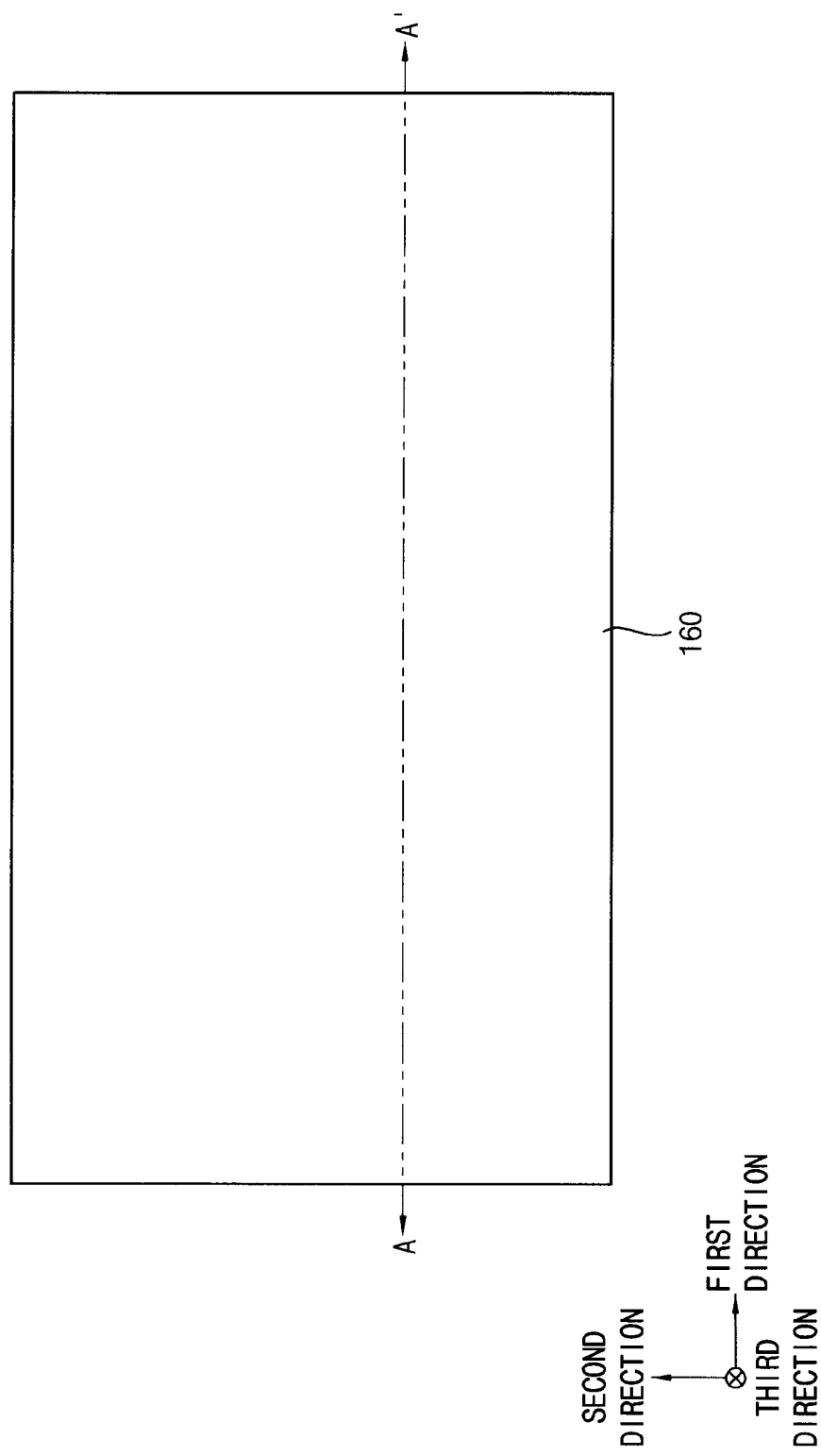
Figure 2:
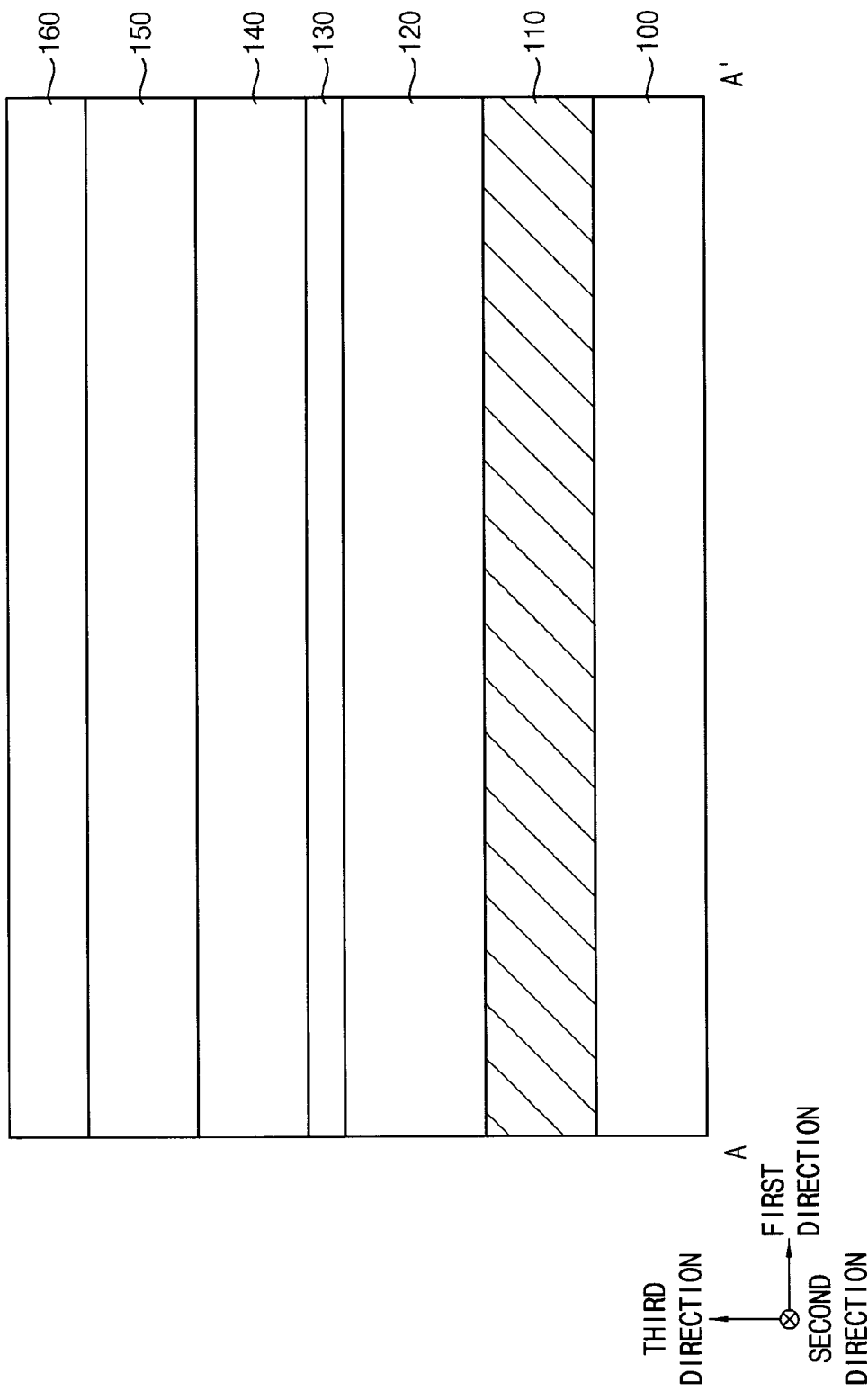

Referring to FIGS. 1 and 2, a target layer 110, a first mask layer 120, an etch stop layer 130, a second mask layer 140, a first sacrificial layer 150 and a second sacrificial layer 160 may be sequentially formed on a substrate 100.

The target layer 110 may be a film to be finally patterned. In example embodiments, the target layer 110 may include metal, e.g., tungsten (W), titanium (Ti), tantalum (Ta), etc., or polysilicon doped with impurities. The target layer 110 may be formed by, e.g., a chemical vapor deposition (CVD) process, a physical vapor deposition (PVD) process, an atomic layer deposition (ALD) process, a spin coating process, etc.

The first mask layer 120 may include, e.g., an amorphous carbon layer (ACL), the etch stop layer 130 may include nitride, e.g., silicon nitride, the second mask layer 140 may include an oxide, e.g., silicon oxide, the first sacrificial layer 150 may include, e.g., a silicon-on-hardmask (SOH), and the second sacrificial layer 160 may include an oxynitride, e.g., silicon oxynitride.

Figure 3:
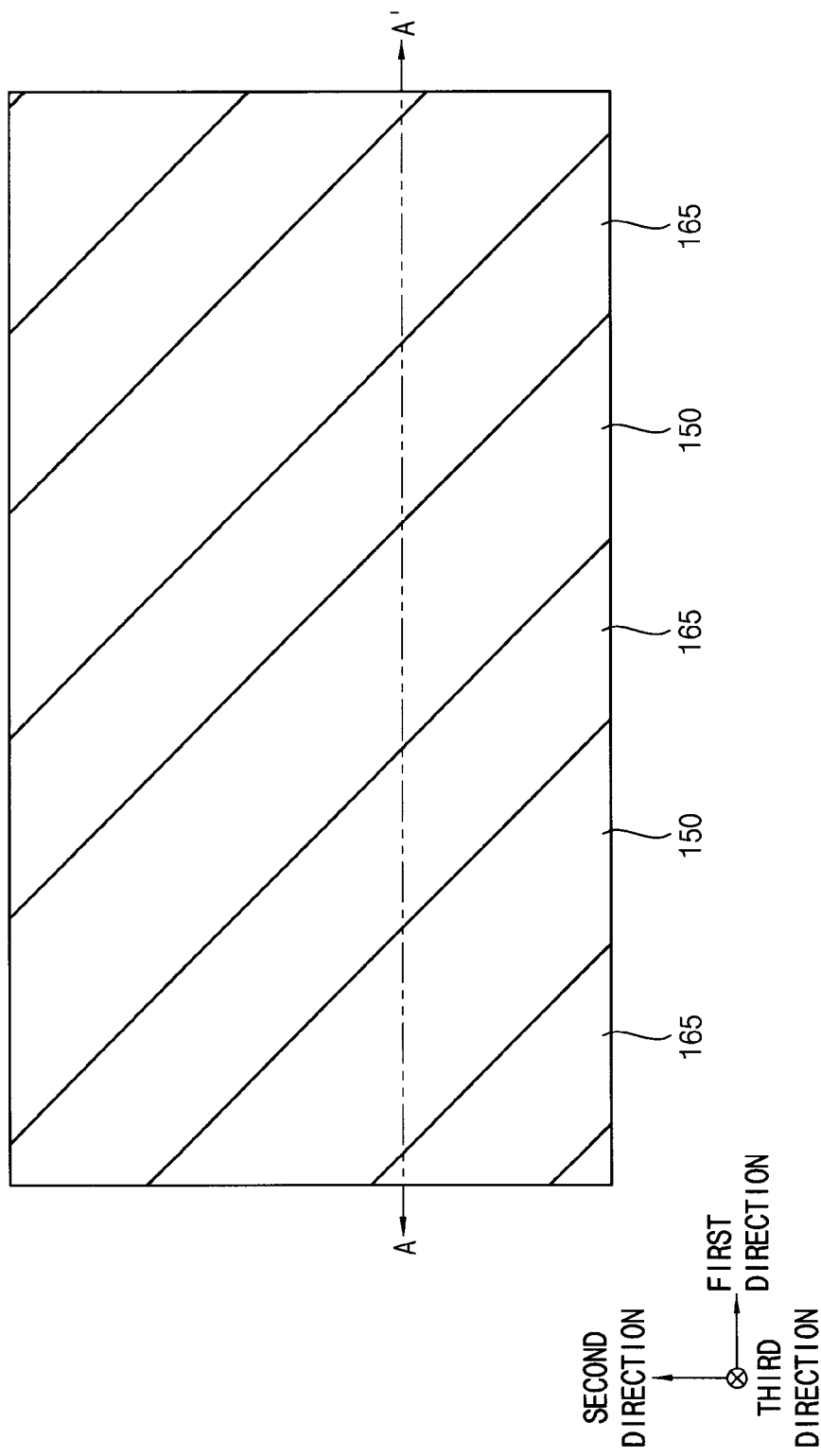
Figure 4:
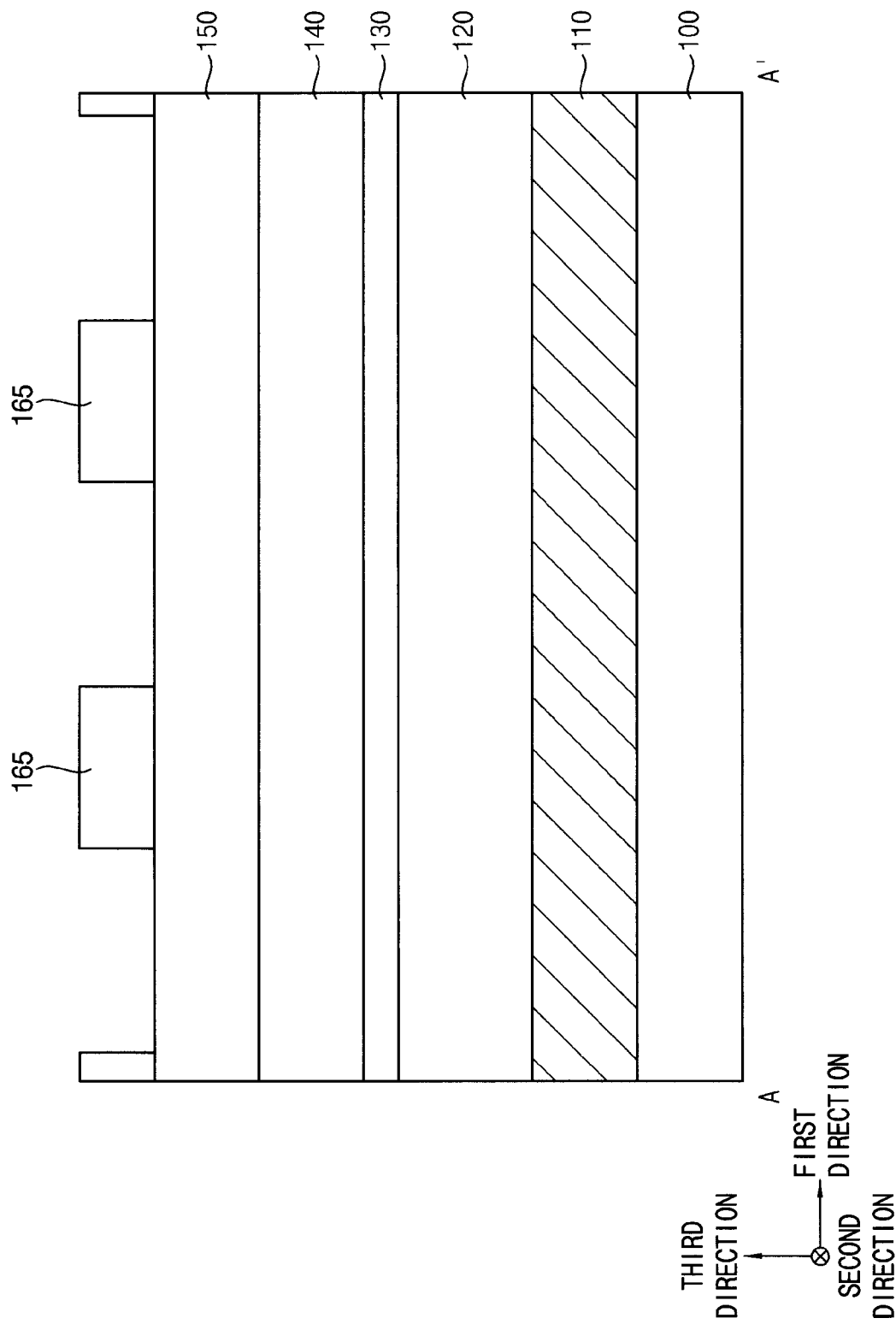

Referring to FIGS. 3 and 4, an etching process using a first photoresist pattern (not shown) as an etching mask may be performed on the second sacrificial layer 160 to form a plurality of second sacrificial patterns 165. Each of the second sacrificial patterns 165 may have a line shape.

A portion of an upper surface of the first sacrificial layer 150 may be exposed between neighboring ones of the second sacrificial patterns 165, and the first photoresist pattern may be removed by, e.g., a stripping process after forming the second sacrificial pattern 165.

In example embodiments, the second sacrificial patterns 165 may be formed to be spaced apart from each other along each of the first and second directions, and each of the second sacrificial patterns 165 may extend in an oblique direction forming an acute angle or an obtuse angle with each of the first and second directions, however, the inventive concept is not limited thereto.

Figure 5:
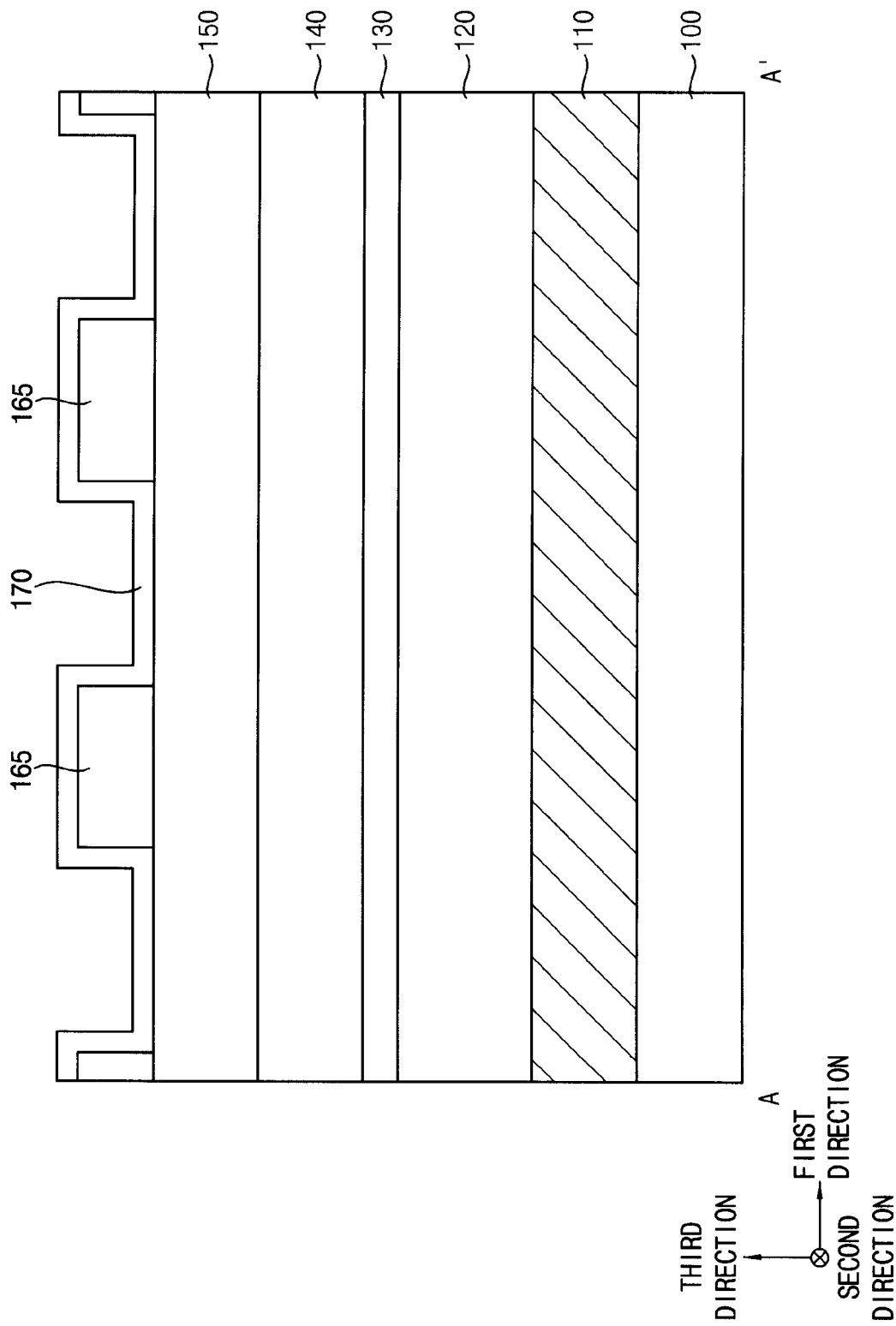

Referring to FIG. 5, a first spacer mask layer 170 may be formed to cover the exposed upper surface of the first sacrificial layer 150 and an upper surface and a sidewall of each of the second sacrificial patterns 165.

The first spacer mask layer 170 may be conformally formed using a material and/or under process conditions having a high step coverage. In one embodiment, the first spacer mask layer 170 may be formed by an ALD process, and may include an oxide, e.g., silicon oxide.

Figure 6:
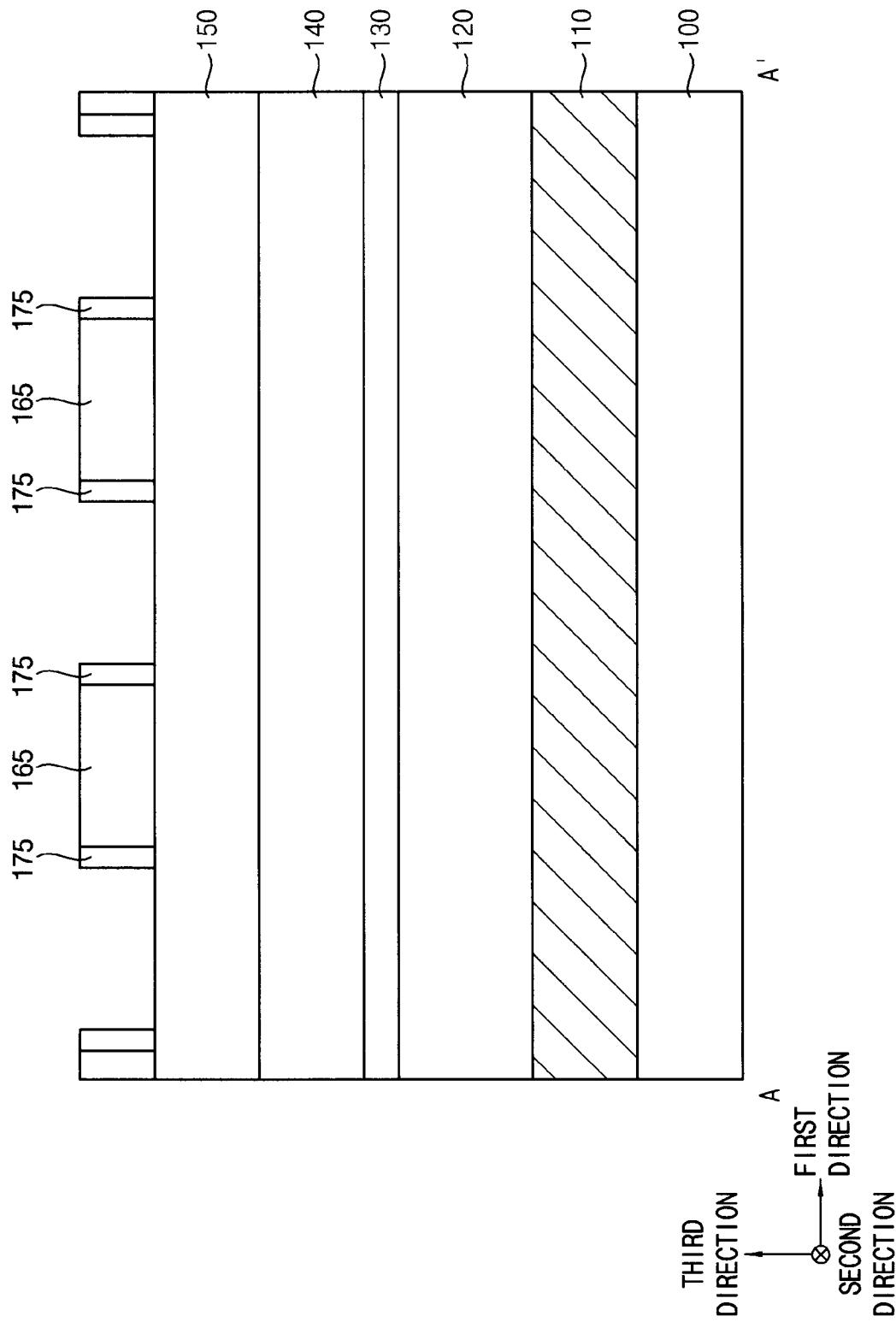

Referring to FIG. 6, the first spacer mask layer 170 may be anisotropically etched to form a plurality of first spacer masks 175. Each of the first spacer masks 175 may cover a sidewall of a corresponding one of the second sacrificial patterns 165.

Figure 7:
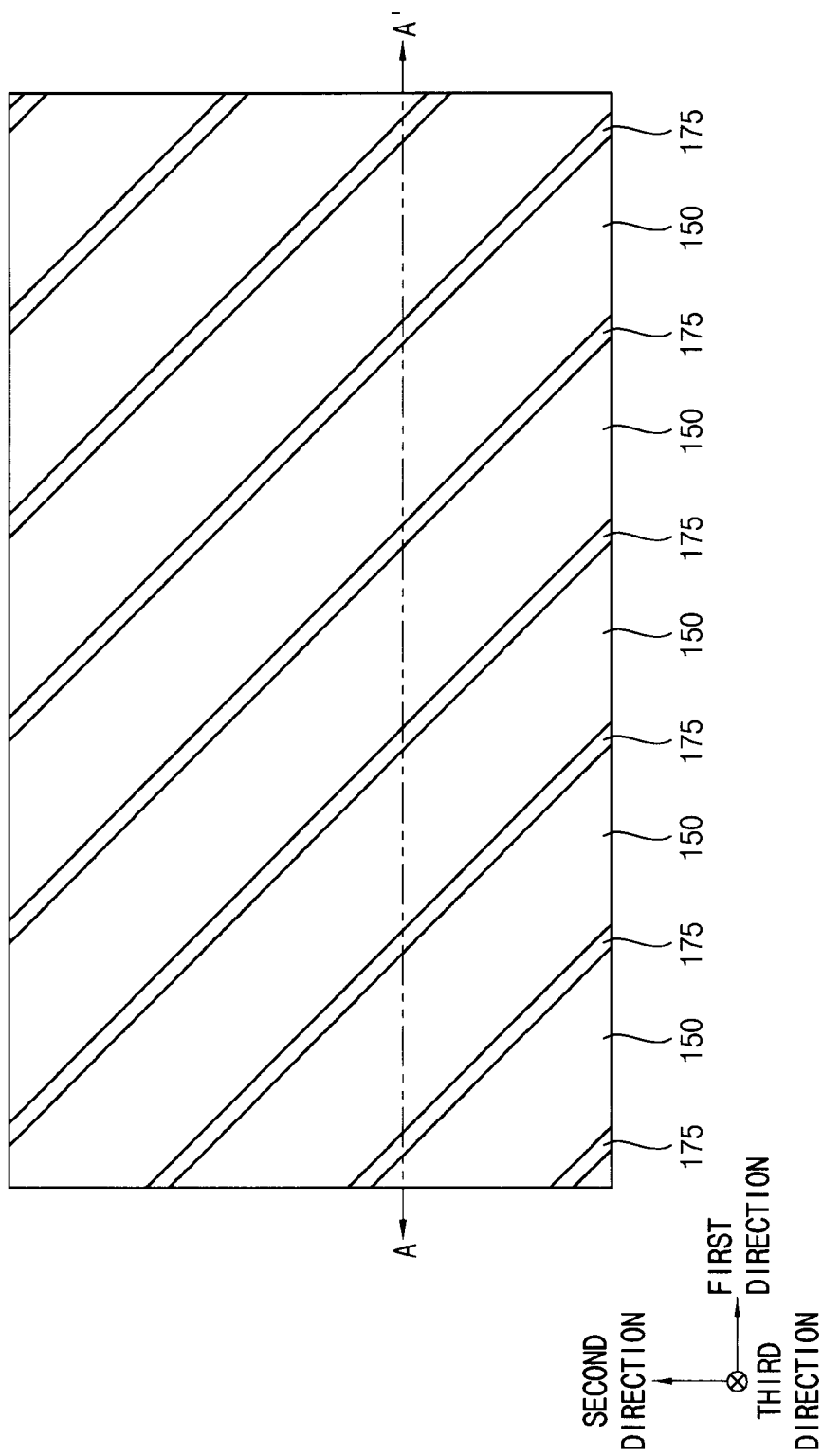
Figure 8:
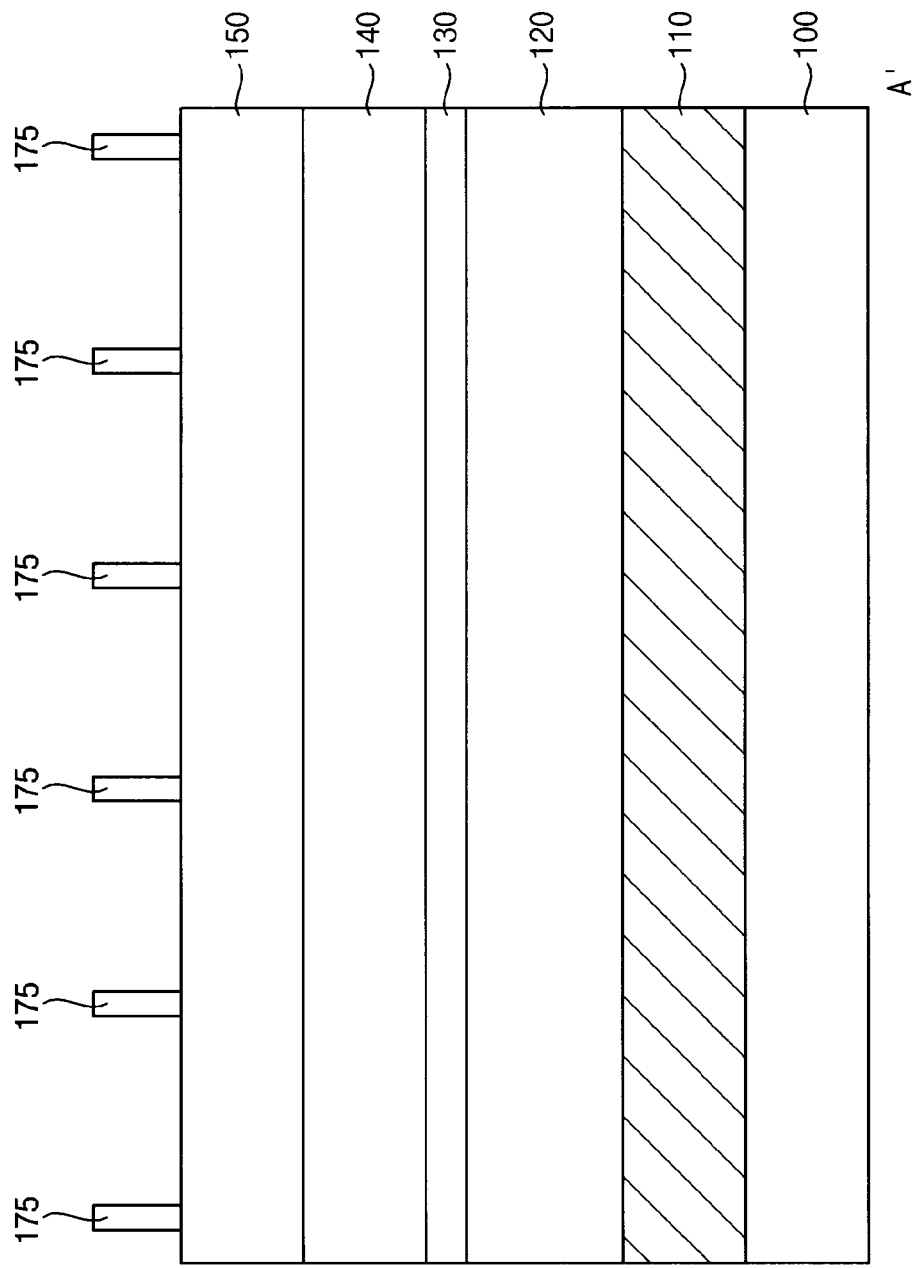

Referring to FIGS. 7 and 8, the second sacrificial patterns 165 may be removed. In example embodiments, the second sacrificial patterns 165 may be removed by an ashing process and/or a stripping process and the first spacer masks 175 may remain on the first sacrificial layer 150.

Figure 9:
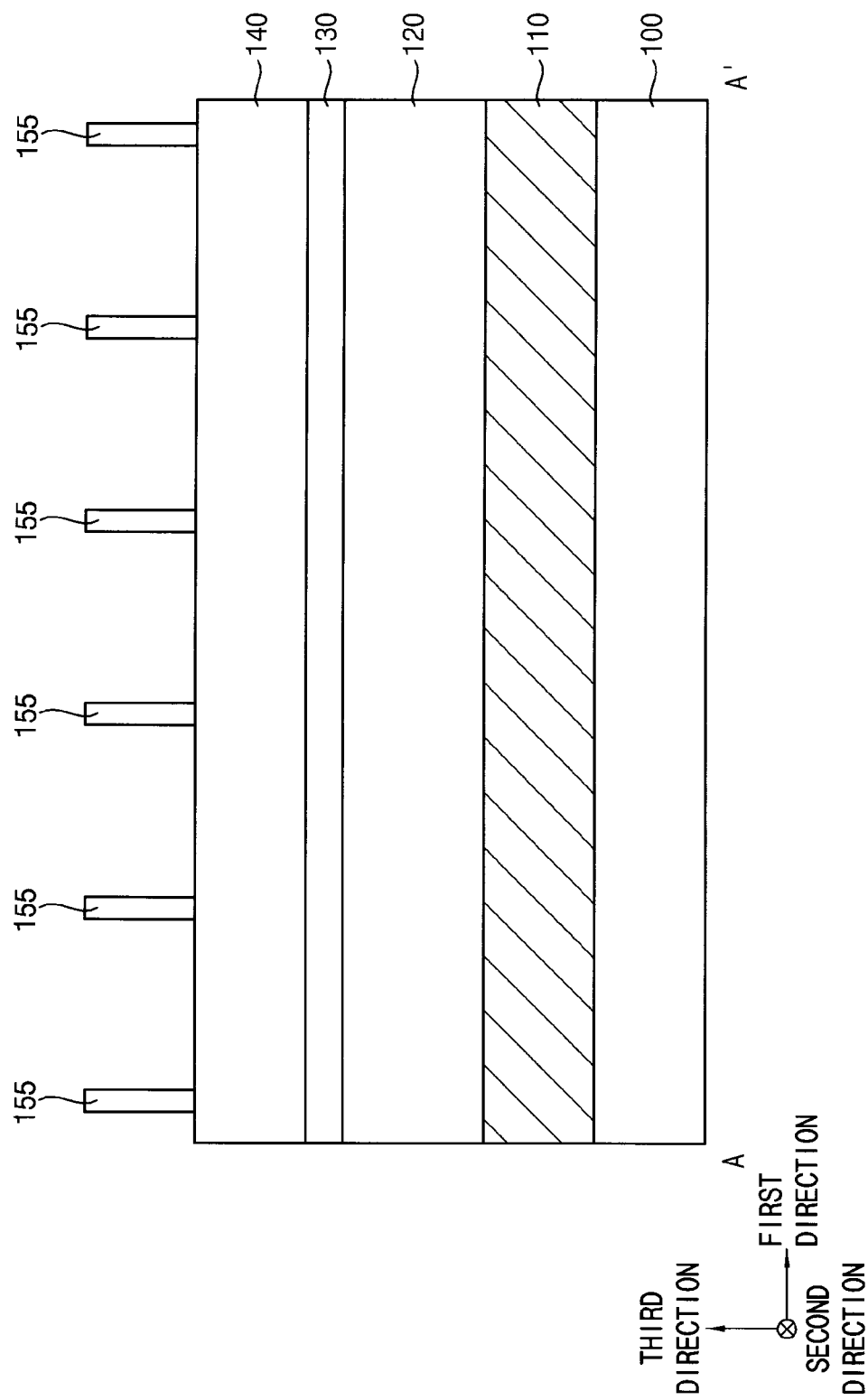

Referring to FIG. 9, the first sacrificial layer 150 may be etched by an etching process using the first spacer masks 175 as an etching mask to form a plurality of first spacers 155. Each of the first spacers 155 may be formed under a corresponding one of the first spacer masks 175.

Accordingly, the first spacers 155 may be formed on the second mask layer 140, and a portion of an upper surface of the second mask layer 140 may be exposed between neighboring ones of the first spacers 155. The first spacer mask 175 may be removed.

Figure 10:
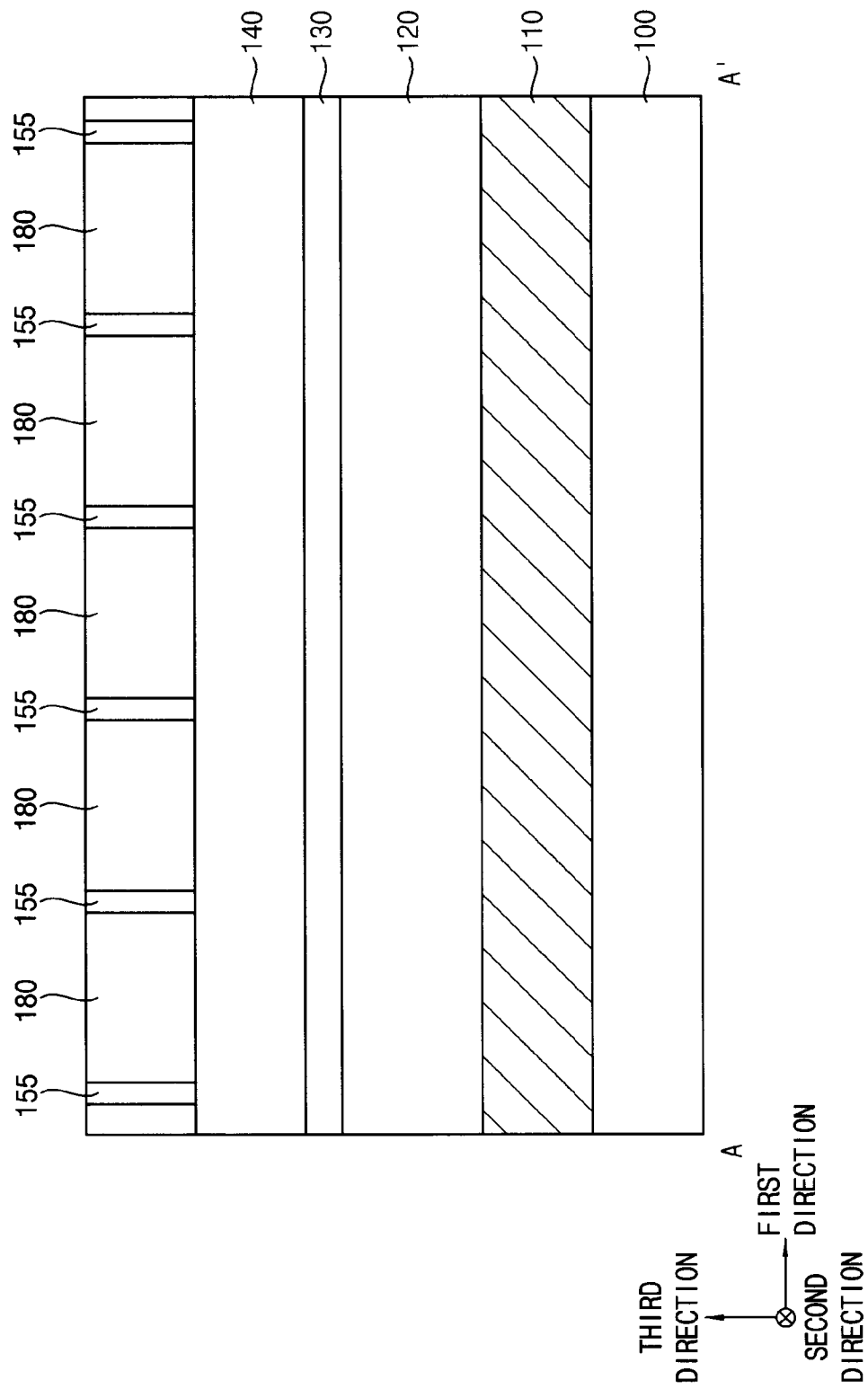

Referring to FIG. 10, a plurality of third sacrificial patterns 180 may be formed to fill spaces between neighboring ones of the first spacers 155. In an example embodiment, a third sacrificial layer may be formed to cover the exposed upper surface of the second mask layer 140 and an upper surface and a sidewall of each of the first spacers 155, and then the third sacrificial layer may be planarized until the upper surface of each of the first spacers 155 is exposed. The planarized third sacrificial layer may be separated into the plurality of third sacrificial patterns 180 that remain in the spaces. The planarization process may be performed by, e.g., a chemical mechanical polishing (CMP) process.

Figure 11:
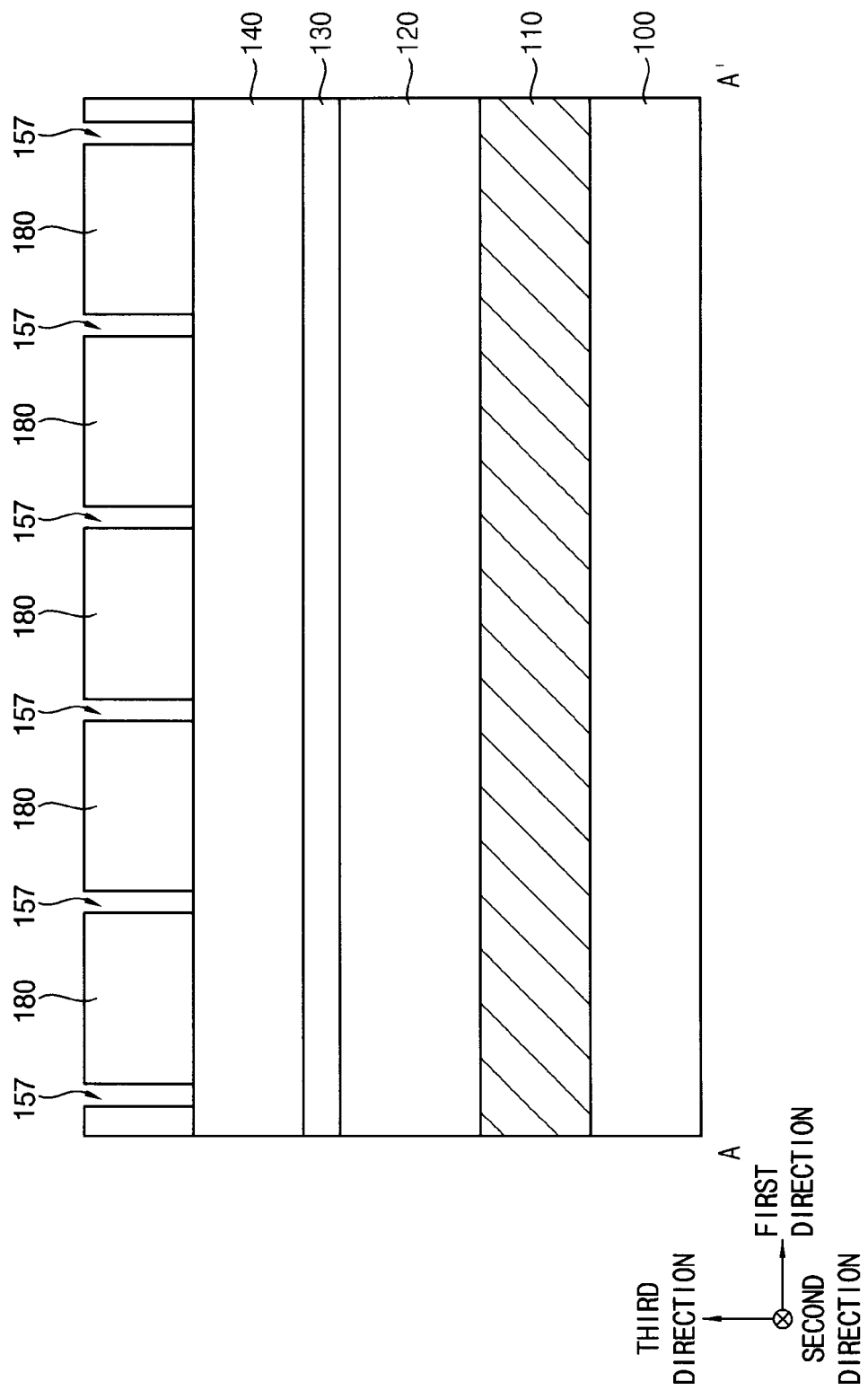

Referring to FIG. 11, the first spacers 155 covering sidewalls of the third sacrificial patterns 180 may be removed, and thus a plurality of first openings 157 may be formed. Each of the first openings 157 may expose a portion of the upper surface of the second mask layer 140 and extending in the oblique direction may be formed between neighboring ones of the third sacrificial patterns 180.

Figure 12:
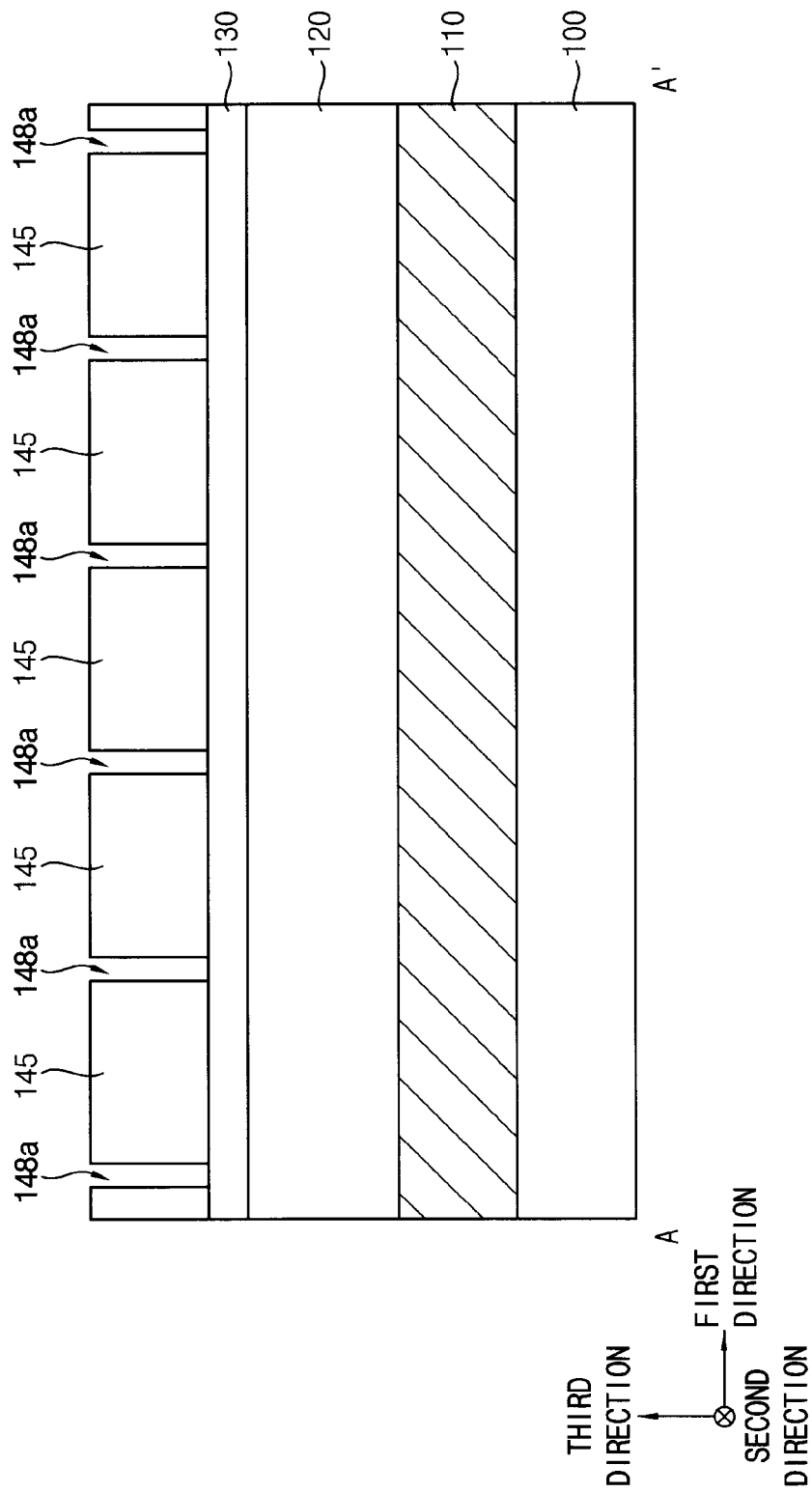

Referring to FIG. 12, a plurality of preliminary second mask patterns 145 may be formed by an etching process that is performed on the second mask layer 140 using the third sacrificial patterns 180 as an etching mask. In the etching process, the first openings 157 may be transferred into the second mask layer 140 to form a plurality of preliminary second openings 148a. Each of the first openings 157 may be connected to a corresponding one of the preliminary second openings 148a so that a portion of an upper surface of the etch stop layer 130 may be exposed. Each of the preliminary second opening 148a extending in the oblique direction may be formed between neighboring ones of the preliminary second mask patterns 145. The third sacrificial patterns 180 may be removed.

Figure 13:
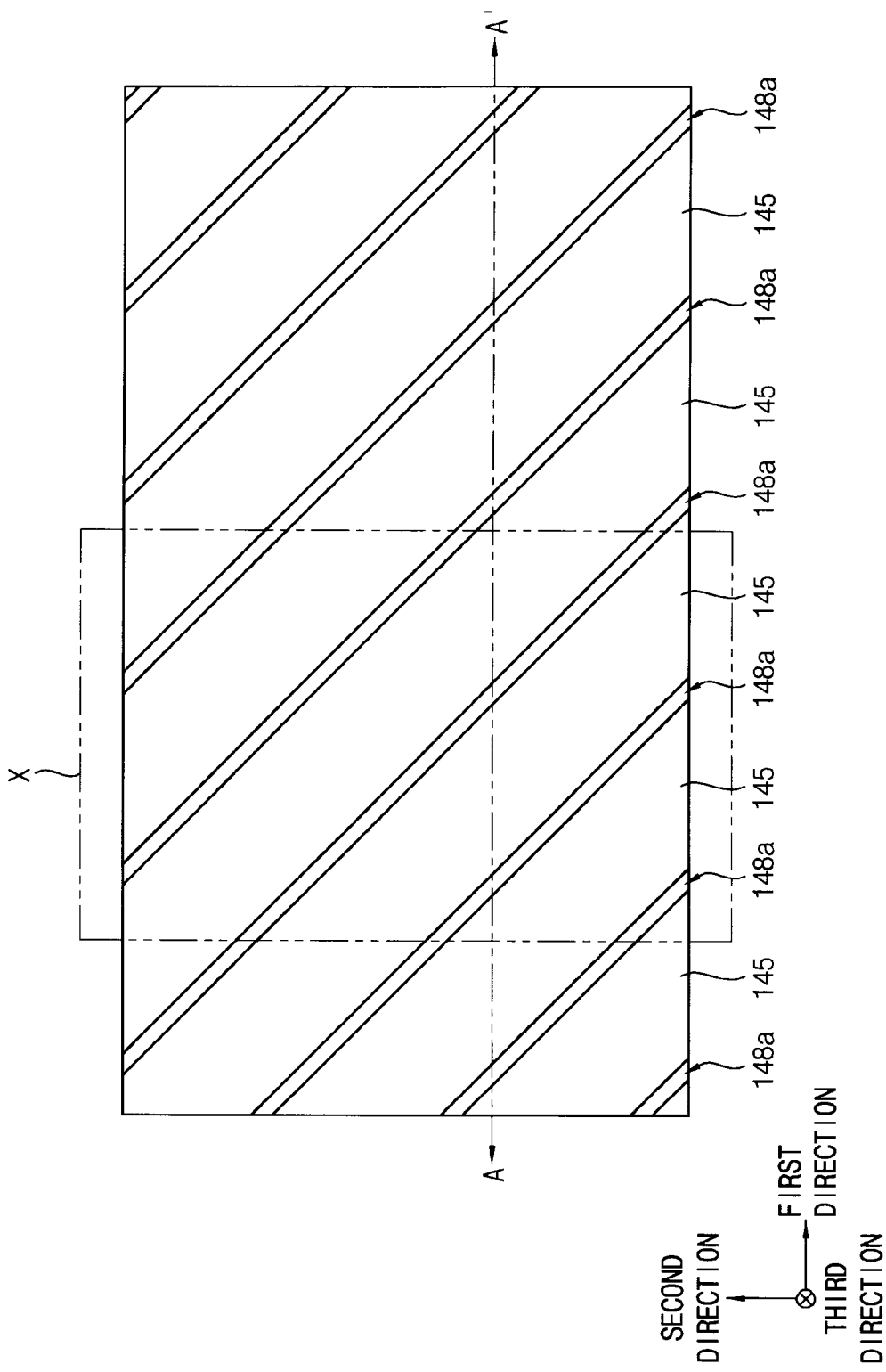
Figure 14:
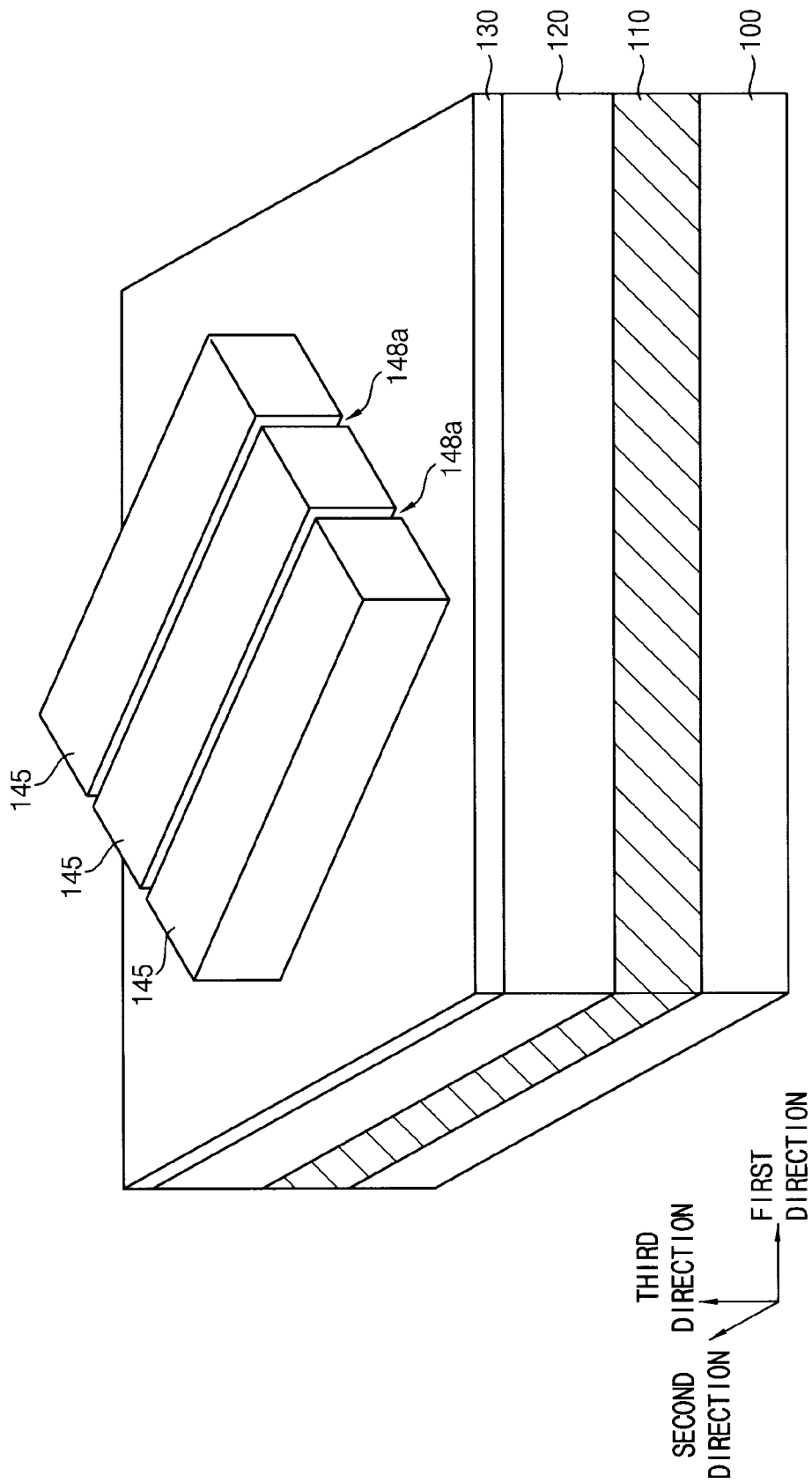

Referring to FIGS. 13 and 14, the preliminary second mask patterns 145 may have a parallelogram shape or a rectangular shape in a plan view.

In example embodiments, the preliminary second mask patterns 145 may be formed to be spaced apart from each other along each of the first and second directions, and each of the preliminary second mask patterns 145 may extend in the oblique direction forming an acute angle or an obtuse angle with the first and second directions.

Up to now, forming the pattern by a double patterning process has been described with reference to FIGS. 3 to 14. In an example embodiment, the preliminary second mask patterns 145 may be formed using the double patterning process described with reference to FIGS. 3 to 14. The inventive concept, however, is not limited thereto.

Figure 15:
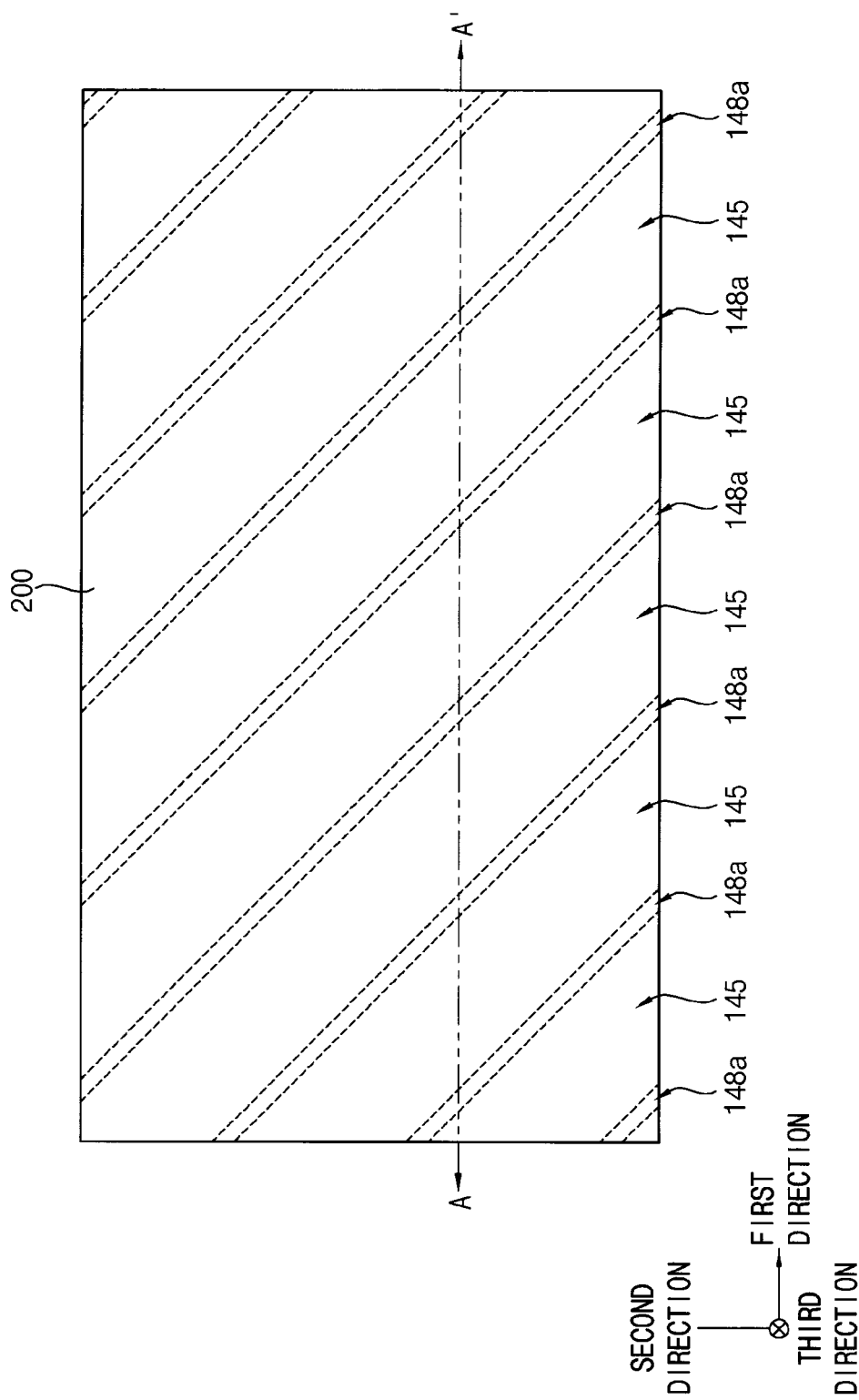
Figure 16:
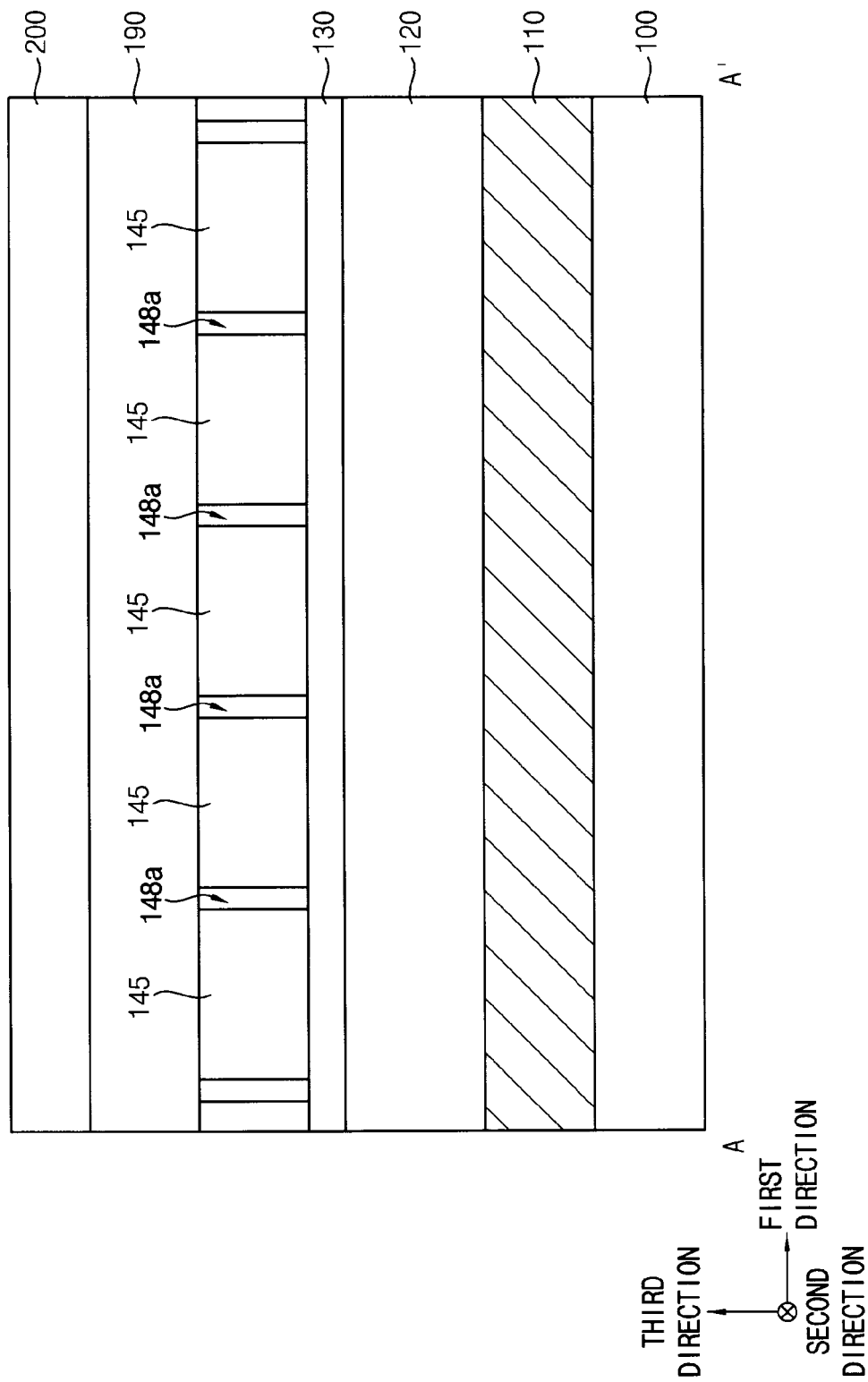

Referring to FIGS. 15 and 16, a fourth sacrificial layer 190 and a fifth sacrificial layer 200 may be sequentially formed on the preliminary second mask patterns 145.

In example embodiments, the fourth sacrificial layer 190 may include a material of a low gap fill characteristic, and thus may not fill the preliminary second openings 148a. The fourth sacrificial layer 190 may include substantially the same material as the first sacrificial layer 150, e.g., silicon-on-hardmask (SOH). The fifth sacrificial layer 200 may include substantially the same material as the second sacrificial layer 160, e.g., oxynitride such as silicon oxynitride.

Figure 17:
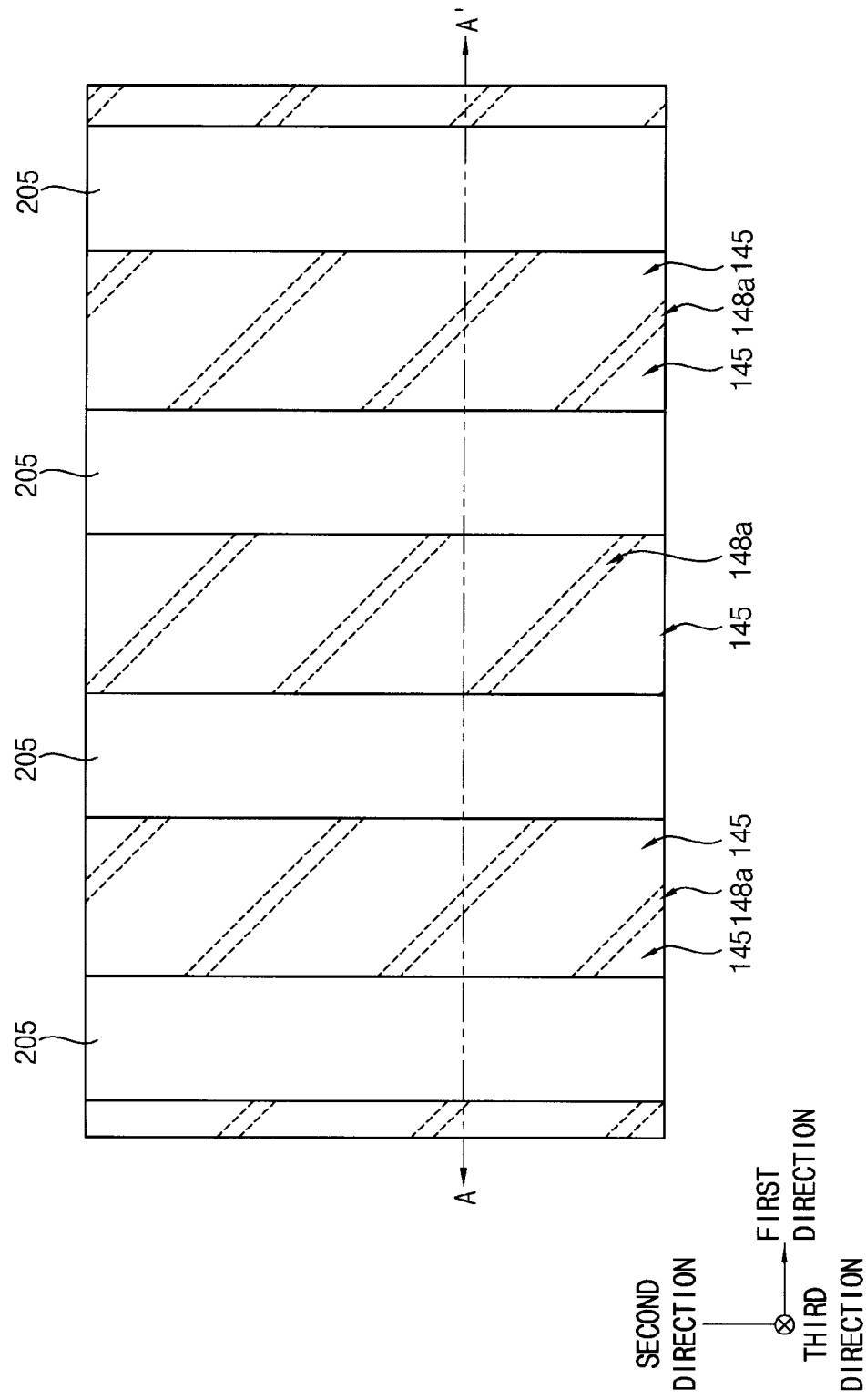
Figure 18:
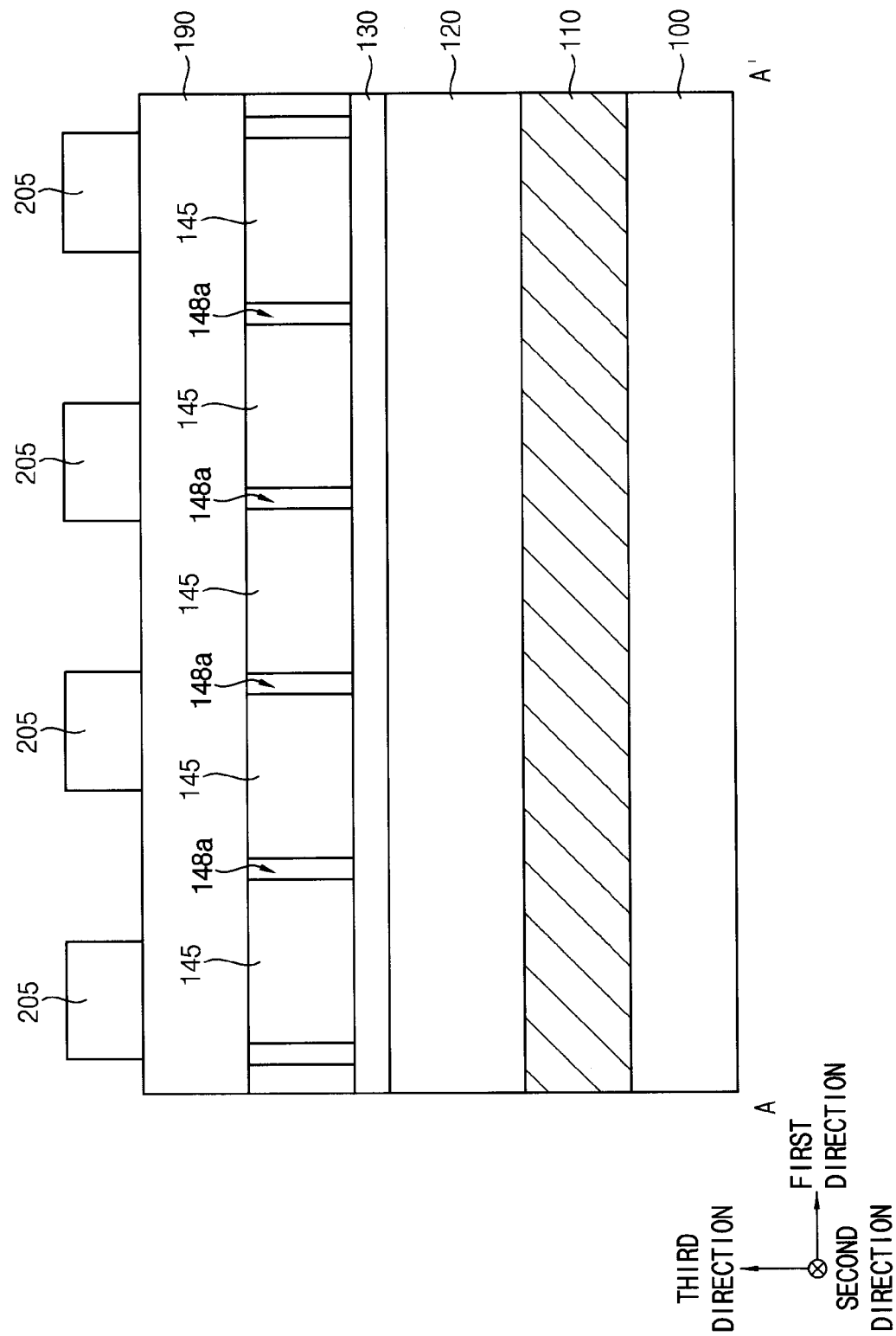

Referring to FIGS. 17 and 18, a process that may be substantially the same as or similar to the process described with reference to FIGS. 3 and 4 may be performed.

Thus, an etching process using a second photoresist pattern (not shown) as an etching mask may be performed on the fifth sacrificial layer 200 to form a plurality of fifth sacrificial patterns 205. Each of the fifth sacrificial patterns 205 may have a line shape.

A portion of an upper surface of the fourth sacrificial layer 190 may be exposed between neighboring ones of the fifth sacrificial patterns 205, and the second photoresist pattern may be removed after forming the fifth sacrificial patterns 205.

In example embodiments, the fifth sacrificial patterns 205 may be formed to be spaced apart from each other along the first direction, and each of the fifth sacrificial patterns 205 may extend in the second direction. The inventive concept, however, is not limited thereto.

Figure 19:
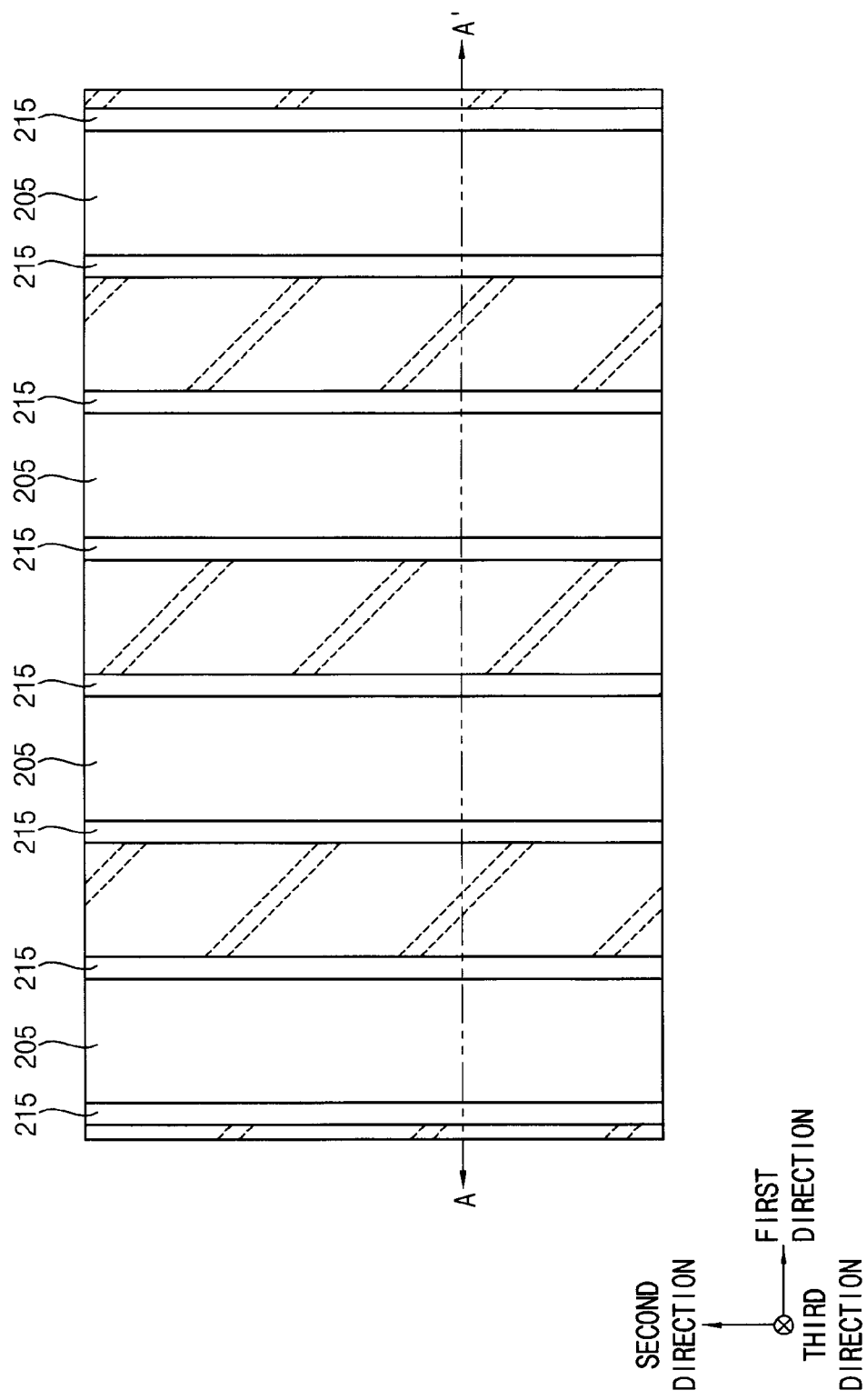
Figure 20:
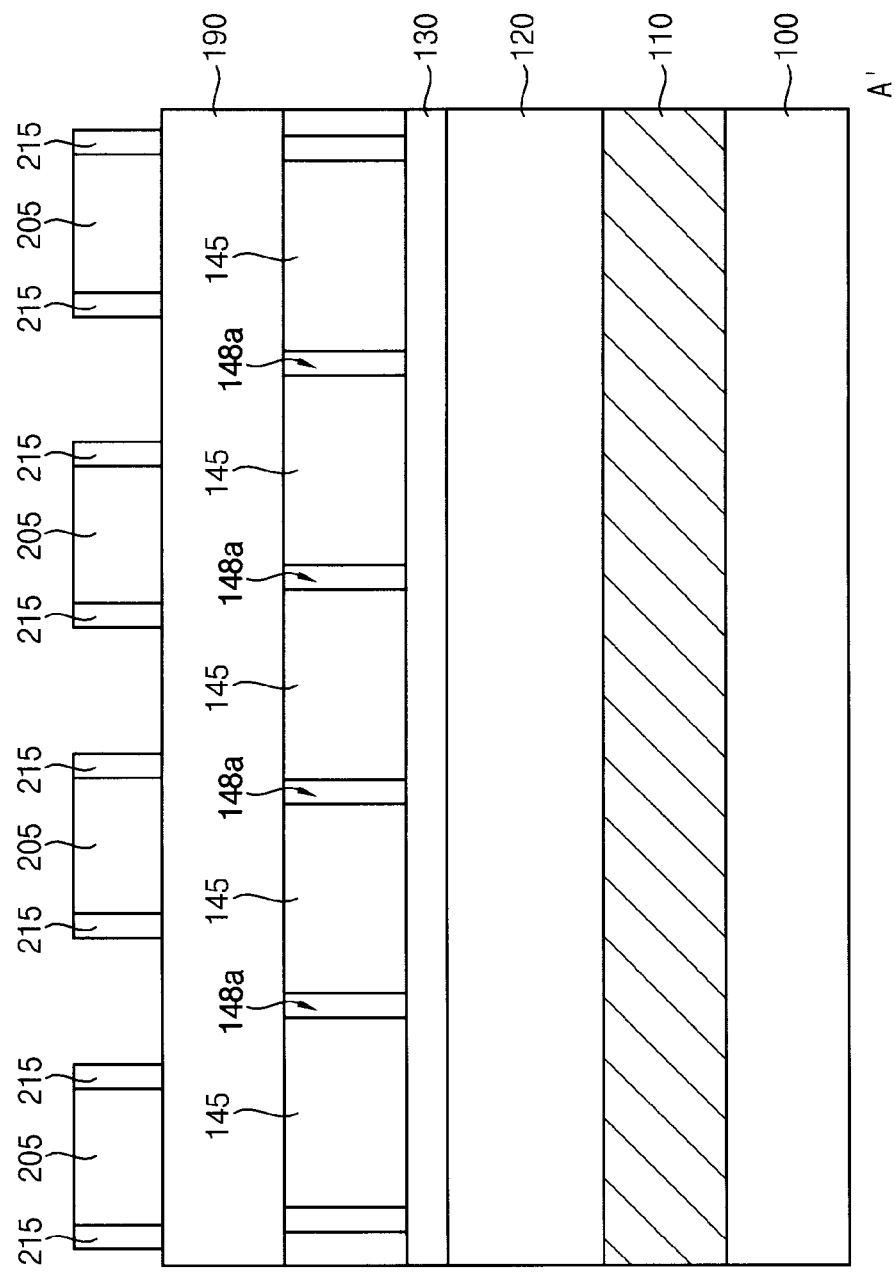

Referring to FIGS. 19 and 20, a process that may be substantially the same as or similar to the process described with reference to FIGS. 5 and 6 may be performed. In an example embodiment, the process of the FIGS. 5 and 6 may be performed on the resulting structure of FIGS. 17 and 18.

Thus, a second spacer mask layer may be conformally formed on the exposed upper surface of the fourth sacrificial layer 190 and an upper surface and a sidewall of each of the fifth sacrificial patterns 205, and then the second spacer mask layer may be anisotropically etched to form a plurality of second spacer masks 215. Each of the second spacer masks 215 may cover a sidewall of a corresponding one of the fifth sacrificial patterns 205. In one embodiment, the second spacer mask layer may include substantially the same material as the first spacer mask layer 170, e.g., oxide such as silicon oxide.

Figure 21:
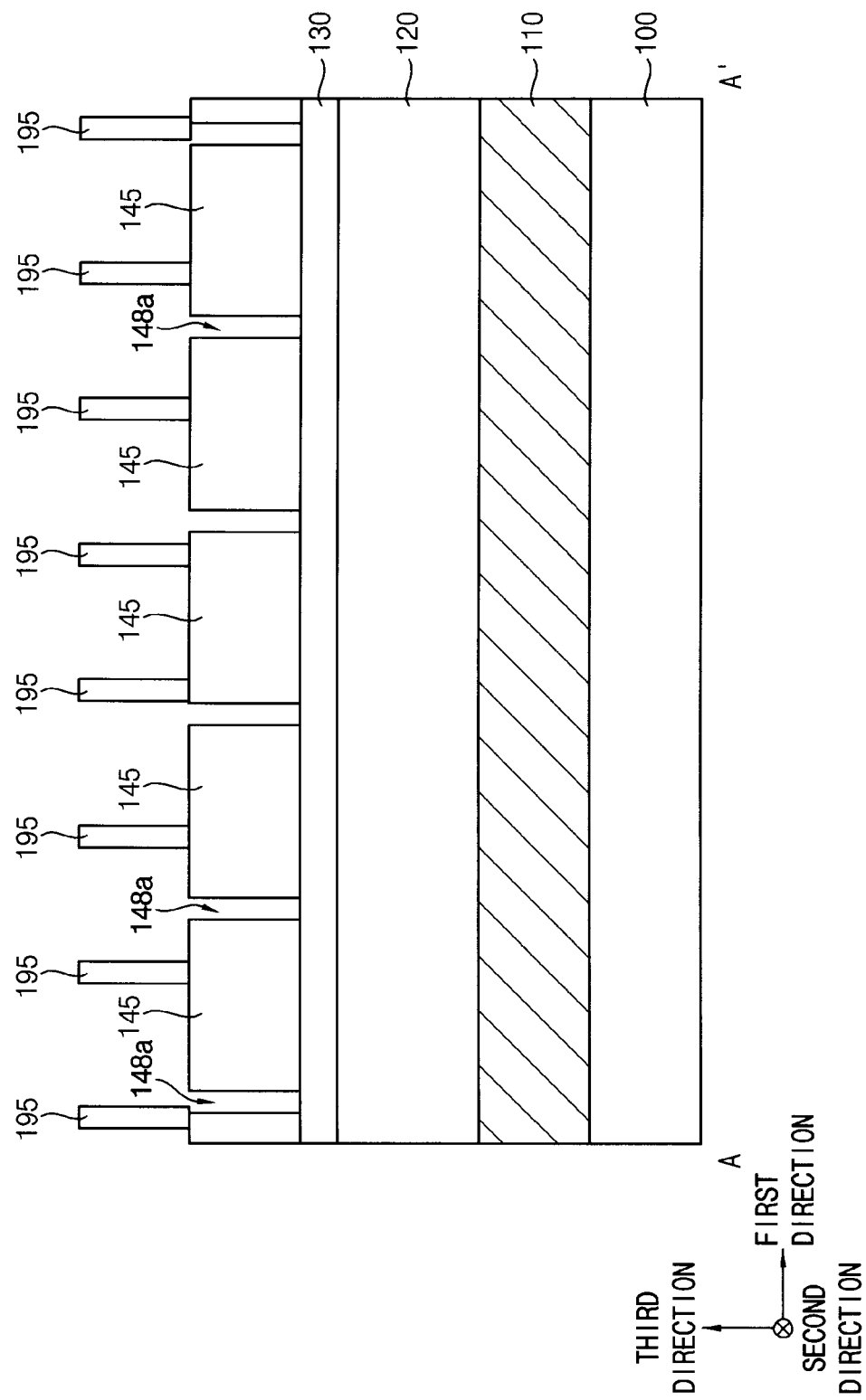

Referring to FIG. 21, a process that may be substantially the same as or similar to the process described with reference to FIGS. 7 to 9 may be performed. In an example embodiment, the process of the FIGS. 7 to 9 may be performed on the resulting structure of FIGS. 19 and 20.

Thus, the fifth sacrificial patterns 205 may be removed, and then an etching process using the second spacer masks 215 as an etching mask may be performed on the fourth sacrificial layer 190 to form a plurality of second spacers 195 on the preliminary second mask patterns 145. A portion of an upper surface of each of the preliminary second mask patterns 145 may be exposed between neighboring ones of the second spacers 195.

In example embodiments, the second spacers 195 may be formed to be spaced apart from each other along the first direction, and each of the second spacers 195 may extend in the second direction. The second spacers 195 may not fill the preliminary second openings 148a between neighboring ones of the preliminary second mask patterns 145, and may be formed across the upper surfaces of neighboring ones of the preliminary second mask patterns 145. That is, a portion of an upper surface of the etch stop layer 130 may be exposed through spaces between neighboring ones of the second spacers 195 and the preliminary second opening 148a.

Figure 22:
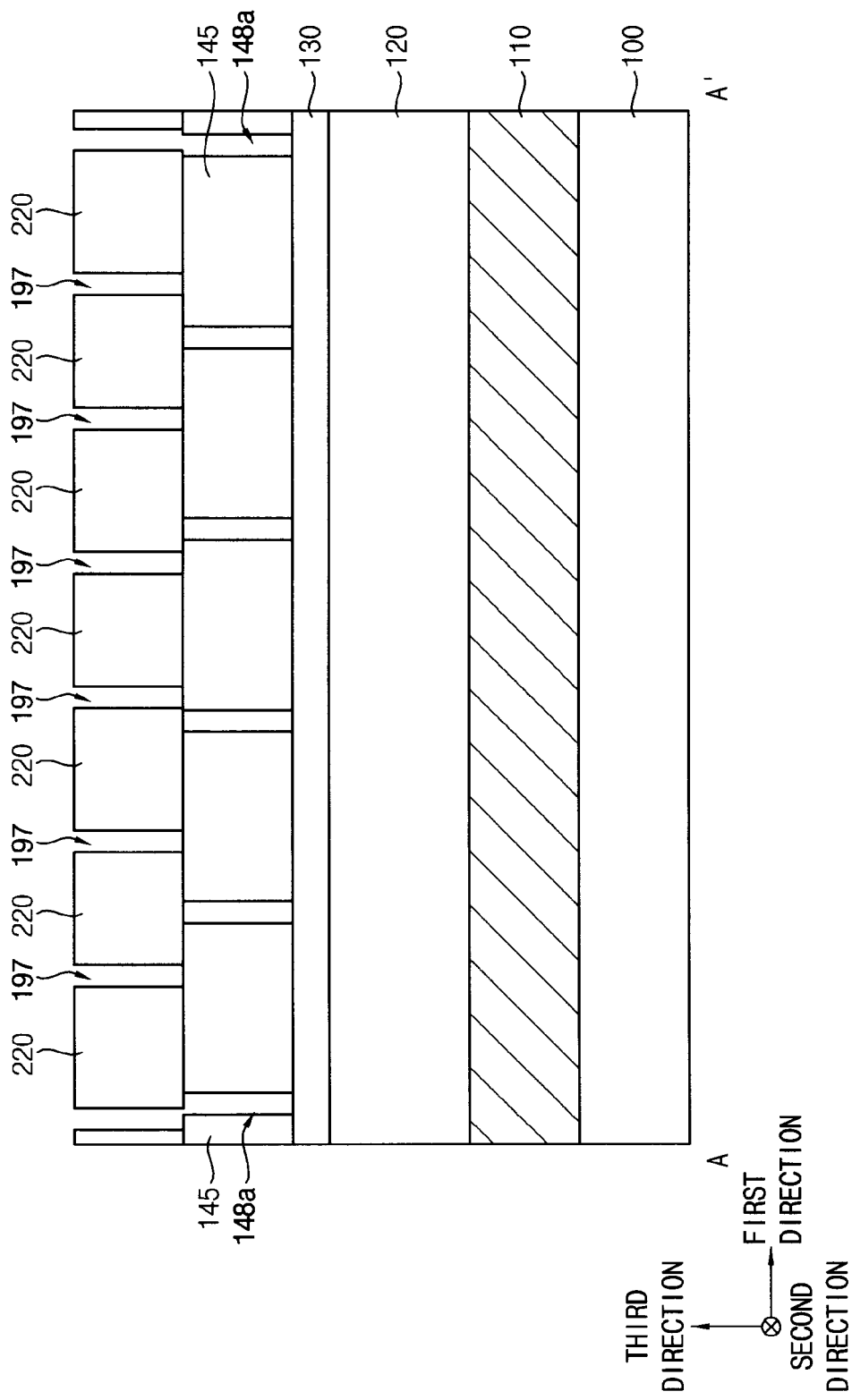

Referring to FIG. 22, a process substantially the same as or similar to the process described with reference to FIGS. 10 and 11 may be performed. In an example embodiment, the process of FIGS. 10 and 11 may be performed on the resulting structure of FIG. 21.

Thus, after forming a sixth sacrificial layer to cover the exposed upper surfaces of the preliminary second mask patterns 145 and upper surfaces and sidewalls of the second spacers 195, the sixth sacrificial layer may be planarized until the upper surfaces of the second spacers 195 may be exposed to form a plurality of sixth sacrificial patterns 220, and the second spacers 195 covering sidewalls of the sixth sacrificial patterns 220 may be removed, so that a plurality of third openings 197 exposing portions of the upper surfaces of the preliminary second mask patterns 145 and portions of the preliminary second openings 148a may be formed between neighboring ones of the sixth sacrificial patterns 220. The third openings 197 may extend in the second direction.

Up to now, forming the pattern by a double patterning process has been described with reference to FIGS. 17 to 22. The inventive concept, however, is not limited thereto.

Figure 25:
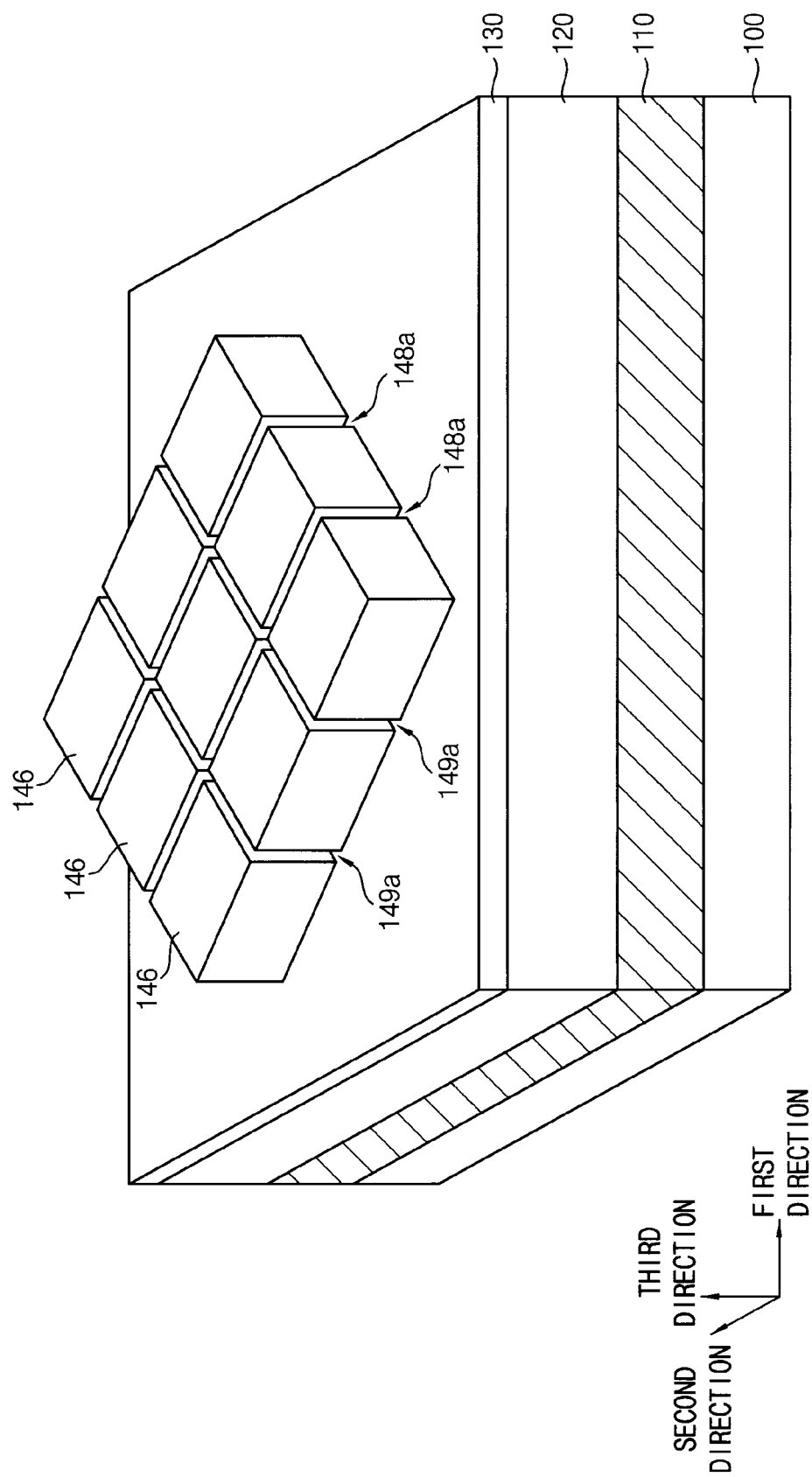

Referring to FIGS. 23 to 25, an etching process using the sixth sacrificial patterns 220 as an etching mask may be performed on the preliminary second mask patterns 145 to form a plurality of second mask patterns 146 and a plurality of preliminary fourth openings 149a.

Each of the preliminary fourth openings 149a extending in the second direction may be formed between neighboring ones of the second mask patterns 146. Each of the preliminary fourth openings 149a may correspond to one of the third openings 197 between neighboring ones of the sixth sacrificial patterns 220s. The preliminary fourth openings 149a may be connected to be partially merged with the preliminary second openings 148a extending in the oblique direction between neighboring ones of the preliminary second mask patterns 145. In an example embodiment, the preliminary second openings 148a previously formed may be connected to the preliminary fourth openings 149a to define the second mask patterns 146. In this case, each of the second mask patterns 146 may be defined by two neighboring preliminary second openings 148a and two neighboring preliminary fourth openings 149a.

In example embodiments, a plurality of second mask patterns 146 may be formed to be spaced apart from each other along each of the first and second directions, and each of the second mask patterns 146 may have a rhomboid shape having a first diagonal line D1 and a second diagonal line D2. A length of the first diagonal line D1 may be greater than a length of the second diagonal line D2. The first diagonal line D1 and the second diagonal line D2 may be referred to as a first diagonal length and a second diagonal length respectively.

FIG. 24A illustrates that the preliminary second openings 148a each of which may extend in the oblique direction are formed in the first direction and the preliminary fourth openings 149a each of which may extend in the second direction are formed in the second direction between neighboring ones of the second mask patterns 146. The inventive concept, however, is not limited thereto. In an example embodiment, referring to FIG. 24B, the preliminary second openings 148a each of which may extend in a first oblique direction different from the oblique direction are formed in the first direction and the preliminary fourth openings 149a each of which may extend in a second oblique direction different from the oblique direction are formed in the second direction between neighboring ones of the second mask patterns 146.

The upper surface of the etch stop layer 130 may be partially exposed by the preliminary second openings 148a and the preliminary fourth openings 149a.

Figure 26:
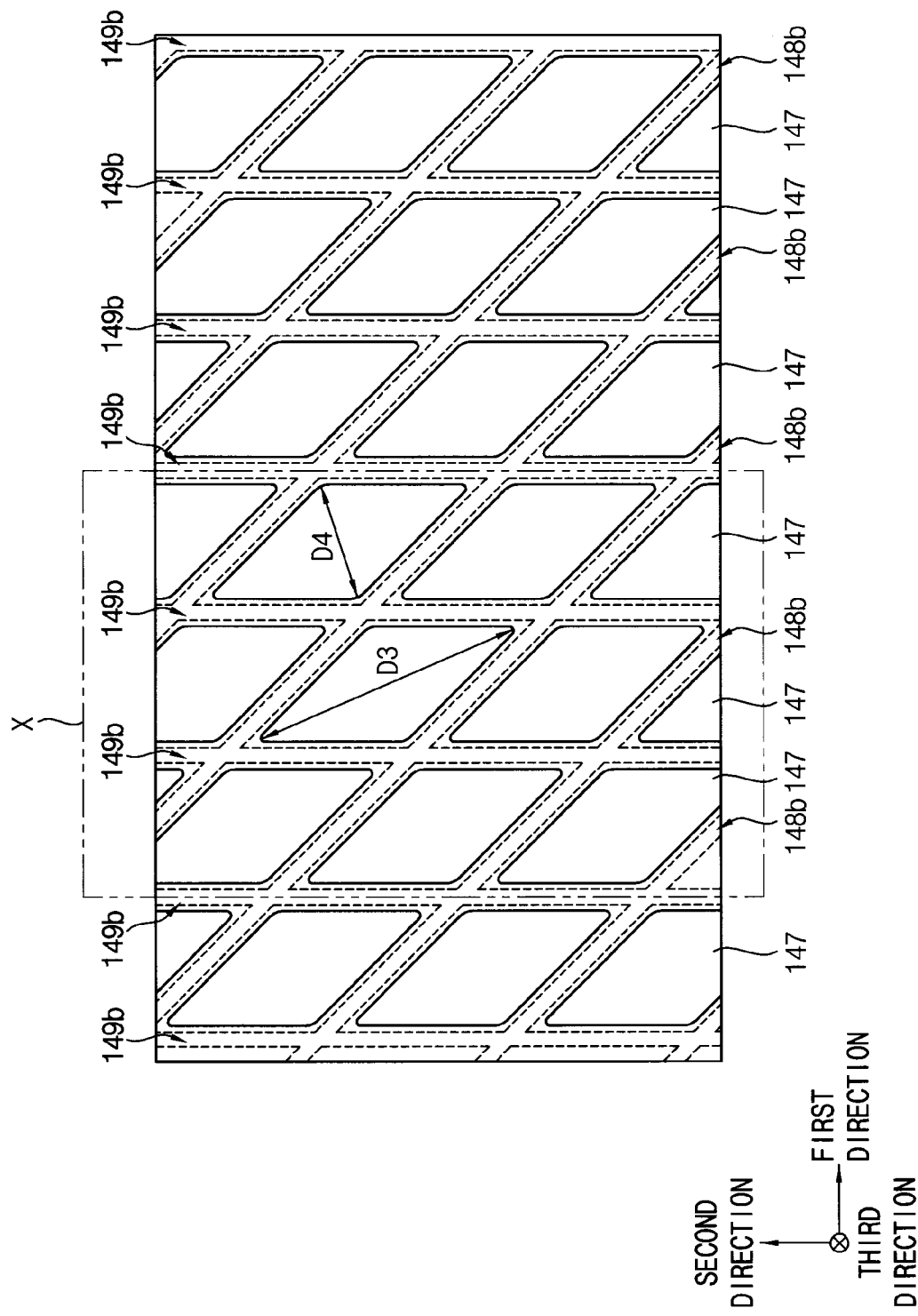
Figure 27:
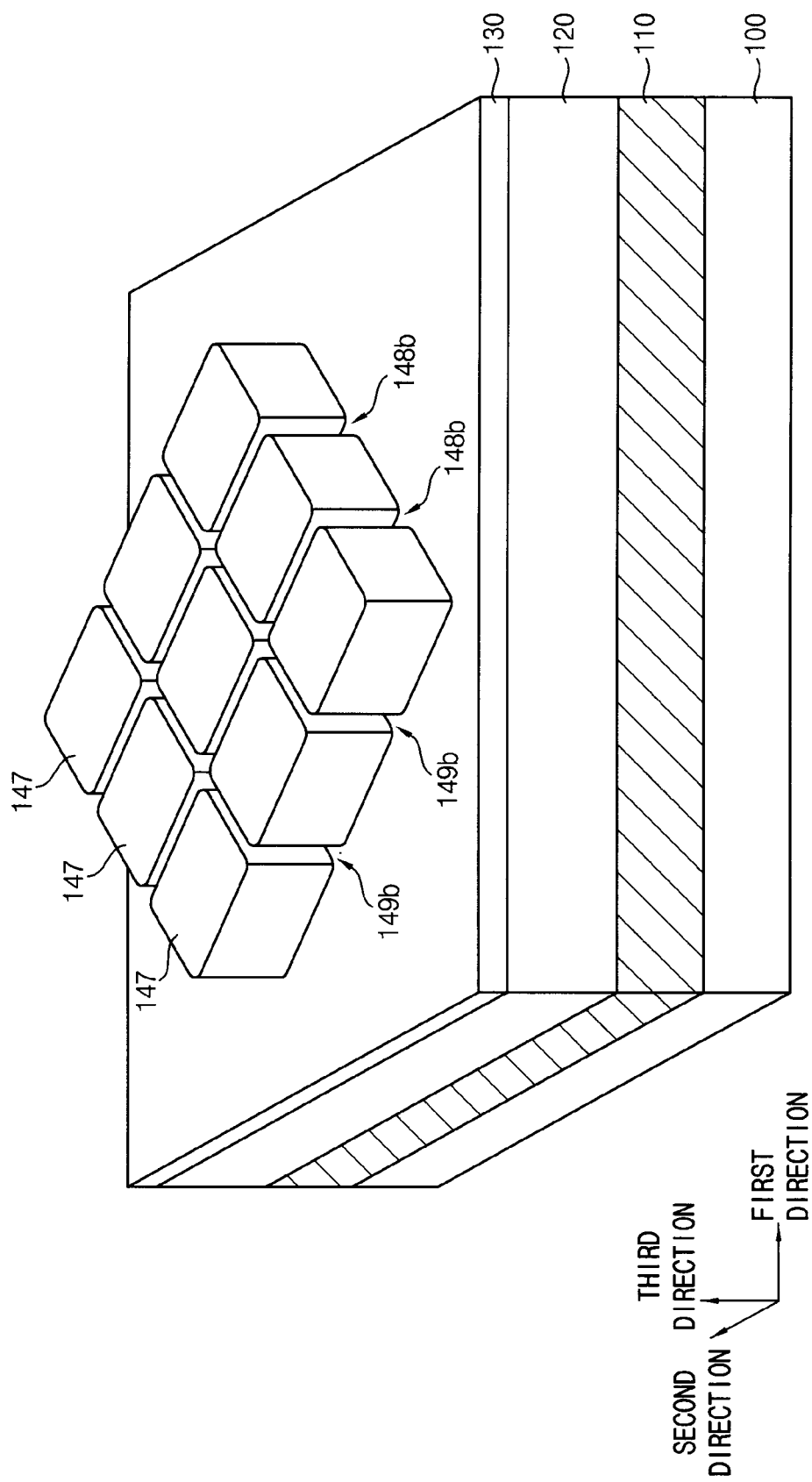

Referring to FIGS. 26 and 27, a trimming process may be performed on an edge portion of each of the second mask patterns 146 to form a plurality of second masks 147, a plurality of second openings 148b and a plurality of fourth openings 149b. The second mask patterns 146 that are subject to the trimming process may correspond to the second masks 147 respectively. The preliminary second openings 148a that are subject to the trimming process may correspond to the second openings 148b respectively. The preliminary fourth openings 149a that are subject to the trimming process may correspond to the fourth openings 149b respectively.

Accordingly, the second masks 147 may be formed to be spaced apart from each other along each of the first and second directions. Each of the second openings 148b may be formed at a space between neighboring ones in the second direction of the second masks 147. Each of the fourth openings 149b may be formed at a space between neighboring ones in the first direction of the second masks 147. The second openings 148b and the fourth openings 149b may be connected to be partially merged with each other.

In example embodiments, the trimming process may be performed by, e.g., a wet etching process, and portions corresponding to respective opposite ends of the first diagonal line D1 of each of the second mask patterns 146 may be etched more than portions corresponding to respective opposite ends of the second diagonal line D2 of each of the second mask patterns 146. Since an area of each of the portions corresponding to the respective opposite ends of the second diagonal line D2 is smaller than an area of each of the portions corresponding to the respective opposite ends of the first diagonal line D1, when the trimming process is uniformly performed on each of vertex portions of the second mask patterns 146 during the same time, the portions corresponding to the respective opposite ends of the first diagonal line D1 may be etched more than the portions corresponding to the respective opposite ends of the second diagonal line D2.

Accordingly, a third diagonal line D3 and a fourth diagonal line D4, which may be formed by trimming the second mask patterns 146, of each of the second masks 147, may be less than the first diagonal line D1 and the second diagonal line and D2 in length, respectively. In one embodiment, a ratio of the third diagonal line D3 with respect to the fourth diagonal line D4 may be less than about 1.4.

In example embodiments, the second masks 147 may have a rhomboid shape of which an vertex portion is rounded in a plan view. In an example embodiment, the vertex portion on one end of the third diagonal line D3 may be more rounded than the vertex portion on one end of the fourth diagonal line D4 because the vertex portion on the third diagonal line D3 may receive more etchants than the vertex portion on the fourth diagonal line D4. The vertex angle at a one end of the third diagonal line D3 may have a wider influx angle of the etchants than the vertex angle at one end of the fourth diagonal line D4.

After performing the trimming process, a CVD process, a PVD process or an ALD process may be further performed on the second mask 147 to increase a width of the second mask 147. The inventive concept, however, is not limited thereto. In an example embodiment, the deposition processes may be omitted.

Figure 28:
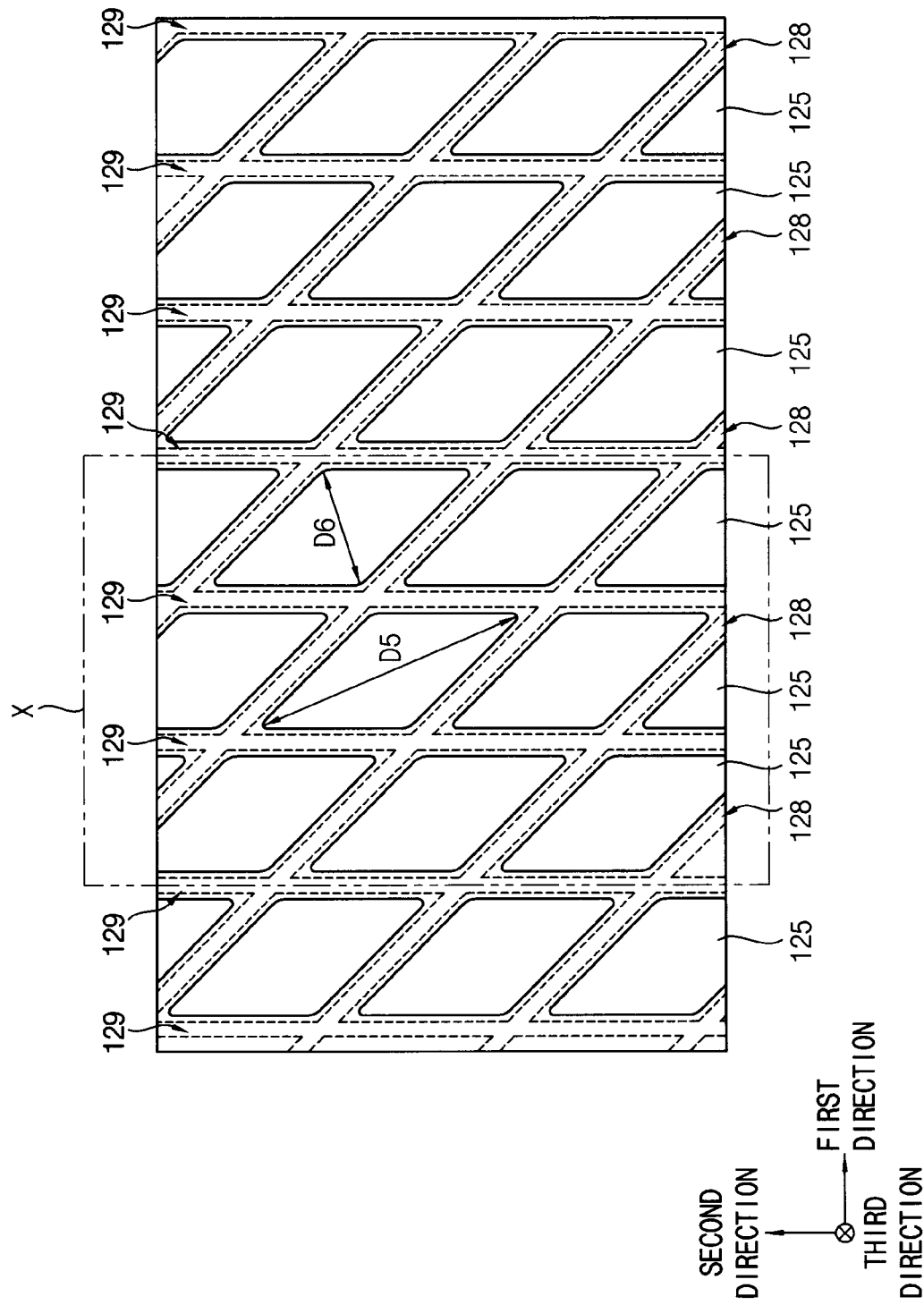
Figure 29:
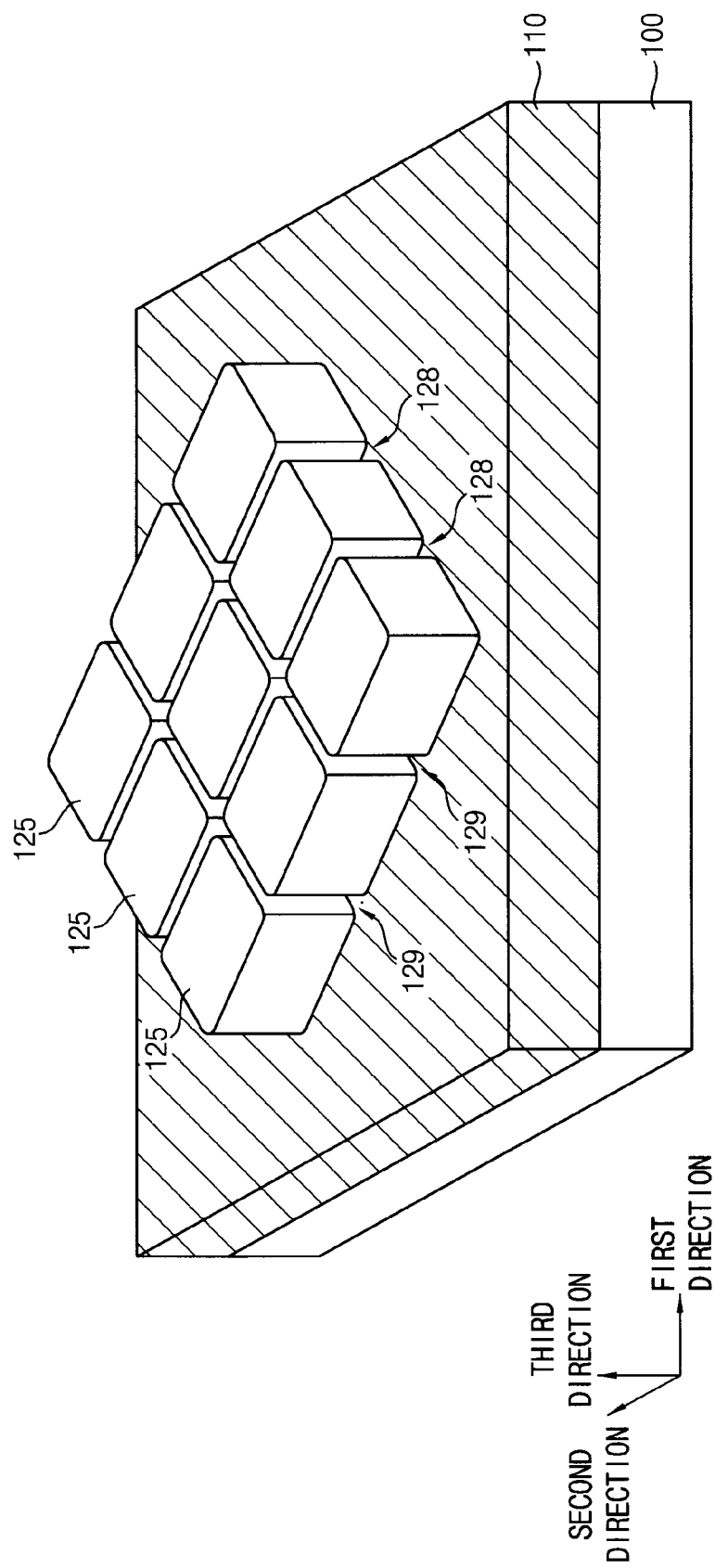

Referring to FIGS. 28 and 29, an etching process using the second mask 147 as an etching mask may be performed on the etch stop layer 130 and the first mask layer 120 to form a plurality of first masks 125, a plurality of fifth openings 128 and a plurality of sixth openings 129.

The fifth openings 128 and the sixth openings 129 extending in the second direction and the oblique direction, respectively, may expose an upper surface of the target layer 110. The fifth openings 128 may be formed between neighboring ones, in the oblique direction, of the first masks 125. The sixth openings 129 may be formed between neighboring ones, in the second direction, of the first masks 125. The fifth openings 128 and the sixth openings 129 may be connected to be partially merged with each other.

In example embodiments, the first masks 125 may be formed to be spaced apart from each other along each of the first and second directions, and each of the first masks 125 may have a rhomboid shape with the fifth diagonal line D5 and the sixth diagonal line D6 in a plan view. In example embodiment, a length of the fifth diagonal line D5 may be greater than that of the sixth diagonal line D6. The fifth diagonal line D5 and the sixth diagonal line D6 of each of the first masks 125 may have the same lengths as the third diagonal line D3 and the fourth diagonal line D4, respectively, of the second mask 147. In one embodiment, although not shown, depending on the characteristic of the etching process, each of the first masks 125 may also have an elliptical shape having a long major axis and a short minor axis in a plan view. In an example embodiment, each of the first masks 125, depending on the degree of rounding of the vertex, may have an elliptical shape.

Figure 30:
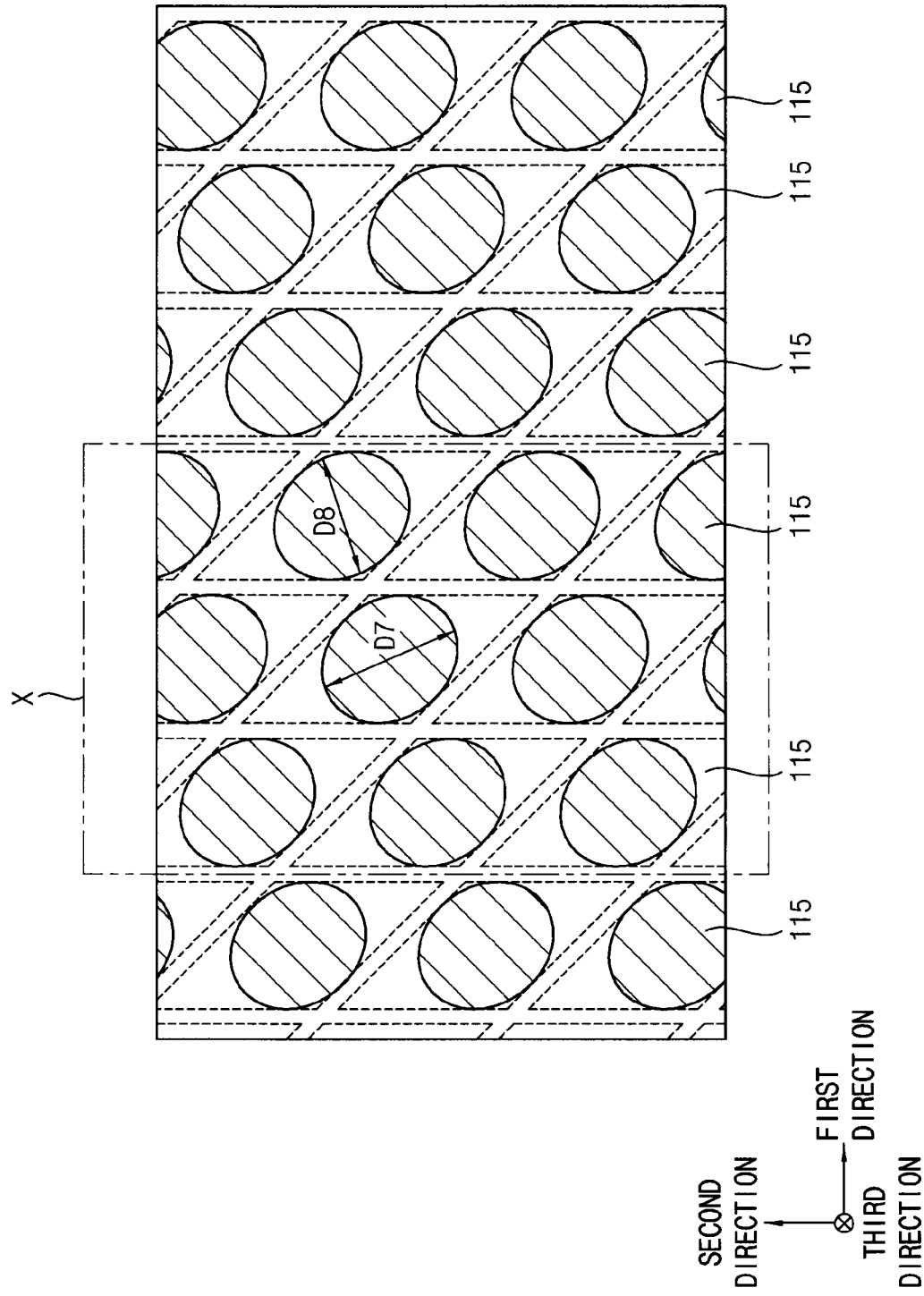
Figure 31:
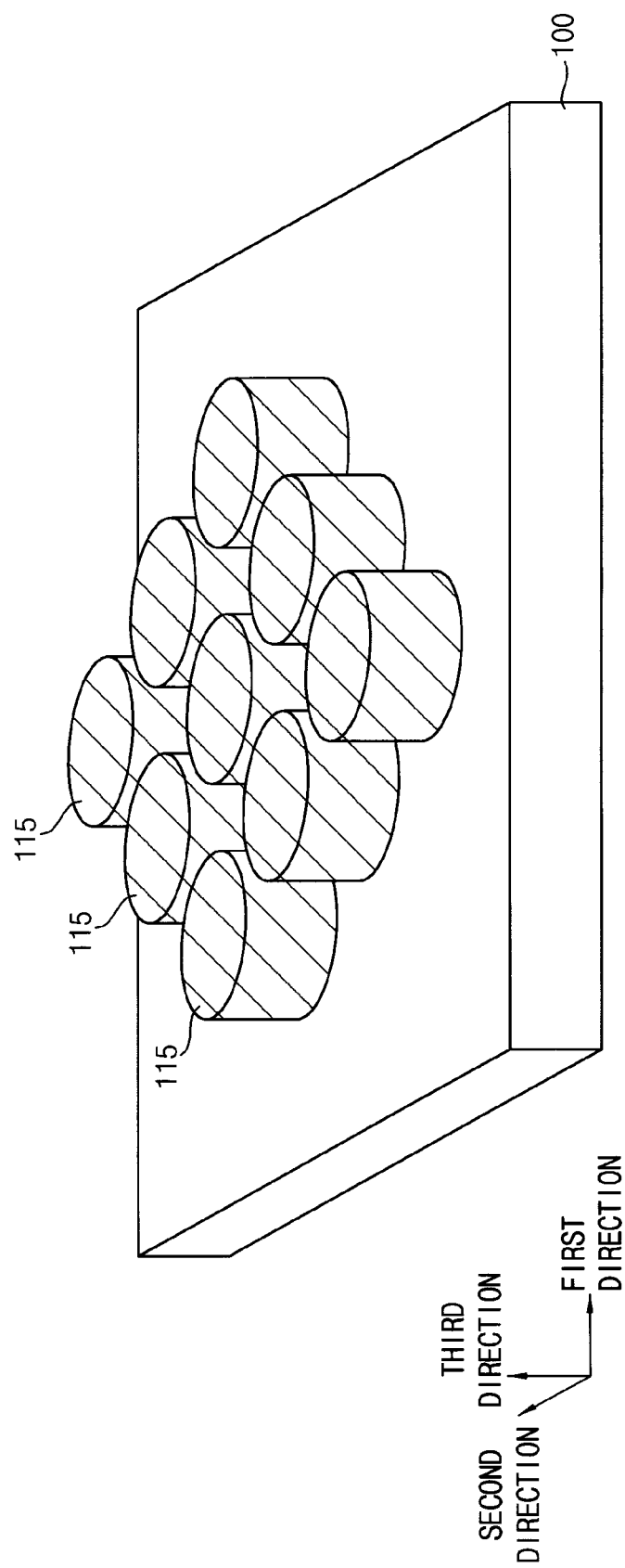

Referring to FIGS. 30 and 31, an etching process using the first masks 125 as an etching mask may be performed on the target layer 110 to form a plurality of target patterns 115.

Since the target patterns 115 may be formed by the etching process using the first masks 125 each of which an aspect ratio is adjusted relative to a corresponding one of the second mask patterns 126, an aspect ratio of a corresponding one of the target patterns 115 may be also adjusted. Accordingly, the target patterns 115 may not be in contact with each other not to be electrically connected with each other, and the reliability of the semiconductor device including the target patterns 115 may be increased.

In example embodiments, the target patterns 115 may be formed to be spaced apart from each other along each of the first and second directions, and each of the target patterns 115 may have an elliptical shape having a major axis D7 and a minor axis D8 in a plan view. The major axis D7 and the minor axis D8 of each of the target patterns 115 may be less than the fifth diagonal line D5 and the sixth diagonal line D6 in length, respectively, of a corresponding one of the first masks 125.

Alternatively, although not shown, the target patterns 115 may have the same shape as the first masks 125 respectively. In this case, each of the target patterns 115 may have a seventh diagonal line D7 and a eighth diagonal line D8 corresponding to the major axis D7 and the minor axis D8 respectively, and may have a rhomboid shape of which a vertex portion is rounded in a plan view. The seventh line D7 and the eighth diagonal line D8 may be less than the fifth line D5 and the sixth diagonal line D6, respectively.

In one embodiment, the target patterns 115 may be arranged in a honeycomb shape in a plan view.

As described above, the double patterning process may be performed on the second mask layer 140 in the oblique direction forming an acute angle or an obtuse angle with each of the first and second directions to form the preliminary second mask patterns 145, and another double patterning process may be further performed on the preliminary second mask patterns 145 in the second direction or the first direction, that is, in a longitudinal direction or a lateral direction to form the second mask patterns 146. The inventive concept, however, is not limited thereto. That is, first, a double patterning process may be performed on the second mask layer 140 in the longitudinal direction or the lateral direction to form the preliminary second mask patterns 145, and then another double patterning process may be further performed on the preliminary second mask patterns 145 in the oblique direction to form the second mask patterns 146.

The trimming process may be performed on the second mask patterns 146 to form the second masks 147, and the etching process using the second masks 147 as an etching mask may be performed on the first mask layer 120 to form the first masks 125. The trimming process may be performed so that the portions corresponding to the respective opposite ends of the first diagonal line D1 of each of the second mask patterns 146 may be more etched than the portions corresponding to the respective opposite ends of the second diagonal line D2 of each of the second mask patterns 146. Accordingly, the third diagonal line D3 and the fourth diagonal line D4 of each of the second masks 147 that may be formed by trimming the second mask patterns 146 may be less than the first diagonal line D1 and the second diagonal line D2 in length, respectively. In this case, the ratio of the third diagonal line D3 with respect to the fourth diagonal line D4 may be less than about 1.4.

The etching process using the first masks 125 as an etching mask may be performed on the target layer 110, and the target layer 110 may be etched to form the target patterns 115. The target patterns 115 may be formed by the etching process using the first masks 125. An aspect ratio of each of the first masks 125 is adjusted relative to a corresponding one of the second mask patterns 126, and the aspect ratio of each of the target patterns 115 may be also adjusted. Accordingly, the target patterns 115, which may not be in contact not to be electrically connected with each other, may be easily formed.

Hereinafter, a method of manufacturing a semiconductor including a landing pad that may be formed by using the method of forming the pattern described with reference to FIGS. 1 to 31 will be described. This method of manufacturing the semiconductor includes processes substantially the same as or similar to the processes described with reference to FIGS. 1 to 31, so that detailed descriptions thereon are omitted herein.

FIGS. 32 to 48 are plan views and cross-sectional views illustrating a method of manufacturing a semiconductor device in accordance with example embodiments. Specifically, FIGS. 32, 34, 38, 41, 43 and 46 are the plan views, and FIGS. 33, 35-37, 39-40, 42, 44-45 and 47-48 are the cross-sectional views. Each of the cross-sectional views is taken along lines B-B' and C-C' of corresponding plan views, respectively.

Figure 33:
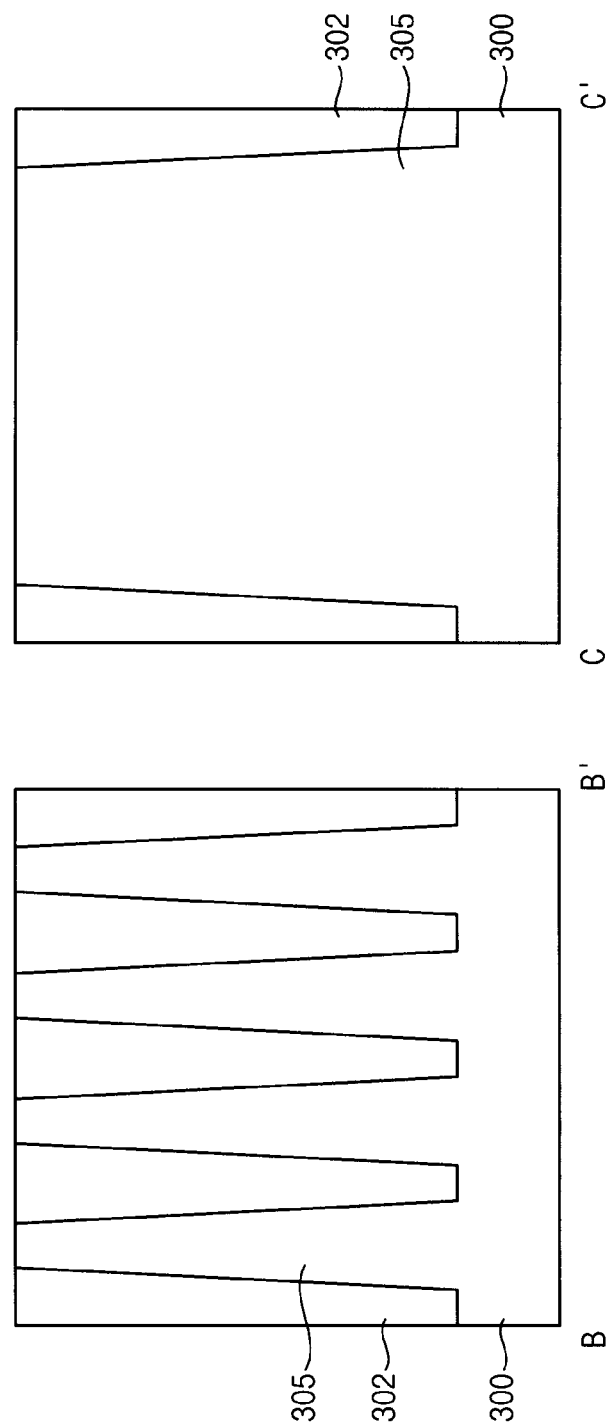

Referring to FIGS. 32 and 33, a plurality of active patterns 305 may be formed on a substrate 300, and an isolation pattern 302 may be formed to cover a sidewall of each of the active patterns 305.

The substrate 300 may include semiconductor materials e.g., silicon, germanium, silicon-germanium, etc.; or III-V compounds e.g., GaP, GaAs, GaSb, etc. In some embodiments, the substrate 300 may be a silicon-on-insulator (SOI) substrate or a geranium-on-insulator (GOI) substrate.

In one embodiment, the active patterns 305 may be formed to be spaced apart from each other in each of the first and second directions, and each of the active patterns 305 may extend in a fourth direction substantially parallel to an upper surface of the substrate 300 and forming an acute angle or an obtuse angle with respect to each of the first and second directions.

The active patterns 305 may be formed by removing an upper portion of the substrate 300 to form a first recess, and by forming an isolation layer on the substrate 300 to cover the first recess and planarizing the isolation layer until upper surfaces of the active patterns 305 may be exposed. In example embodiments, the planarization process may include a chemical-mechanical-polishing (CMP) process and/or an etch back process.

Figure 34:
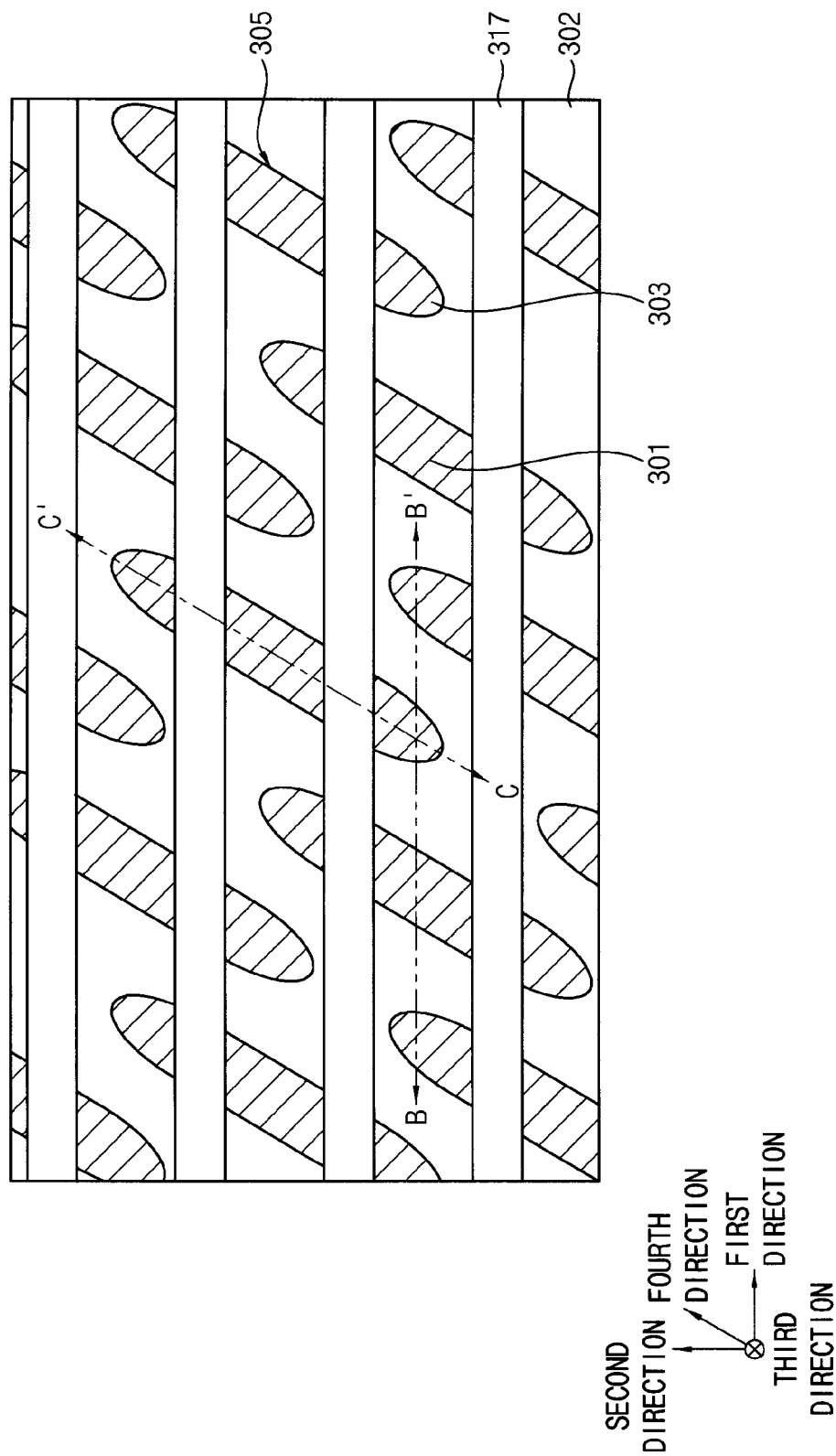
Figure 35:
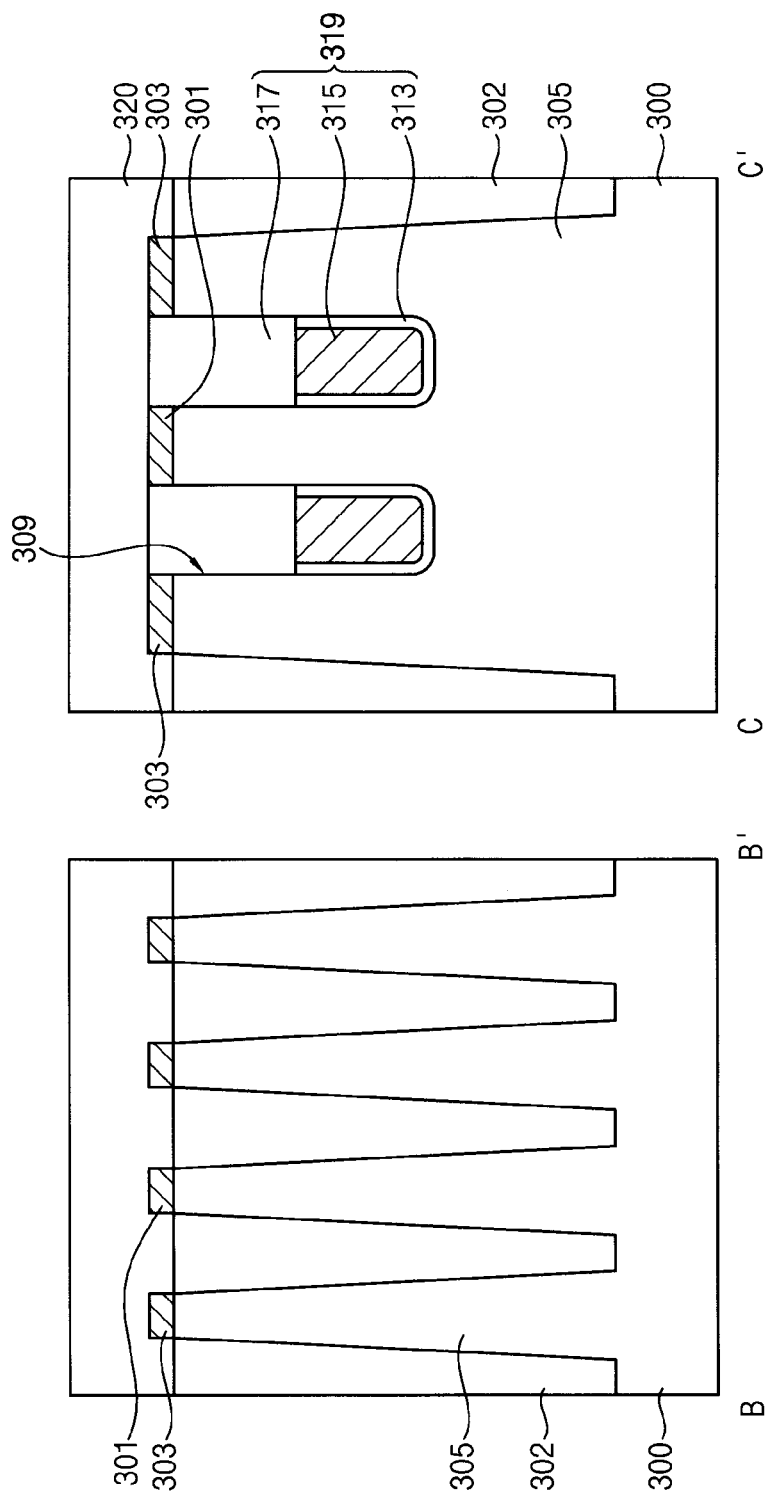

Referring to FIGS. 34 and 35, an ion implantation process may be performed on an upper portion of the active pattern 305 to form an impurity region, and upper portions of the active patterns 305 and an upper portion of the isolation pattern 302 may be partially removed to form a second recess 309.

In example embodiments, the second recess 309 may extend in the first direction, and a plurality of second recesses 309 may be formed to be spaced apart from each other along the second direction. In one embodiment, two second recesses 309 may be formed on one active pattern 305, and thus the impurity region may be divided into a first impurity region 301 and a second impurity region 303 by the second recesses 309. The first and second impurity regions 301 and 303 may serve as source/drain regions of the semiconductor device.

A plurality of gate structures 319 may be formed in the second recess 309. Each of the gate structures 319 may be formed to include a gate insulation layer 313 on a surface of a corresponding one of the active patterns 305 exposed by the second recess 309, a gate electrode 315 filling a lower portion of the second recess 309 on the gate insulation layer 313, and a first capping pattern 317 filling an upper portion of the second recess 309 on the gate insulation layer 313 and the gate electrode 315. Each of the gate structures 309 may extend in the second direction, and may be formed to be spaced apart from each other in the second direction.

In example embodiments, the gate insulation layer 313 may be formed by performing a thermal oxidation process on the active patterns 305 exposed by the second recess 309, and thus may include an oxide, e.g., silicon oxide.

The gate electrode 315 may be formed by forming a gate electrode layer on the gate insulation layer 313 and the isolation patterns 302 to fill the second recess 309, and removing an upper portion of the gate electrode layer by a CMP process and/or an etch back process. Accordingly, the gate electrode 315 may be formed in the lower portion of the second recess 309. The gate electrode layer may include metal, e.g., tungsten (W), titanium (Ti), tantalum (Ta), etc., or metal nitride, e.g., tungsten nitride, titanium nitride, tantalum nitride, etc.

The first capping pattern 317 may be formed by forming a first capping layer on the gate electrode 315, the gate insulation layer 313, the first and second impurity regions 301 and 303 and the isolation pattern 302 to fill a remaining portion of the second recess 309, and planarizing an upper portion of the first capping layer until upper surfaces of the first and second impurity regions 301 and 303 and an upper surface of the isolation pattern 302 may be exposed. Accordingly, the first capping pattern 317 may be formed in the upper portion of the second recess 309. The first capping layer may include nitride, e.g., silicon nitride.

Figure 36:
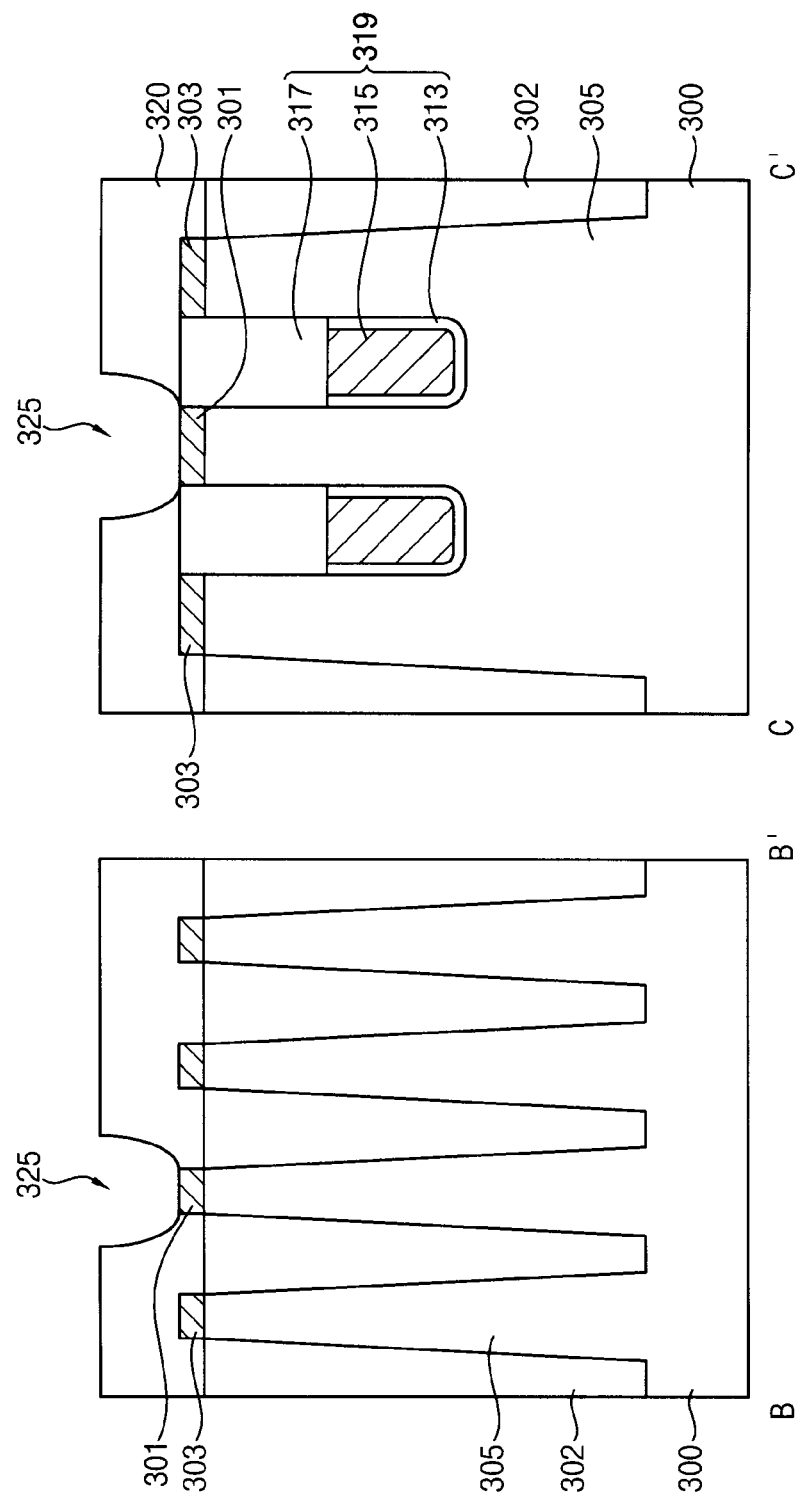

Transistors including the first and second impurity regions 301 and 303 and the gate structures 319 may be formed. Referring to FIG. 36, a first insulating interlayer 320 may be formed on the active patterns 305 and the isolation pattern 302 to cover the transistors. In one embodiment, the first insulating interlayer 320 may include a silicon oxide, e.g., TEOS.

The first insulating interlayer 320 may be partially etched to form a first trench 325 exposing the first impurity regions 301. A plurality of first trenches 325 may be formed in each of the first and second directions.

Figure 37:
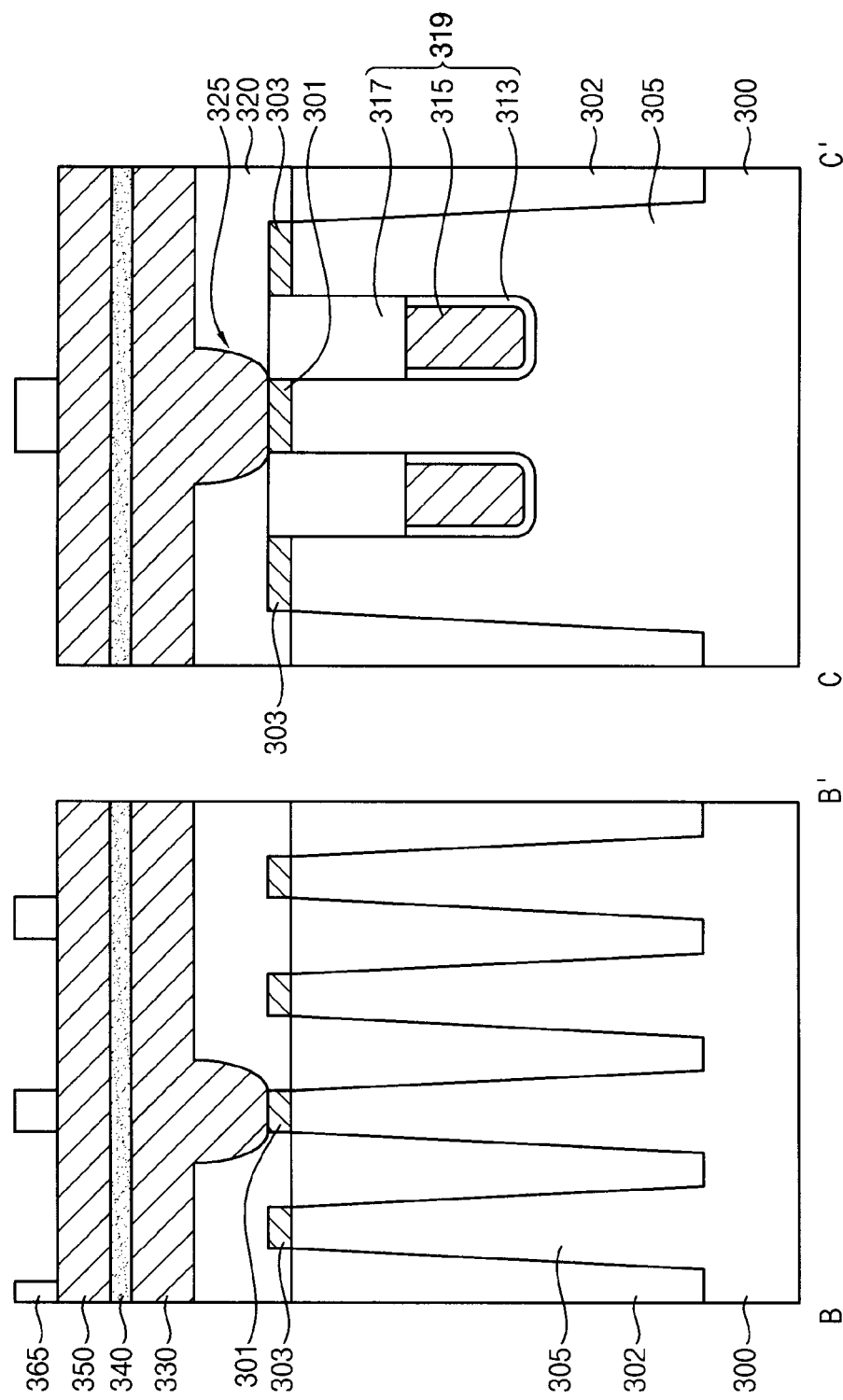

Referring to FIG. 37, after forming a first conductive layer 330 on the first insulating interlayer 320 to fill the first trenches 325, a barrier layer 340 and a second conductive layer 350 may be sequentially formed on the first conductive layer 330, and a second capping pattern 365 may be formed on the second conductive layer 350.

In example embodiments, the first conductive layer 330 may include polysilicon doped with impurities, the barrier layer 340 may include metal nitride or metal silicide nitride, and the second conductive layer 350 may include metal. The first conductive layer 330, the barrier layer 340 and the second conductive layer 350 may be formed by, e.g., a sputtering process, a PVD process or an ALD process, etc.

The second capping pattern 365 may include, e.g., silicon nitride, and may have a line shape extending in the second direction.

Figure 38:
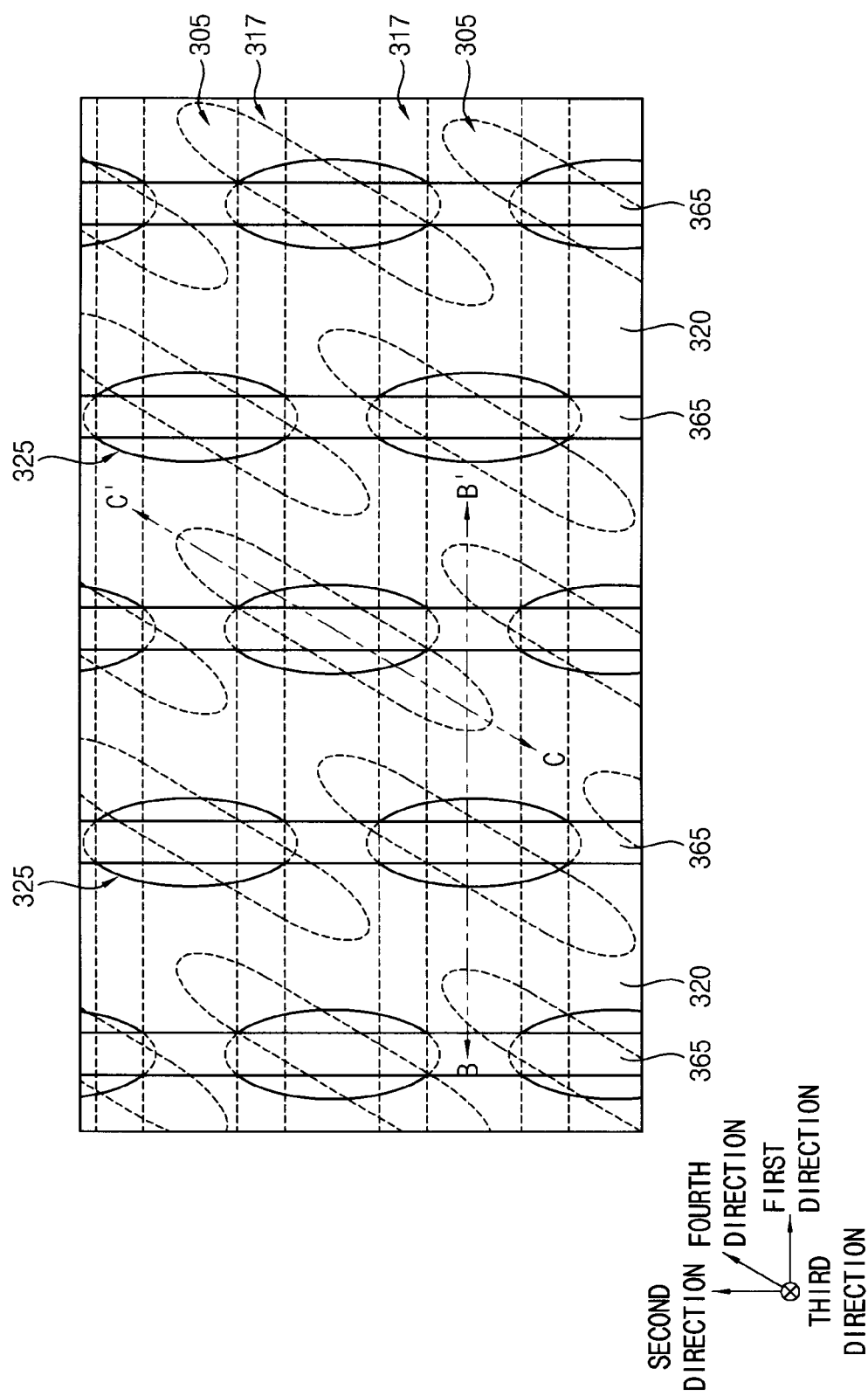
Figure 39:
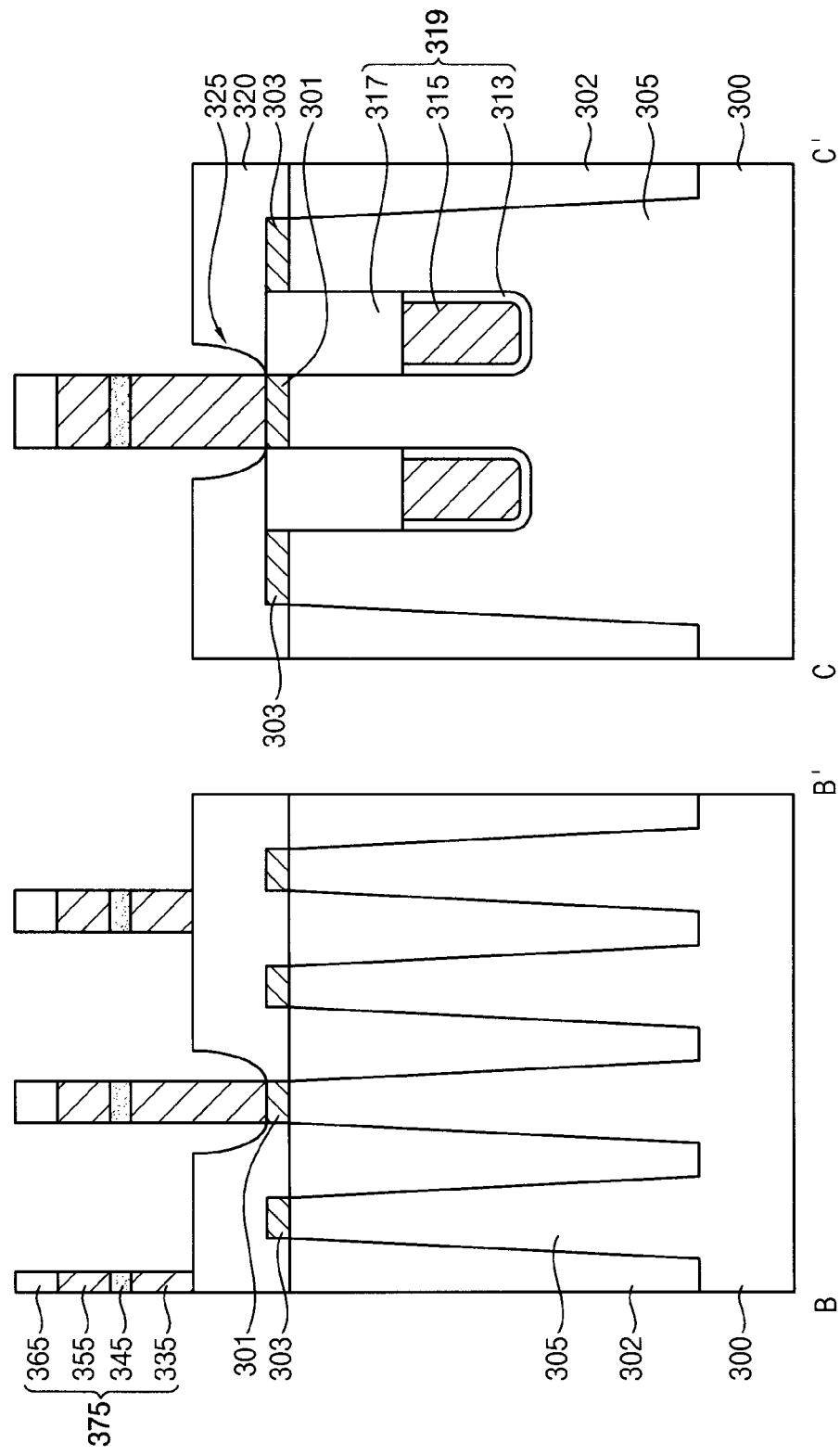

Referring to FIGS. 38 and 39, a plurality of bit line structures 375 may be formed. In an example embodiment, an etching process using the second capping pattern 365 as an etching mask may be performed to sequentially etch the second conductive layer 350, the barrier layer 340 and the first conductive layer 330. Accordingly, a first conductive pattern 335, a barrier pattern 345 and a second conductive pattern 355 may be sequentially stacked on the first impurity region 301, which may form one of the bit line structures 375. In one embodiment, the bit line structures 375 may be arranged spaced apart from each other in the first direction, and each of the bit line structures 375 may extend in the second direction.

Figure 40:
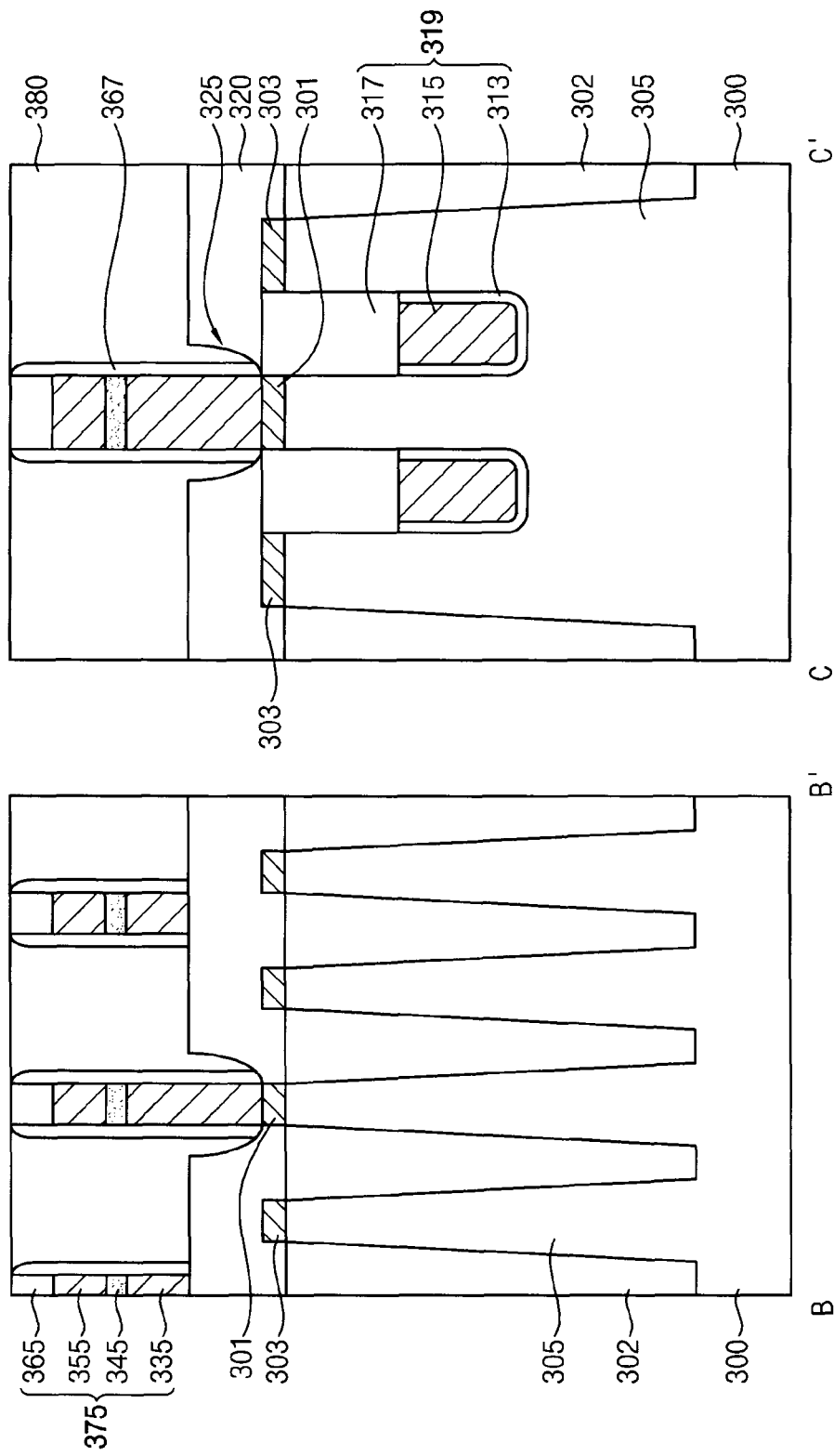

Referring to FIG. 40, after forming a third spacer layer to cover the bit line structures 375 and the first insulating interlayer 320, the third spacer layer may be anisotropically etched to form a third spacer 367 covering a sidewall of one of the bit line structures 375. The third spacer layer may include, e.g., silicon nitride.

A second insulating interlayer 380 may be formed on the first insulating interlayer 320 to cover the bit line structures 375 and the third spacer 367. The second insulating interlayer 380 may also fill remaining portions of the first trenches 325. The second insulating interlayer 380 may be formed by a CVD process or a spin coating process, and an upper portion of the second insulating interlayer 380 may be planarized by a CMP process to expose an upper surface of the second capping pattern 365. The second insulating interlayer 380 may include, e.g., a silicon oxide.

Figure 41:
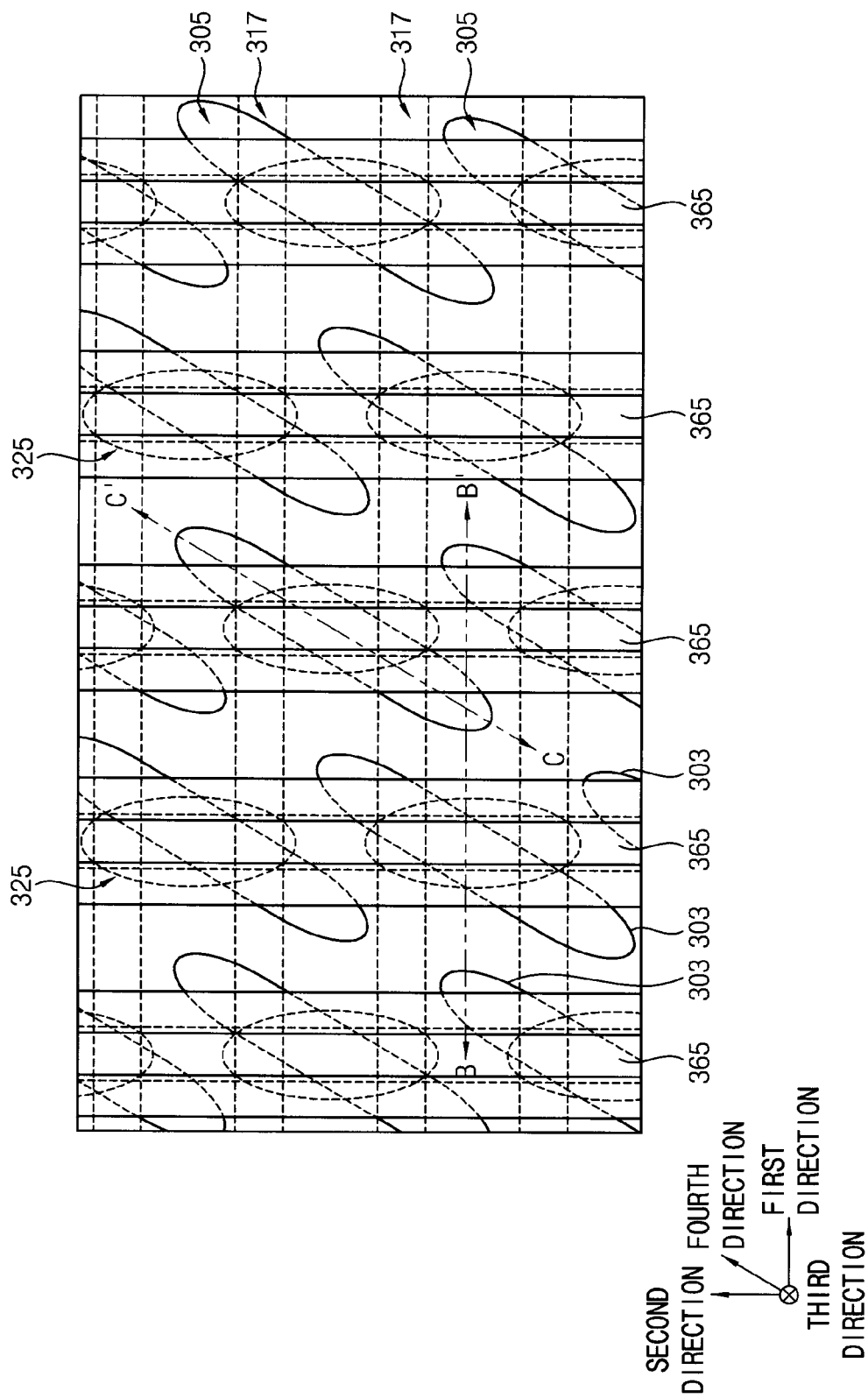
Figure 42:
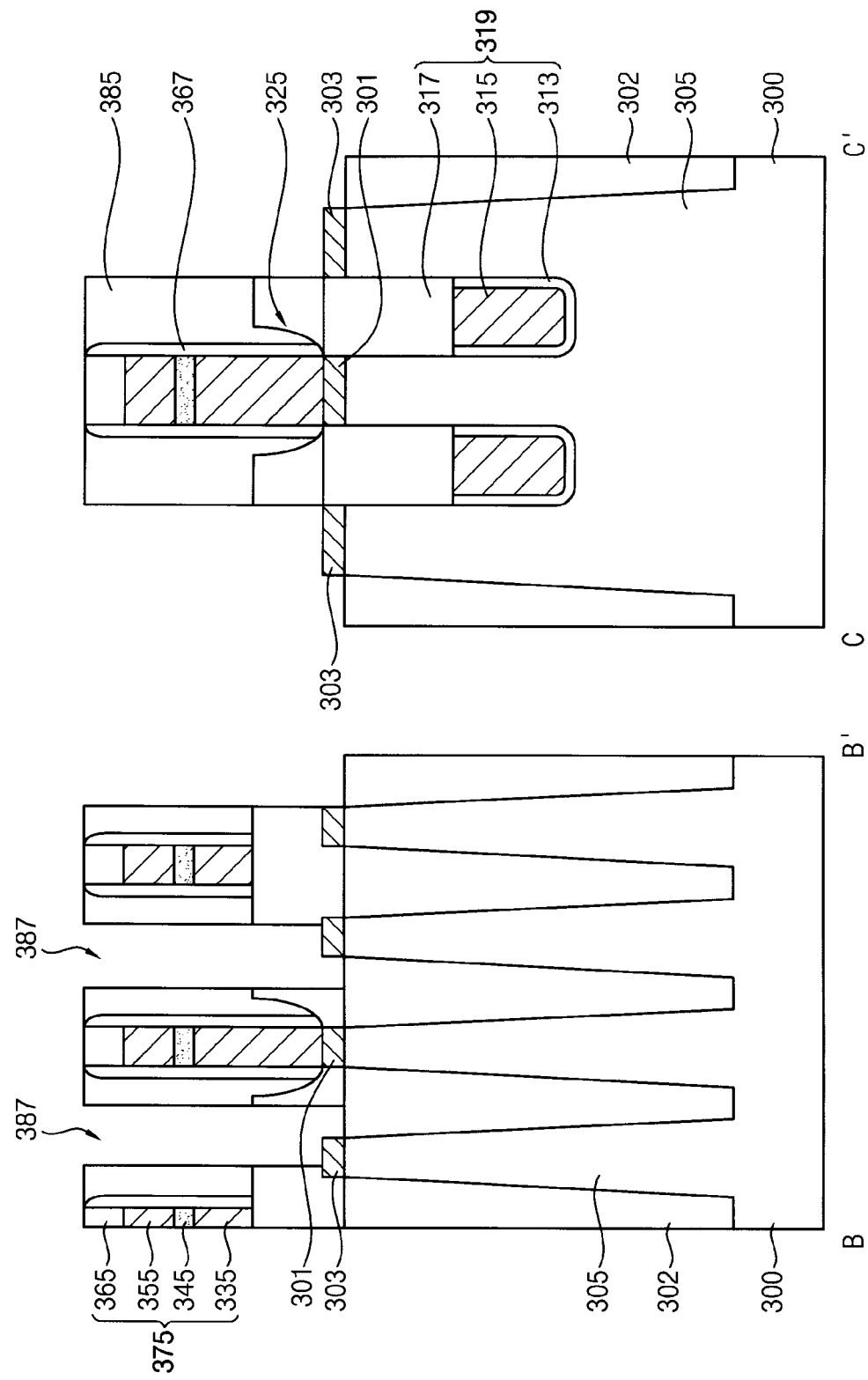

Referring to FIGS. 41 and 42, a plurality of second trenches 387 may be formed in the resulting structure of FIG. 40. In an example embodiment, the first and second insulating interlayers 320 and 380 may be partially etched to form each of the second trenches 387, which may expose the second impurity regions 303 and a portion of the isolation pattern 302. Accordingly, the first and second insulating interlayers 320 and 380 may be transformed into first and second insulation patterns 327 and 385, respectively, and the first and second insulation patterns 327 and 385 may remain on the gate structures 319.

In one embodiment, the second trenches 387 may be arranged spaced apart from each other in the first direction, and each of the second trenches 387 may extend in the second direction.

Figure 43:
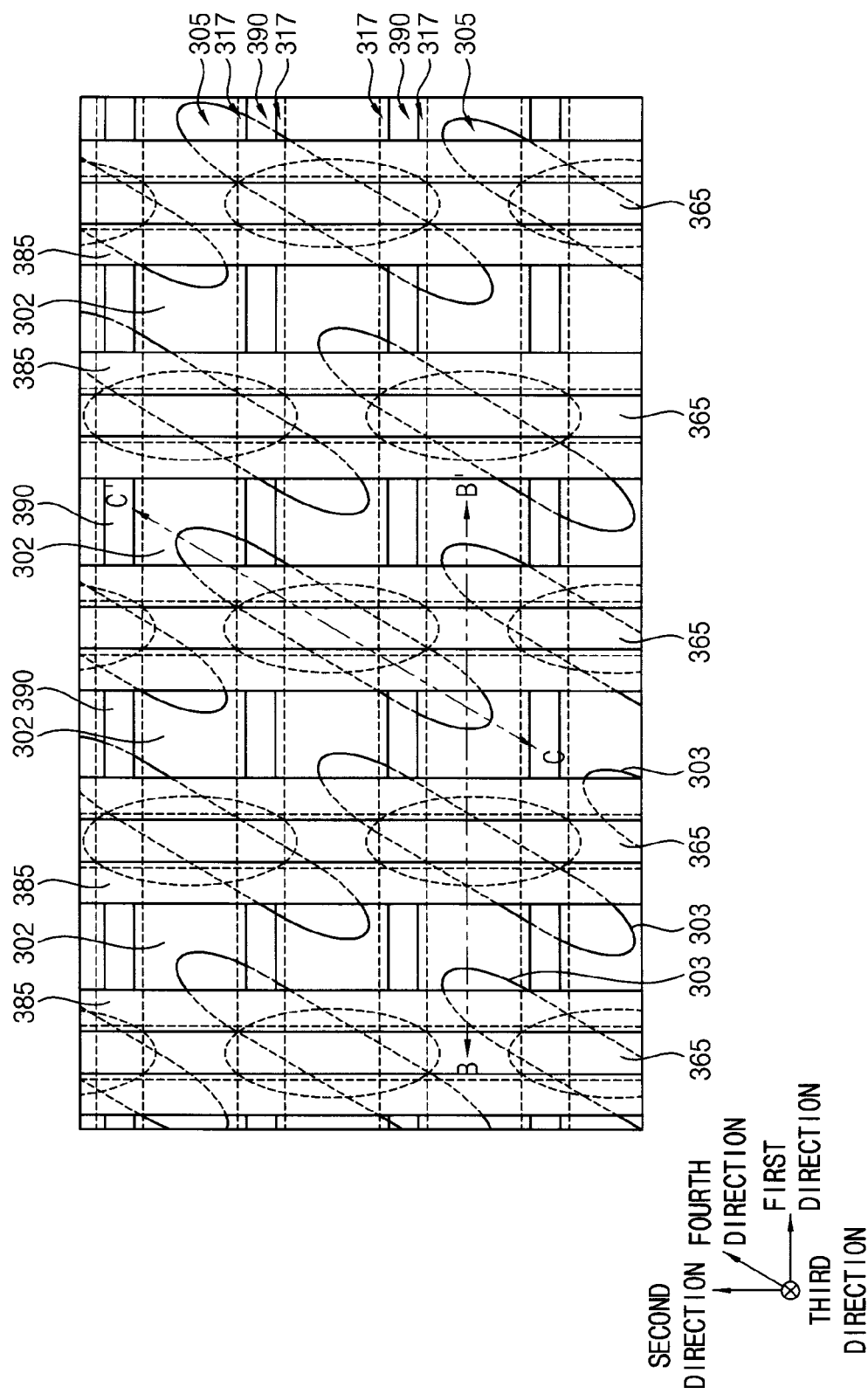
Figure 44:
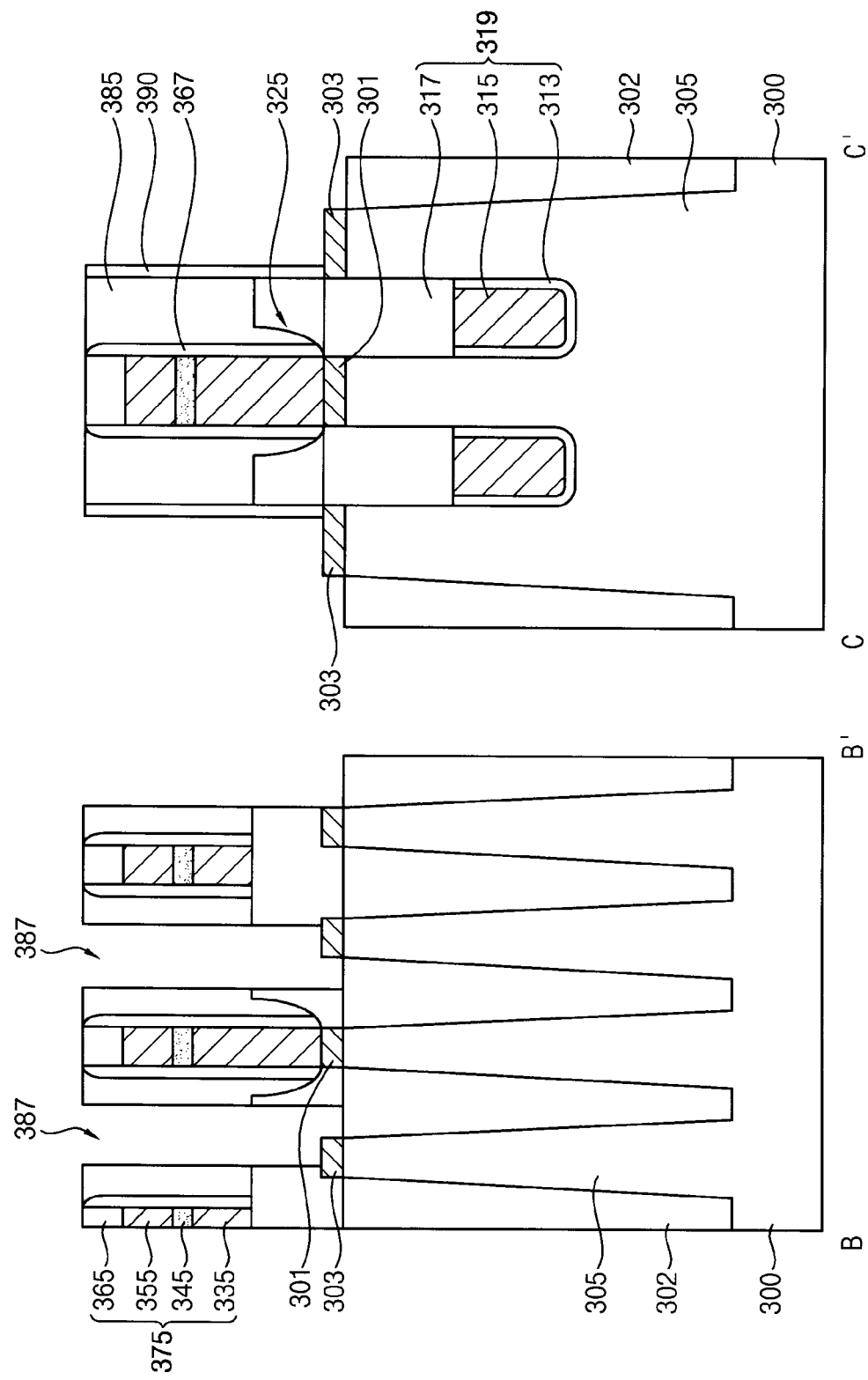

Referring to FIGS. 43 and 44, a plurality of blocking patterns 390 may be formed at spaces between the second trenches 387. Each of the blocking patterns 390 may extend in the first direction between the second insulation patterns 385, and the blocking patterns 390 may be formed in the second direction.

In example embodiments, the blocking patterns 390 may be formed by forming a blocking layer to cover the exposed second impurity regions 303, the portion of the isolation pattern 302, sidewalls of the first insulation patterns 327, upper surfaces and sidewalls of the second insulation patterns 385, and upper surfaces of the second capping patterns 365, a planarization process may be performed on the blocking layer until the upper surfaces of the second insulation patterns 385 may be exposed, and an etching process using an etching mask (not shown) may be performed. Accordingly, a portion of the isolation pattern 302 and portions of the second impurity regions 303 may be exposed.

The blocking patterns 390 may include nitride, e.g., silicon nitride, and the planarization process may include a CMP process and/or an etch back process.

Figure 45:
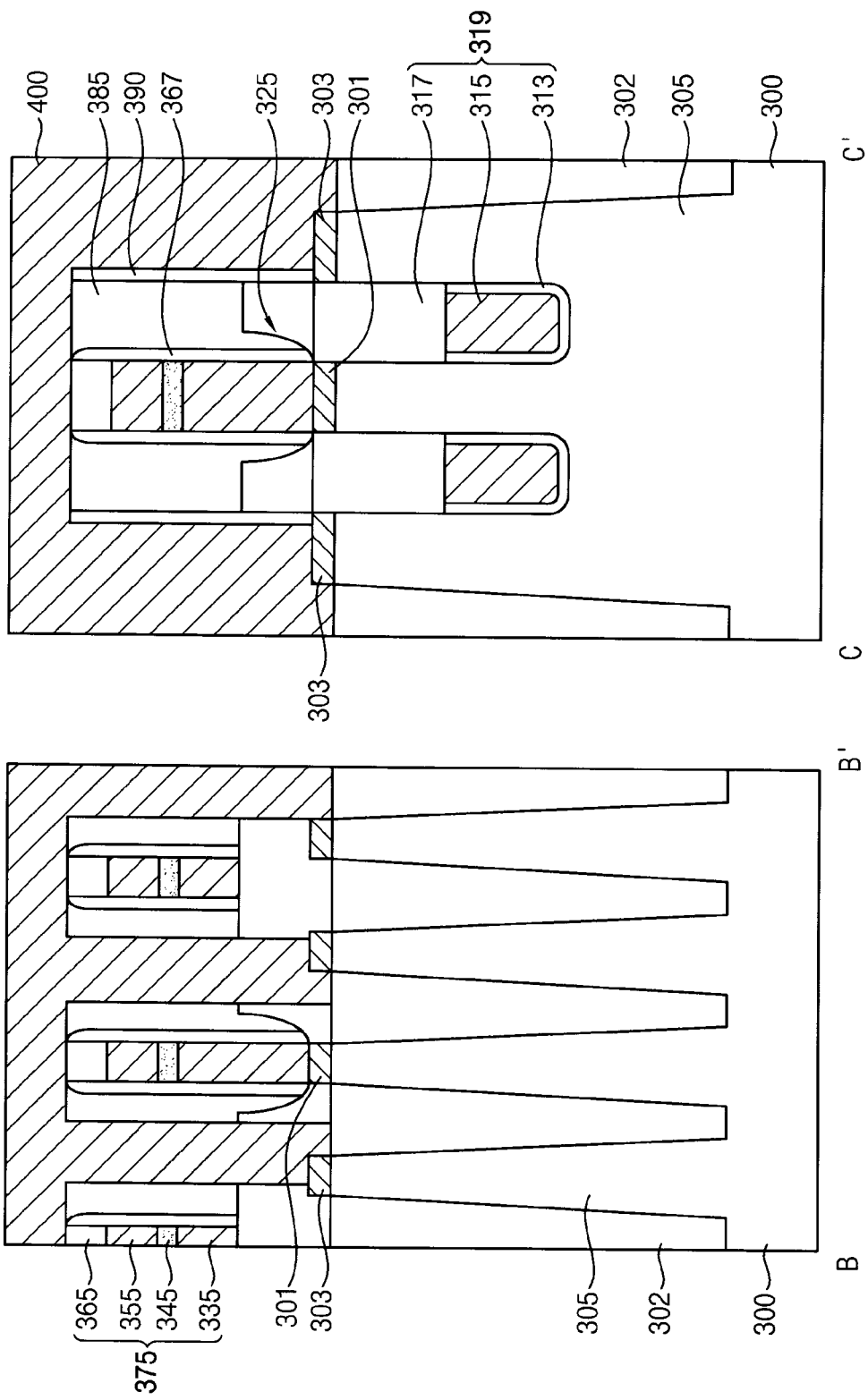

Referring to FIG. 45, a third conductive layer 400 may be formed to fill spaces between the second insulation patterns 385 and spaces between the blocking patterns 390, and to contact the exposed upper surfaces of the second impurity regions 303. The third conductive layer 400 may at least partially cover the bit line structures 375, the second insulation patterns 385 and the blocking patterns 390.

The third conductive layer 400 may be a metal layer formed of or including metal, e.g., tungsten (W), titanium (Ti), tantalum (Ta), etc., or polysilicon doped with impurities, and may be formed by, e.g., a CVD process, a PVD process, an ALD process, a spin coating process, etc.

Figure 46:
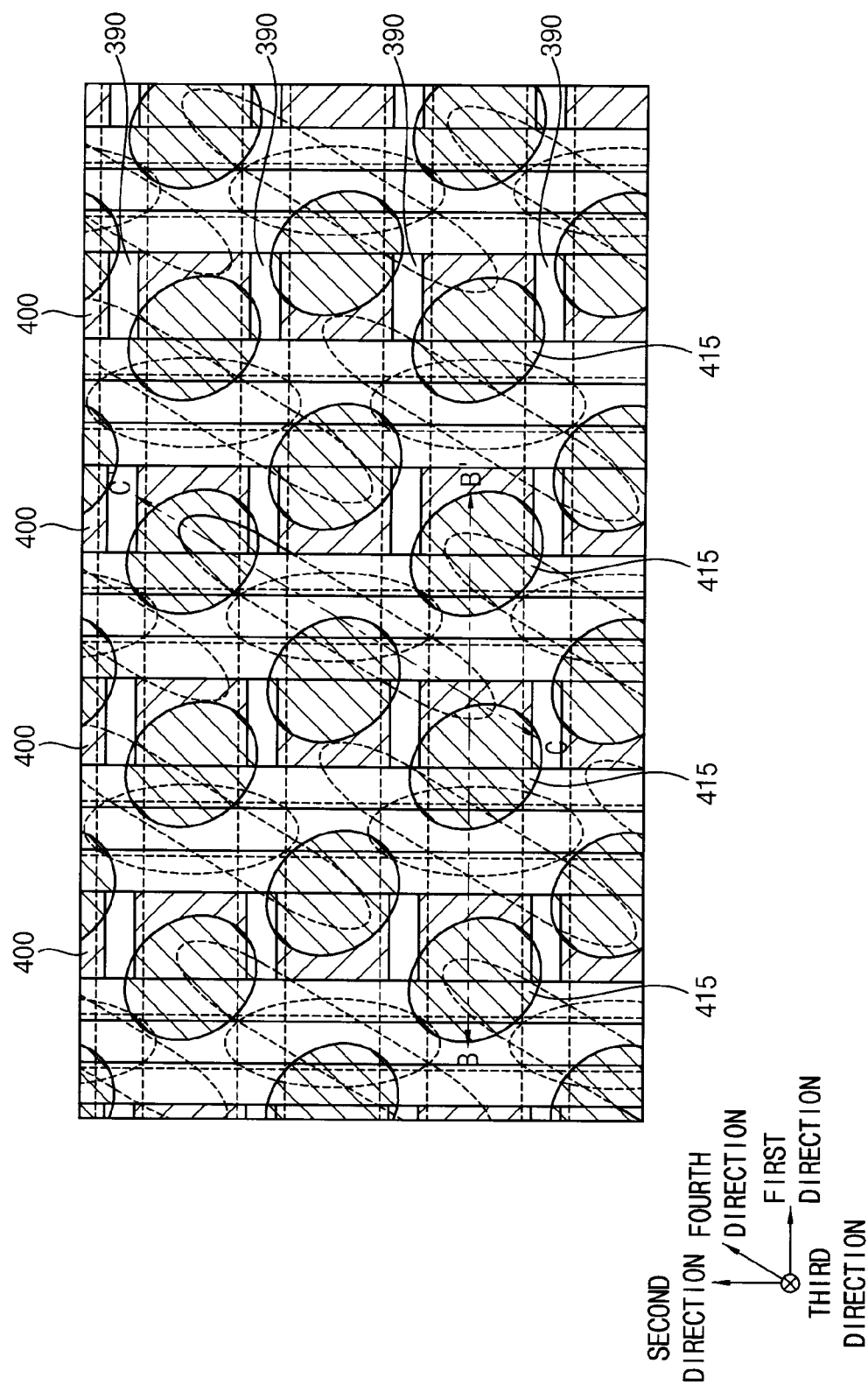
Figure 47:
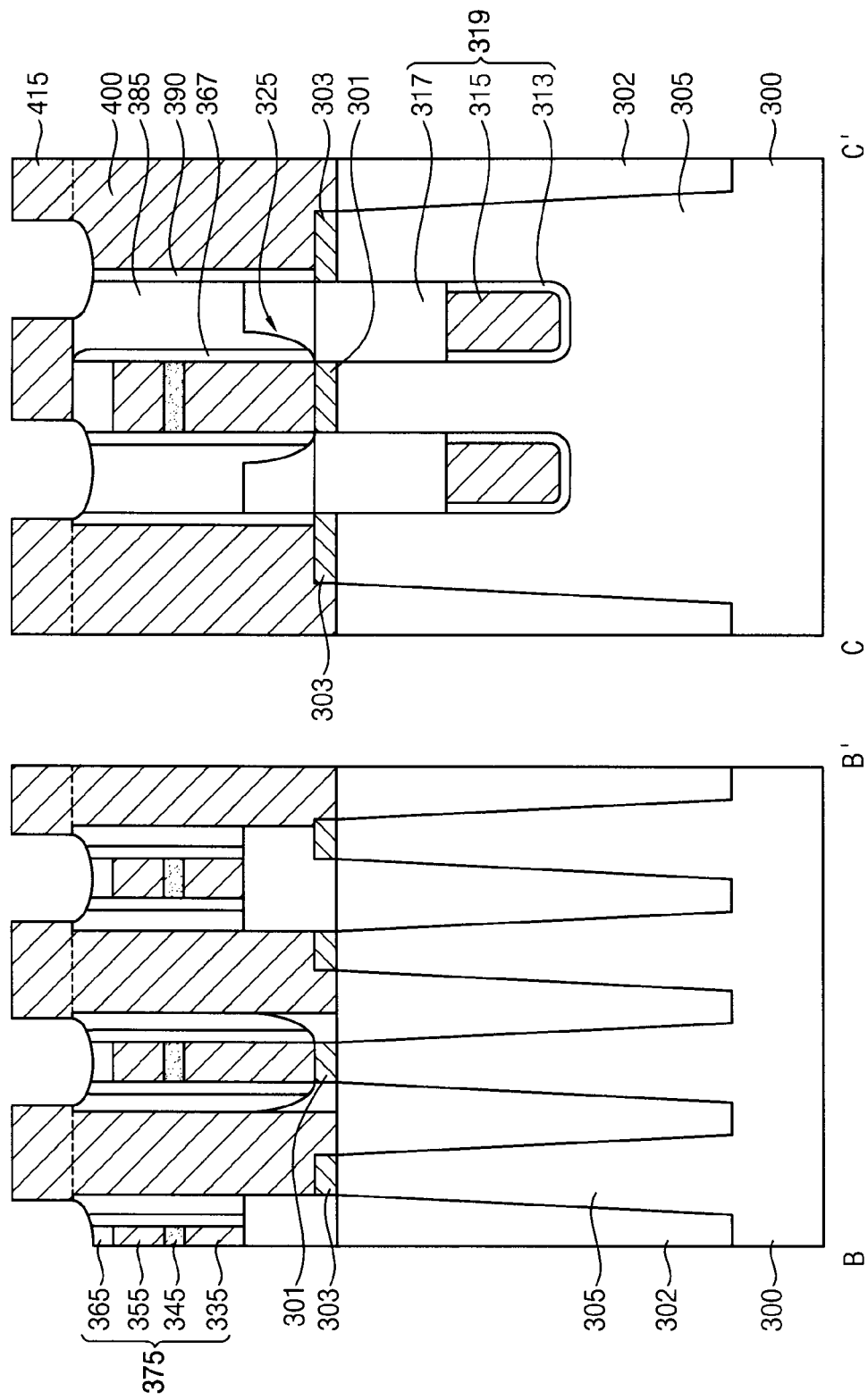

Referring to FIGS. 46 and 47, processes substantially the same as or similar to the processes described with reference to FIGS. 1 to 31 may be performed, and the third conductive layer 400 may be patterned to form a plurality of landing pads 415. Portions of the third conductive layer 400 under the landing pads 415 may be referred to as contact plugs.

In example embodiments, the landing pads 415 may be formed to be spaced apart from each other in each of the first and second directions, which may be arranged in a honeycomb shape in a plan view. A third trench may be formed between the landing pads 415, and when the third trench is formed, portions of the second capping pattern 365, the third spacers 367, the second insulation patterns 385 and the blocking patterns 390 of the bit line structures 375 may be also removed.

The landing pads 415 may be formed by forming third and fourth mask layers on the third conductive layer 400, performing a patterning process on the fourth mask layer twice to form a fourth mask pattern, performing a trimming process on the fourth mask pattern to form a fourth mask of which an aspect ratio is adjusted relative to the fourth mask pattern, performing an etching process using the fourth mask as an etching mask to form a third mask, and performing an etching process using the third mask as an etching mask on the third conductive layer 400. Accordingly, an aspect ratio of the landing pad 415 may be also adjusted. As a result, the landing pads 415 may not contact each other, and the deterioration of the reliability due to the electrical short may be prevented.

In example embodiments, each of the landing pads 415 may have an elliptical shape having a major axis and a minor axis in a plan view.

Alternatively, the landing pads 415 may have a rhomboid shape having a first diagonal line and a second diagonal line in a plan view. In an example embodiment, the length of the first diagonal line may be greater than the length of the second diagonal line. In this case, each of vertex portions of the rhomboid shape may have a rounded vertex in a plan view.

Figure 48:
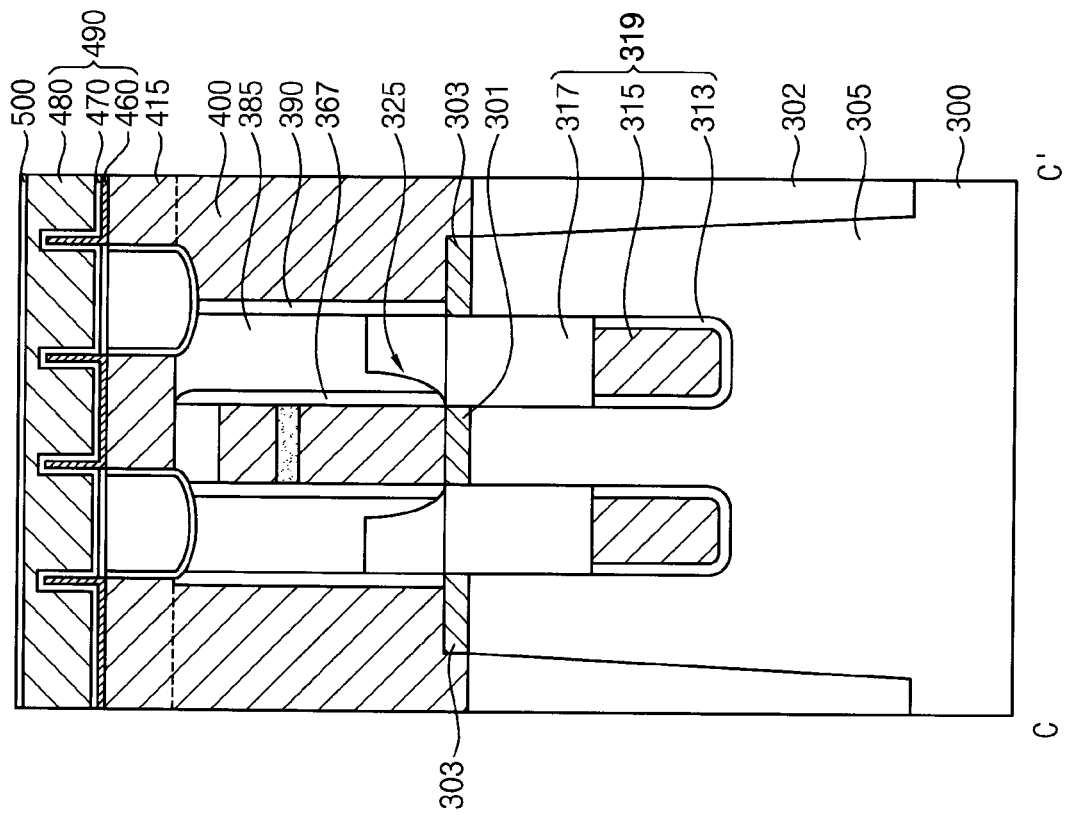

Referring to FIG. 48, an insulating interlayer structure 440 filling the third trench and including third and fourth insulating interlayers 420 and 430 sequentially stacked may be formed, and capacitors may be formed to contact upper surfaces of the landing pads 415.

The insulating interlayer structure 440 may be formed by forming the third insulating interlayer 420 on a bottom and a sidewall of the third trench, and forming the fourth insulating interlayer 430 on the third insulating interlayer 420 to fill a remaining portion of the third trench. The third and fourth insulating interlayers 420 and 430 may include an oxide, e.g., silicon oxide, or nitride, e.g., silicon nitride.

An etch stop layer 450 and a mold layer (not shown) may be sequentially formed on the landing pads 415 and the insulating interlayer structure 440, and the etch stop layer 450 and the mold layer may be partially etched to form a fourth trench (not shown), which may partially expose the upper surfaces of the landing pads 415.

A lower electrode layer may be formed on a sidewall of the fourth trench, the exposed upper surfaces of the landing pads 415 and the mold layer, a sacrificial layer (not shown) may be formed on the lower electrode layer to sufficiently fill a remaining portion of the fourth trench, and the lower electrode layer and an upper portion of the sacrificial layer may be planarized until an upper surface of the mold layer may be exposed, so that the lower electrode layer may be node-separated. The remaining sacrificial layer and the mold layer may be removed, e.g., by performing a wet etching process, and thus lower electrodes 460 each of which having a cylindrical shape may be formed on the exposed upper surfaces of the landing pads 415 respectively. Alternatively, the lower electrodes 460 each of which having a pillar shape may be formed to completely fill the fourth trench.

A dielectric layer 470 may be formed on surfaces of the lower electrodes 460 and the etch stop layer 450, and an upper electrode 480 may be formed on the dielectric layer 470, so that a capacitor 490 including the lower electrode 460, the dielectric layer 470 and the upper electrode 480 may be formed.

In example embodiments, the lower electrodes 460 and the upper electrode 480 may include substantially the same material, e.g., polysilicon doped with impurities or metal. The dielectric layer 470 may include oxide, e.g., silicon oxide, metal oxide, etc., and/or nitride, e.g., silicon nitride, metal nitride, etc., and the metal may include aluminum (Al), zirconium (Zr), titanium (Ti), hafnium (Hf), etc.

A fifth insulating interlayer 500 covering the capacitor 490 may be formed to complete the fabrication of the semiconductor device.

As described above, in the method of manufacturing the semiconductor device, before forming the landing pads 415 by the etching process using the third mask as an etching mask, the patterning process may be performed twice on the fourth mask layer to form the fourth mask pattern, and the trimming process may be performed on the fourth mask pattern, so that the aspect ratio of the fourth mask pattern, that is, lengths of a relatively long diagonal line and a relatively short diagonal line of the fourth mask pattern may be adjusted. Accordingly, when the third mask is formed by the etching process using the fourth mask that may be formed by trimming the fourth mask pattern as an etching mask, an aspect ratio of the third mask may be also adjusted, when the landing pads 415 to be finally patterned are formed by the etching process using the third mask of which the aspect ratio may be adjusted, the aspect ratio of each of the landing pads 415 may be also adjusted. That is, the relatively long major axis and the relatively short minor axis, or the relatively long diagonal line and the relatively short diagonal line of the landing pad 415 may be also adjusted, so that the landing pad 415 may be prevented from contacting each other and being electrically connected with each other, and the reliability of the semiconductor including the landing pad 415 may be increased.

As described above, although the present invention has been described with reference to example embodiments, those skilled in the art will readily appreciate that many modifications are possible in the example embodiments without materially departing from the novel teachings and advantages of the present inventive concept.

What is claimed is:

1. A method of forming a pattern, the method comprising:
forming a first mask layer on a target layer;
forming a second mask layer on the first mask layer;
patterning the second mask layer to form a plurality of second mask patterns, wherein each of the plurality of second mask patterns has a rhomboid shape with first opposite vertices and second opposite vertices, a length of a first diagonal line between the first opposite vertices being greater than a length of a second diagonal line between the second opposite vertices;
performing, after the patterning of the second mask layer to form the plurality of second mask patterns, a trimming process on the plurality of second mask patterns to form a plurality of second masks, wherein in the trimming process, first portions corresponding to the first opposite vertices of each of the plurality of second mask patterns are etched more than second portions corresponding to the second opposite vertices of each of the plurality of second mask patterns;
patterning the first mask layer to form a plurality of first masks by performing an etching process on the first mask layer using the plurality of second masks as an etching mask; and
patterning the target layer to form a plurality of target patterns by performing an etching process on the target layer using the plurality of first masks as an etching mask.

2. The method of claim 1,
wherein each of the plurality of second masks has a rhomboid shape with a rounded vertex, in the plan view, the rhomboid shape having a third diagonal length and a fourth diagonal length, and
wherein a ratio of the third diagonal length with respect to the fourth diagonal length is less than about 1.4.

3. The method of claim 2,
wherein each of the plurality of target patterns has an elliptical shape in the plan view, and
wherein a ratio of a major axis of the elliptical shape with respect to a minor axis thereof is less than about 1.4.

4. The method of claim 1,
wherein each of the plurality of first masks has a rhomboid shape with a rounded vertex in the plan view.

5. The method of claim 1,
wherein the trimming process is performed by a wet etching process.

6. The method of claim 1,
wherein the patterning of the second mask layer includes:
forming in the second mask layer a plurality of first openings each of which extends in a first direction; and
forming in the second mask layer a plurality of second openings each of which extends in a second direction different from the first direction.

7. The method of claim 6, further comprising:
forming a plurality of first spacers on the second mask layer, each of the plurality of first spacers having a line shape extending in the first direction;
forming a plurality of third sacrificial patterns on the second mask layer, wherein each of the plurality of third sacrificial patterns fills a space between two adjacent first spacers of the plurality of first spacers;

removing the plurality of first spacers; and
performing an etching process on the second mask layer by using the plurality of third sacrificial patterns as an etching mask to form a plurality of preliminary second mask patterns.

8. The method of claim 7, further comprising:
forming a plurality of second spacers on the plurality of preliminary second mask patterns, each of the plurality of second spacers having a line shape extending in the second direction;
forming a plurality of fourth sacrificial patterns to cover sidewalls of the second spacers; and
removing the plurality of second spacers,
wherein the patterning of the second mask layer to form the plurality of second mask patterns includes performing an etching process using the plurality of fourth sacrificial patterns as an etching mask to form the plurality of second mask patterns.

9. The method of claim 7,
wherein the forming of the plurality of first spacers includes:
forming a first sacrificial layer on the second mask layer;
forming a plurality of second sacrificial patterns on the first sacrificial layer, each of the plurality of second sacrificial patterns having a line shape extending in the first direction;
forming a first spacer mask layer on the first sacrificial layer to cover the plurality of second sacrificial patterns;
anisotropically etching the first spacer mask layer to form a plurality of first spacer masks; and
etching the first sacrificial layer using the plurality of first spacer masks as an etching mask to form the plurality of first spacers.

10. The method of claim 8,
wherein the forming of the plurality of second spacers includes:
forming a third sacrificial layer on the plurality of preliminary second mask patterns;
forming a plurality of fourth sacrificial patterns on the third sacrificial layer, each of the plurality of fourth sacrificial patterns having a line shape extending in the second direction;
forming a second spacer mask layer on the third sacrificial layer to cover the plurality of fourth sacrificial patterns;
anisotropically etching the second spacer mask layer to form a plurality of second spacer masks; and
etching the third sacrificial layer using the plurality of second spacer masks as an etching mask to form the plurality of second spacers.

11. A method of forming a pattern, the method comprising:
patterning a second mask layer on a first mask layer to form a plurality of second mask patterns each of which has a rhomboid shape in a plan view, the rhomboid shape having first opposite vertices and second opposite vertices, a length of a first diagonal line between the first opposite vertices being greater than a length of a second diagonal line between the second opposite vertices;
performing, after patterning of the second mask layer to form the plurality of second mask patterns, a trimming process on the plurality of second mask patterns to form a plurality of second masks, wherein in the trimming process, first portions corresponding to the first opposite vertices of each of the plurality of second mask patterns are etched more than second portions corresponding to the second opposite vertices of each of the plurality of second mask patterns, wherein a first diagonal length between the first opposite vertices is greater than a second diagonal length between the second opposite vertices; and
performing an etching process on the first mask layer using the plurality of second masks as an etching mask to form a plurality of first masks.

12. The method of claim 11,
wherein each of the plurality of first masks has an elliptical shape, and
wherein a ratio of a major axis of the elliptical shape with respect to a minor axis thereof is less than about 1.4.

13. The method of claim 11,
wherein each of the plurality of second masks has a rhomboid shape having a rounded vertex in the plan view.

14. The method of claim 11,
wherein the plurality of second mask patterns include a first opening extending in a first direction and a second opening extending in a second direction different from the first direction.

15. A method of manufacturing a semiconductor device, the method comprising:
forming an active region on a substrate;
forming a gate structure extending through the active region;
forming a conductive layer on the active region;
forming a plurality of first masks on the conductive layer;
forming a plurality of landing pads by etching an upper portion of the conductive layer using the plurality of first masks as an etching mask; and
forming a plurality of capacitors on the plurality of landing pads respectively,
wherein the forming of the plurality of first masks includes:
forming a first mask layer on the conductive layer;
forming a second mask layer on the first mask layer;
patterning the second mask layer to form a plurality of second mask patterns each of which has a rhomboid shape in a plan view;
performing a trimming process on the plurality of second mask patterns to form a plurality of second masks, wherein in the trimming process, first portions corresponding to first opposite vertices of each of the plurality of second mask patterns are etched more than second portions corresponding to second opposite vertices of each of the plurality of second mask patterns, and a first diagonal length between the first opposite vertices is greater than a second diagonal length between the second opposite vertices; and
performing an etching process using the plurality of second masks as an etching mask on the first mask layer to form the plurality of first masks.

16. The method of claim 15,
wherein each of the plurality of landing pads has a rhomboid shape having a rounded vertex in a plan view.

17. The method of claim 16,
wherein the rhomboid shape has a ratio of a first diagonal length with respect to a second diagonal length, and the ratio is less than about 1.4.

18. The method of claim 15,
wherein each of the plurality of landing pads has an elliptical shape having a ratio of a major axis with respect to a minor axis, and the ratio is less than about 1.4.

19. The method of claim 15,
wherein the plurality of landing pads are formed to be arranged in a honeycomb shape in a plan view.

20. The method of claim 15,
wherein first and second impurity regions are formed on the active region, and the conductive layer contacts an upper surface of the second impurity region, and
wherein the method further comprises:
forming a bit line on the first impurity region.

* * * * *